US012813244B2

(12) United States Patent
Chen et al.

(10) Patent No.: US 12,813,244 B2
(45) **Date of Patent: *Nov. 24, 2026**

(54) SEMICONDUCTOR DEVICES WITH BACKSIDE GATE CONTACTS AND METHODS OF FABRICATION THEREOF

(71) Applicant: TAIWAN SEMICONDUCTOR MANUFACTURING COMPANY, LTD., Hsinchu (TW)

(72) Inventors: Chun-Yuan Chen, Hsinchu (TW); Huan-Chieh Su, Changhua (TW); Kuo-Cheng Chiang, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 351 days.

This patent is subject to a terminal disclaimer.

(21) Appl. No.: 18/524,661

(22) Filed: Nov. 30, 2023

(65) Prior Publication Data

US 2025/0046718 A1 Feb. 6, 2025

Related U.S. Application Data

(60) Provisional application No. 63/530,623, filed on Aug. 3, 2023.

(51) Int. Cl.
*H10W 20/20* (2026.01)
*H10D 30/01* (2025.01)
(Continued)

(52) U.S. Cl.
CPC .......... *H10W 20/20* (2026.01); *H10D 30/014* (2025.01); *H10D 30/43* (2025.01); *H10D 30/6729* (2025.01); *H10D 30/6735* (2025.01); *H10D 62/121* (2025.01); *H10D 64/01* (2025.01); *H10D 64/017* (2025.01); *H10W 20/069* (2026.01)

(58) Field of Classification Search
CPC .. H10W 20/20; H10W 20/069; H10D 30/014; H10D 30/43; H10D 30/6729; H10D 30/6735; H10D 62/121; H10D 64/01; H10D 64/017; H10D 30/6757; H10D 62/151; H10D 64/254
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |

(Continued)

FOREIGN PATENT DOCUMENTS

| | | | | |
|---|---|---|---|---|
| CN | 119028979 A | * | 11/2024 | .......... H10W 20/069 |
| TW | 202143429 | | 11/2021 | |

(Continued)

*Primary Examiner* — Jacob Y Cho
(74) *Attorney, Agent, or Firm* — NZ Carr Law Office

(57) ABSTRACT

Embodiments of the present disclosure provide a method for forming backside gate contacts and semiconductor fabricated thereof. A semiconductor device includes both signal outputs, such as source/drain contacts, and signal inputs, such as gate contacts, formed on a backside of the substrate. The backside gate contacts and backside source/drain contacts are formed in a self-aligned manner.

20 Claims, 49 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10W 20/00*** | (2026.01) |

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2020/0066867 | A1 | 2/2020 | Cheng et al. | |
| 2023/0369396 | A1* | 11/2023 | Cheng | H10D 84/83 |
| 2024/0290864 | A1* | 8/2024 | Ho | H10D 62/115 |
| 2025/0133827 | A1* | 4/2025 | Kang | H10D 30/6735 |
| 2025/0364421 | A1* | 11/2025 | Chen | H10W 20/069 |
| 2026/0075894 | A1* | 3/2026 | Mariottini | H10D 62/121 |

FOREIGN PATENT DOCUMENTS

| | | |
|---|---|---|
| TW | 202221878 | 6/2022 |
| TW | 202232700 | 8/2022 |
| TW | 202236505 | 9/2022 |

* cited by examiner

SEMICONDUCTOR DEVICES WITH BACKSIDE GATE CONTACTS AND METHODS OF FABRICATION THEREOF

CROSS-REFERENCE TO RELATED APPLICATIONS

This application claims priority to United States Provisional Patent Application Ser. No. 63/530,623, filed Aug. 3, 2023, which is incorporated by reference in its entirety.

BACKGROUND

The semiconductor industry has experienced continuous rapid growth due to constant improvements in the integration density of various electronic components. For the most part, this improvement in integration density has come from repeated reductions in minimum feature size, allowing more components to be integrated into a given chip area. As minimum feature size reduces, metal layer routing in the intermetal connection layers also becomes more complex. Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
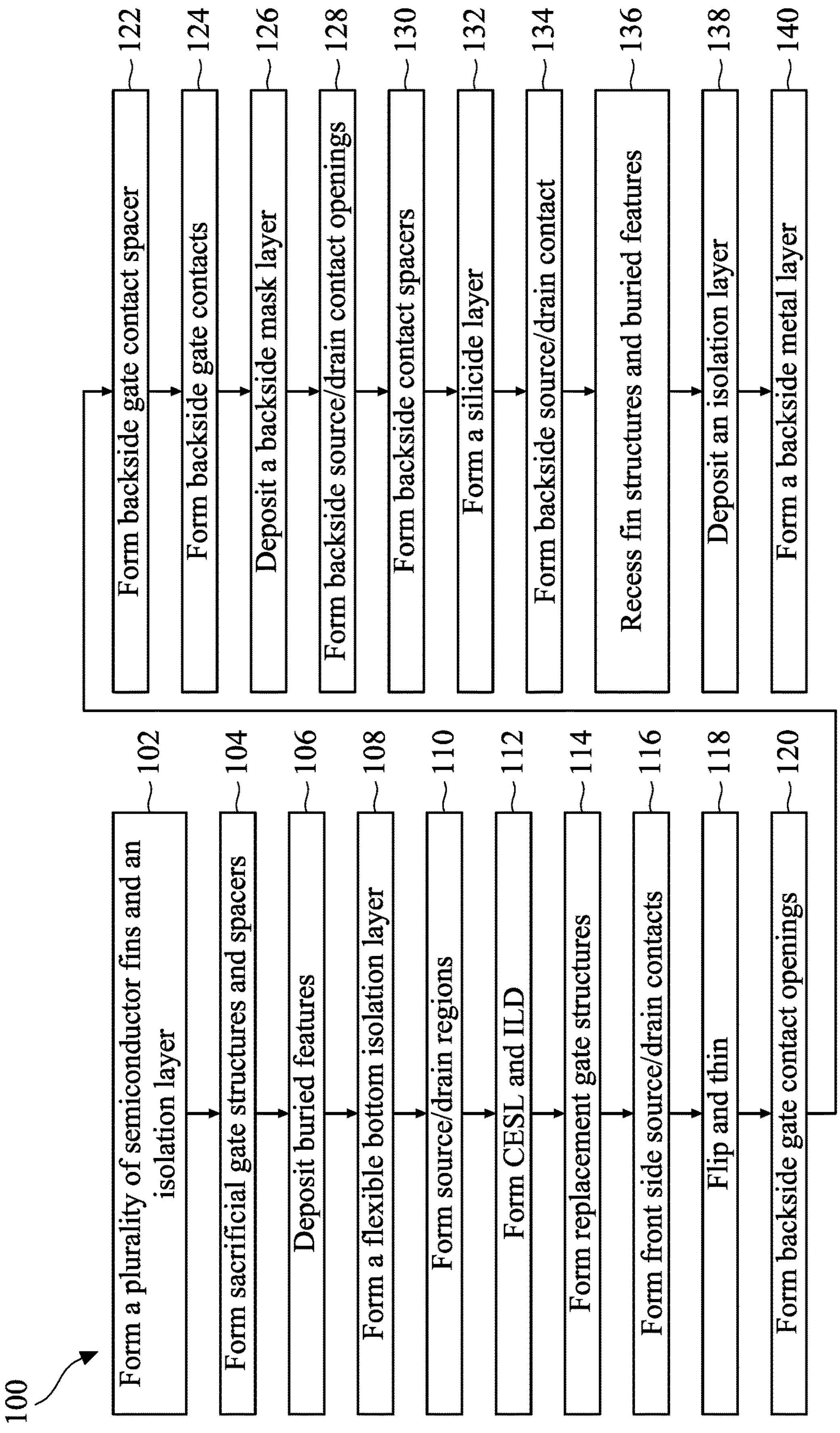
FIG. 1 is a flow chart of a method for manufacturing of a semiconductor substrate according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain region refers to a source and/or a drain. A source and a drain are interchangeably used.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

An integrated circuit (IC) typically includes a plurality of semiconductor devices, such as field-effect transistors and metal interconnection layers formed on a semiconductor substrate. The interconnection layers, designed to connect the semiconductor devices to power supplies, input/output signals, and to each other, may include signal lines and power rails. As semiconductor device size shrinks, space for metal power rails and signal lines decreases.

Embodiments of the present disclosure provide semiconductor devices having contact features, such as gate contacts, formed on a backside of a substrate for connecting to signal lines, and methods for fabricating such semiconductor devices. Particularly, embodiments of the present disclosure enable backside signal routing for local interconnection, therefore, relaxing front side signal routing.

In the state-of-art technologies, signal outputs, such as source/drain contacts, may be formed on the backside to reduce routing density. Embodiment of the present disclosure provide semiconductor devices that include both signal outputs, such as source/drain contacts, and signal inputs, such as gate contacts, formed on a backside of the substrate. The backside gate contacts and backside source/drain contacts may be formed in a self-aligned manner. In some embodiments, backside metal layer with local signal connections may be formed over the backside gate contacts and the backside source/drain contacts. As a result, embodiments of the present disclosure may reduce capacitance in the semiconductor devices and improve performance speed.

FIG. 1 is a flow chart of a method 100 for manufacturing of a semiconductor substrate according to embodiments of the present disclosure. FIGS. 2A-2D, 3A-3B, 4A-4C, 5A-5D, 6A-6D, 7A-7C, 8A-8C, 9A-9F, 10A-10B, 11A-11C, 12A-12C, 13A-13B, 14A-14D, 15A-15C, 16A-16D, and 17A-17D schematically illustrate various stages of manufacturing a semiconductor device 200 according to the method 100. Additional operations can be provided before, during, and after operations/processes in the method 100, and some of the operations described below can be replaced or eliminated, for additional embodiments of the method. The order of the operations/processes may be interchangeable.

Figure 2B:
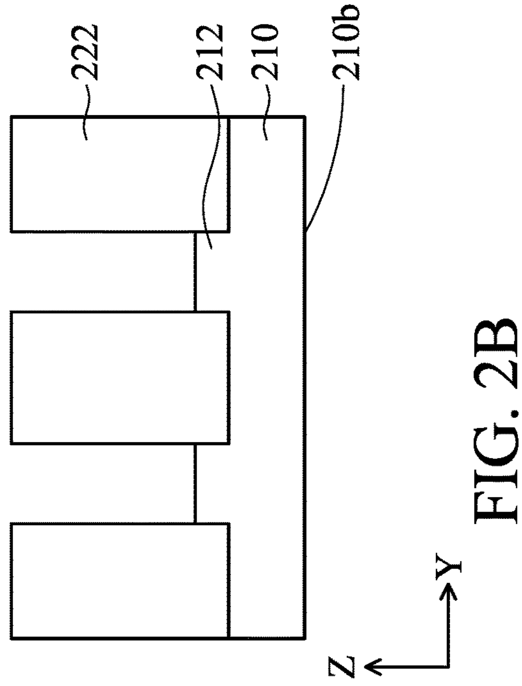
FIGS. 2A-2D, 3A-3B, 4A-4C, 5A-5D, 6A-6D, 7A-7C, 8A-8C, 9A-9F, 10A-10B, 11A-11C, 12A-12C, 13A-13B, 14A-14D, 15A-15C, 16A-16D, and 17A-17D schematically illustrate various stages of manufacturing a semiconductor device according to embodiments of the present disclosure.
Figure 2A:
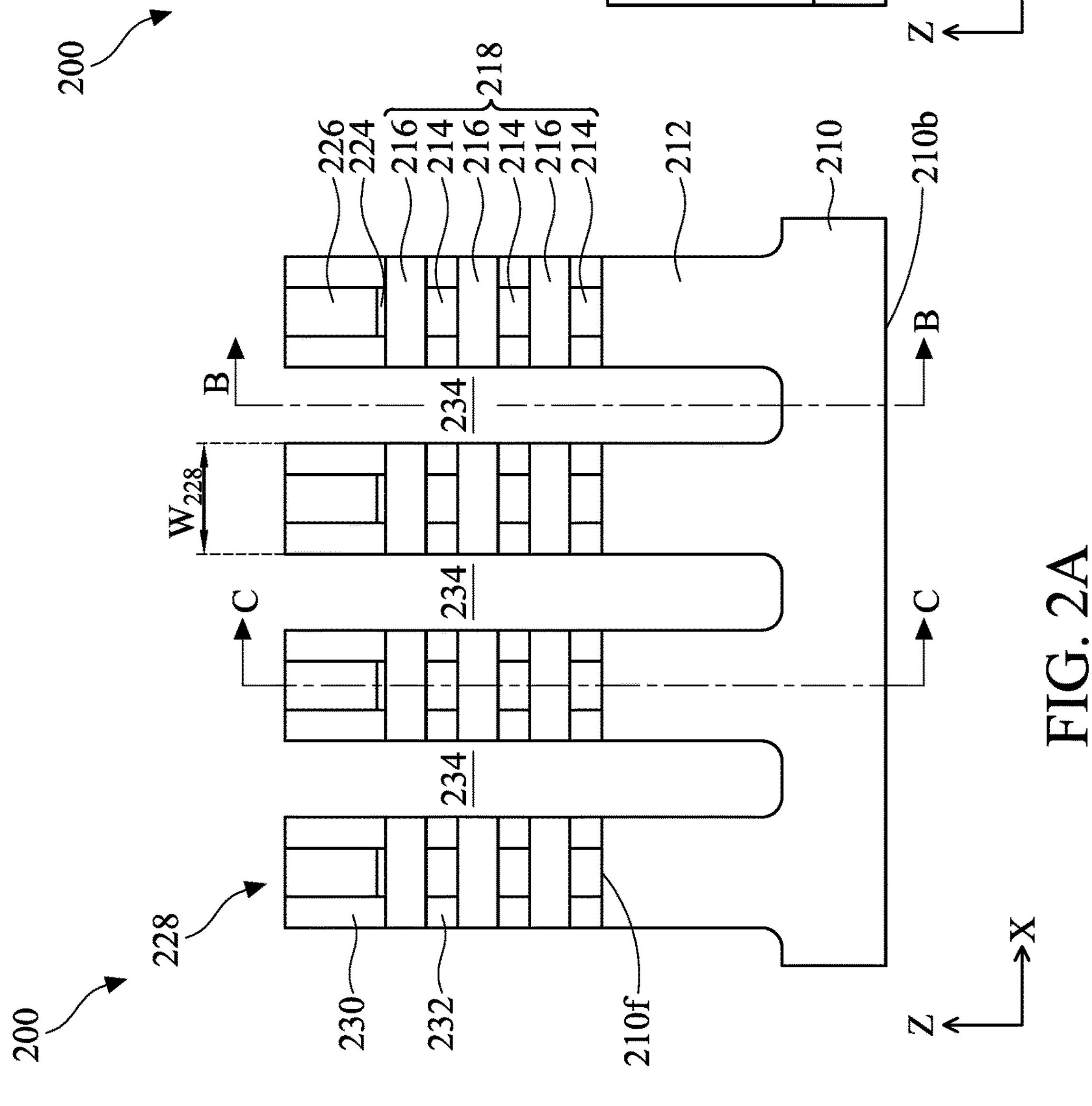
Figure 2C:
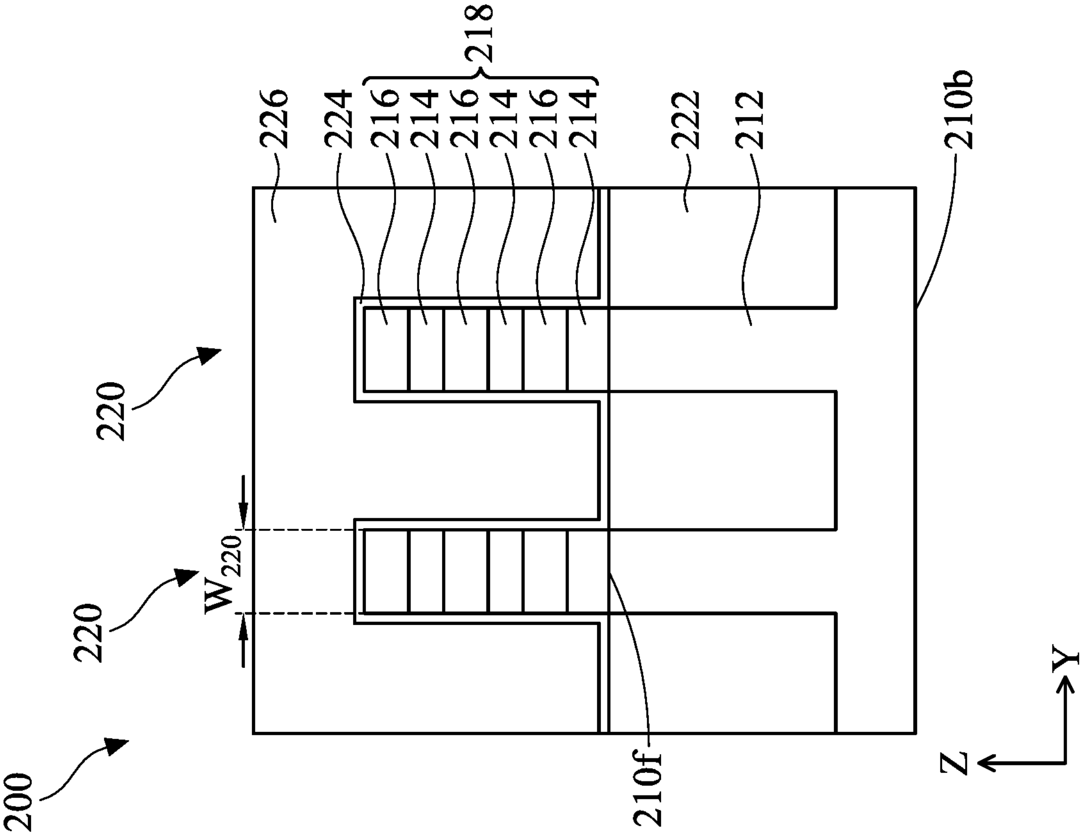
Figure 2D:
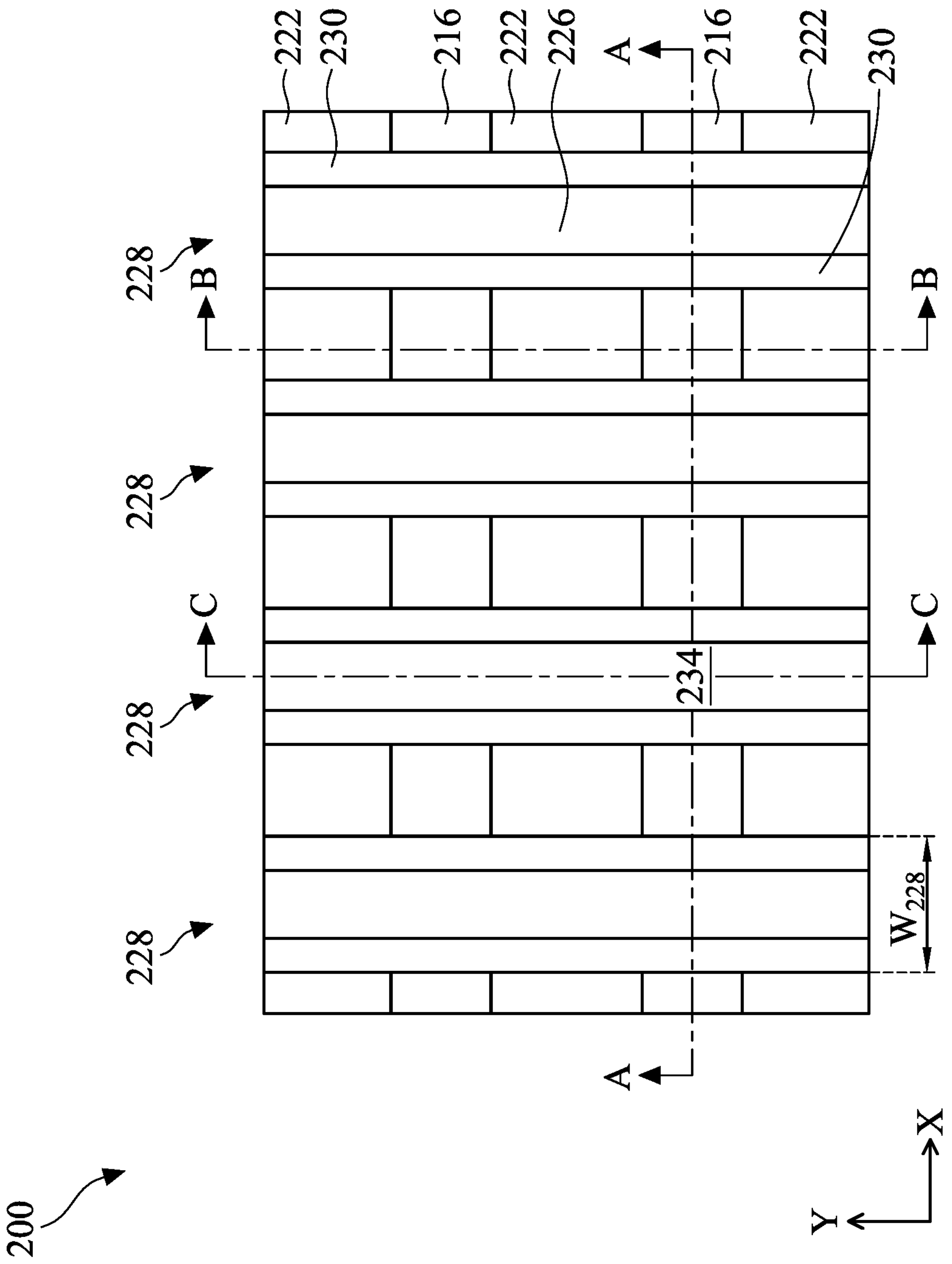

The method 100 begins at operation 102 where a plurality of semiconductor fins 220 are formed over a substrate 210, as shown in FIGS. 2A-2D. FIGS. 2A-2C are schematic cross-sectional views of the semiconductor device 200, and FIG. 2D is a schematic top view of the semiconductor device 200. Particularly, FIG. 2A is a cross sectional view of the semiconductor device 200 along the line A-A, shown in FIG. 2D. FIGS. 2B and 2C are cross sectional views of the semiconductor device 200 along the lines B-B and C-C in FIGS. 2A and 2D.

The substrate 210 is provided to form the semiconductor device 200 thereon. The substrate 210 may include a single crystalline semiconductor material such as, but not limited to Si, Ge, SiGe, GaAs, InSb, GaP, GaSb, InAlAs, InGaAs, GaSbP, GaAsSb, and InP. The substrate 210 may include various doping configurations depending on circuit design. For example, different doping profiles, e.g., n-wells, p-wells, may be formed in the substrate 210 in regions designed for different device types, such as n-type field effect transistors (NFET), and p-type field effect transistors (PFET). In some embodiments, the substrate 210 may be a silicon-on-insulator (SOI) substrate including an insulator structure (not shown) for enhancement.

The substrate 210 has a front surface 210*f* and a back surface 210*b*. A semiconductor stack is then formed over the front surface 210*f* of the substrate 210. The semiconductor stack includes alternating semiconductor layers made of different materials to facilitate formation of nanosheet channels in a multi-gate device, such as nanosheet channel FETs. In some embodiments, the semiconductor stack includes first semiconductor layers 214 interposed by second semiconductor layers 216. The first semiconductor layers 214 and second semiconductor layers 216 have different oxidation rates and/or etch selectivity.

In later fabrication stages, portions of the second semiconductor layers 216 form nanosheet channels in a multi-gate device. Three first semiconductor layers 214 and three second semiconductor layers 216 are alternately arranged as illustrated in FIGS. 2A-2C as an example. More or less semiconductor layers 214 and 216 may be included in the semiconductor stack depending on the desired number of channels in the semiconductor device to be formed. In some embodiments, the number of semiconductor layers 216 is between 1 and 10.

The semiconductor layers 214, 216 may be formed by a molecular beam epitaxy (MBE) process, a metalorganic chemical vapor deposition (MOCVD) process, and/or other suitable epitaxial growth processes. In some embodiments, the semiconductor layers 216 include the same material as the substrate 210. In some embodiments, the semiconductor layers 214 and 216 include different materials than the substrate 210. In some embodiments, the semiconductor layers 214 and 216 are made of materials having different lattice constants. In some embodiments, the first semiconductor layers 214 include an epitaxially grown silicon germanium (SiGe) layer and the second semiconductor layers 216 include an epitaxially grown silicon (Si) layer. Alternatively, in some embodiments, either of the semiconductor layers 214 and 216 may include other materials such as Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof.

The first semiconductor layers 214 in channel regions may eventually be removed and serve to define a vertical distance between adjacent channels for a subsequently formed multi-gate device. In some embodiments, the thickness of the first semiconductor layer 214 is equal to or greater than the thickness of the second semiconductor layer 216. In some embodiments, each semiconductor layer 214 has a thickness in a range between about 5 nm and about 50 nm. In other embodiments, each first semiconductor layer 214 has a thickness in a range between about 10 nm and about 30 nm. In some embodiments, each second semiconductor layer 216 has a thickness in a range between about 5 nm and about 30 nm. In other embodiments, each second semiconductor layer 216 has a thickness in a range between about 10 nm and about 20 nm. In some embodiments, each second semiconductor layer 216 has a thickness in a range between about 6 nm and about 12 nm. In some embodiments, the second semiconductor layers 216 in the semiconductor stack are uniform in thickness.

The semiconductor fins 220 are formed from the semiconductor stack and a portion of the substrate 210. The semiconductor fins 220 may be formed by patterning a hard mask (not shown) formed on the semiconductor stack and one or more etching processes. Each semiconductor fin 220 has a channel portion 218 formed from the semiconductor layers 214, 216 and a well portion 212 formed from the substrate 210. In FIGS. 2A-2D, the semiconductor fins 220 are formed along the X direction. Each semiconductor fin 220 may have a channel width $W_{220}$ along the y direction. The channel width $W_{220}$ may be selected according to circuit design.

An isolation layer 222 is formed in the trenches between the semiconductor fins 220, as shown in FIGS. 2B-2C. The isolation layer 222 is formed over the substrate 210 to cover the well portion 212 of the semiconductor fins 220. The isolation layer 222 may be formed by a high-density plasma chemical vapor deposition (HDP-CVD), a flowable CVD (FCVD), or other suitable deposition process. In some embodiments, the isolation layer 222 may include silicon oxide, silicon nitride, silicon oxynitride, fluorine-doped silicate glass (FSG), a low-k dielectric, combinations thereof. In some embodiments, the isolation layer 222 is formed to cover the semiconductor fins 220 by a suitable deposition process, such as atomic layer deposition (ALD), and then recess etched using a suitable anisotropic etching process to expose the channel portions 218 of the semiconductor fins 220.

In operation 104, sacrificial gate structures 228 and spacers then formed over the semiconductor fins 220, as shown in FIGS. 2A-2D. A sacrificial gate dielectric layer 224 is deposited over the exposed surfaces of the semiconductor device 200. The sacrificial gate dielectric layer 224 may be formed conformally over the semiconductor fins 220, and the isolation layer 222. In some embodiments, the sacrificial gate dielectric layer 224 may be deposited by a CVD process, a sub-atmospheric CVD (SACVD) process, a FCVD process, an ALD process, a PVD process, or other suitable process. The sacrificial gate dielectric layer 224 may include one or more layers of dielectric material, such as $SiO_2$, SiN, a high-K dielectric material, and/or other suitable dielectric material.

A sacrificial gate electrode layer 226 is deposited over the sacrificial gate dielectric layer 224. The sacrificial gate electrode layer 226 may be blanket deposited on the over the sacrificial gate dielectric layer 224. The sacrificial gate electrode layer 226 includes silicon such as polycrystalline silicon or amorphous silicon. The thickness of the sacrificial gate electrode layer is in a range between about 42 nm and about 200 nm. In some embodiments, the sacrificial gate electrode layer 226 is subjected to a planarization operation. The sacrificial gate electrode layer 226 may be deposited using CVD, including LPCVD and PECVD, PVD, ALD, or other suitable process. A patterning operation is the performed over the sacrificial gate dielectric layer 224 layer and the sacrificial gate electrode layer 226 to form the sacrificial gate structures 228, which cover formed over portions of the semiconductor fins 220 designed to be channel regions.

Gate sidewall spacers 230 are then formed on sidewalls of each sacrificial gate structures 228. After the sacrificial gate structures 228 are formed, the gate sidewall spacers 230 may be formed by a blanket deposition of an insulating material followed by anisotropic etch to remove insulating material from horizontal surfaces. The gate sidewall spacers 230 may have a thickness in a range between about 2 nm and about 10 nm. In some embodiments, the insulating material of the gate sidewall spacers 230 is a silicon nitride-based material, such as SiN, SiON, SiOCN or SiCN and combinations thereof. In other embodiments, the gate sidewall spacers 230 may be formed from two or more layers of dielectric materials.

The semiconductor fins 220 on opposite sides of the sacrificial gate structure 228 are recess etched, forming source/drain recesses 234 between the neighboring sacrificial gate structures 228. The first semiconductor layers 214 and the second semiconductor layers 216 in the semiconductor fins 220 are etched down on both sides of the sacrificial gate structures 228 using etching operations. In some embodiments, all layers in the semiconductor stack of the semiconductor fins 220 and a portion of the well portions 212 of the semiconductor fins 220 are etched. In some embodiments, suitable dry etching and/or wet etching may be used to remove the first semiconductor layers 214, the second semiconductor layers 216, and the substrate 210. As shown in FIG. 2A, the source/drain recesses 234 are formed on opposite sides of the sacrificial gate structures 228.

Inner spacers 232 are formed on exposed ends of the first semiconductor layers 214 under the sacrificial gate structures 228. The first semiconductor layers 214 exposed to the source/drain recesses 234 are first etched horizontally along the X direction to form spacer cavities. In some embodiments, the first semiconductor layers 214 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In some embodiments, the amount of etching of the first semiconductor layer 14 is in a range between about 3 nm and about 15 nm along the X direction.

After forming the spacer cavities at opposite ends of the first semiconductor layers 214, the inner spacers 232 can be formed in the spacer cavities by conformally deposit and then partially remove an insulating layer. The insulating layer can be formed by ALD or any other suitable method. The subsequent etch process removes most of the insulating layer except inside the cavities, resulting in the inner spacers 232. The inner spacers 232 includes two or more segments, alternately stacked with the second semiconductor layers 216.

The inner spacers 232 may be formed from a single layer or multiple layers of dielectric material. In some embodiments, the inner spacers 232 may include one of silicon nitride (SiN) and silicon oxide ($SiO_2$), SiONC, or a combination thereof. The inner spacer 232 may have a thickness in a range from about 3 nm to about 15 nm along the X direction. As shown in FIG. 2A, each sacrificial gate structure 228 may have a gate width $W_{228}$ along the x direction. The gate width $W_{228}$ may be selected according to circuit design.

Figures 3A, 3B:
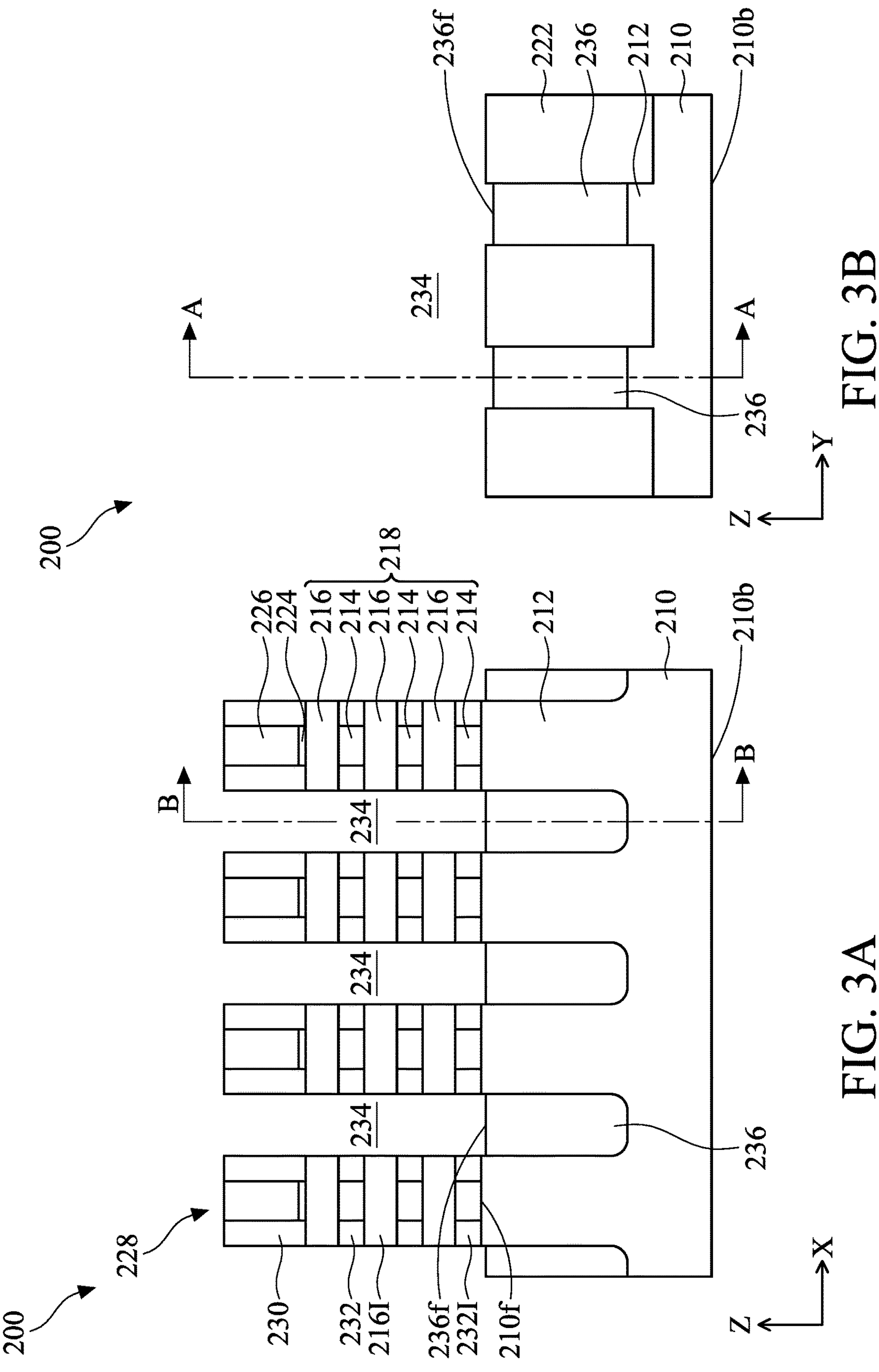

In operation 106, buried features 236 are formed in lower portions of the source/drain recesses 234, as shown in FIGS. 3A-3B. FIGS. 3A-3B are schematic cross-sectional views of the semiconductor device 200. FIG. 3A is a cross sectional view of the semiconductor device 200 along the line A-A in FIG. 3B. FIG. 3B is a cross sectional view of the semiconductor device 200 along the line B-B in FIG. 3A.

The buried features 236 fill the lower portions of the source/drain recesses 234 to a level below the bottom most semiconductor layer 216L, or the bottom most channel region. In some embodiments, the buried features 236 fill the source/drain recesses 234 to a level below the bottom most inner spacers 232L. As shown in FIGS. 3A-3B, a front surface **236*f* may be at a level below the bottom most inner spacers 232**L.

The buried features 236 may be formed from a material to have etch selectivity relative to the material of the substrate 210, such as material in the well portion 212 of the semiconductor fin 220. In some embodiments, the buried features 236 may also have etch selectivity relative to the insulating material in the isolation layer 222. In some embodiments, the buried features 236 are formed from a semiconductor material with a high etch selectivity relative to Si. For example, the buried features 236 are formed are formed from SiGe. In some embodiments, the buried features 236 are formed from undoped SiGe. In some embodiments, the buried features 236 are formed from undoped SiGe including an atomic concentration of Ge in a range between about 5% and about 50%. Alternatively, the buried features 236 may include other materials with etch selectivity with the substrate 210, such as Ge, a compound semiconductor such as SiC, GeAs, GaP, InP, InAs, and/or InSb, an alloy semiconductor such as GaAsP, AlInAs, AlGaAs, InGaAs, GaInP, and/or GaInAsP, or combinations thereof.

In some embodiments, the buried features 236 may be formed from a dielectric material, such as silicon oxide, silicon nitride, silicon oxynitride, silicon oxycarbide, silicon nitride carbide, metal oxide, such as aluminum oxide, hafnium oxide, or a combination thereof.

The buried features 236 may be formed by any suitable method, such as by CVD, CVD epitaxy, molecular beam epitaxy (MBE), or any suitable deposition technique.

During backside processes, the buried features 236 function as self-buried features for forming contact holes to connect with source/drain regions. The material of the buried features 236 allows portions of the semiconductor fins 220 in the channel region and opposite source/drain region to be selectively removed. Additionally, the buried features 236 can be selectively removed without etching the dielectric materials in the isolation layer 222.

In FIGS. 3A-3B, the buried features 236 are formed in all source/drain recesses 234. Alternatively, a patterning process may be formed to selectively deepen the source/drain recesses 234 and then form the buried features 236 in the selectively deepened source/drain recesses 234. For example, only source/drain regions with backside contacts would include the buried features 236.

Figure 4B:
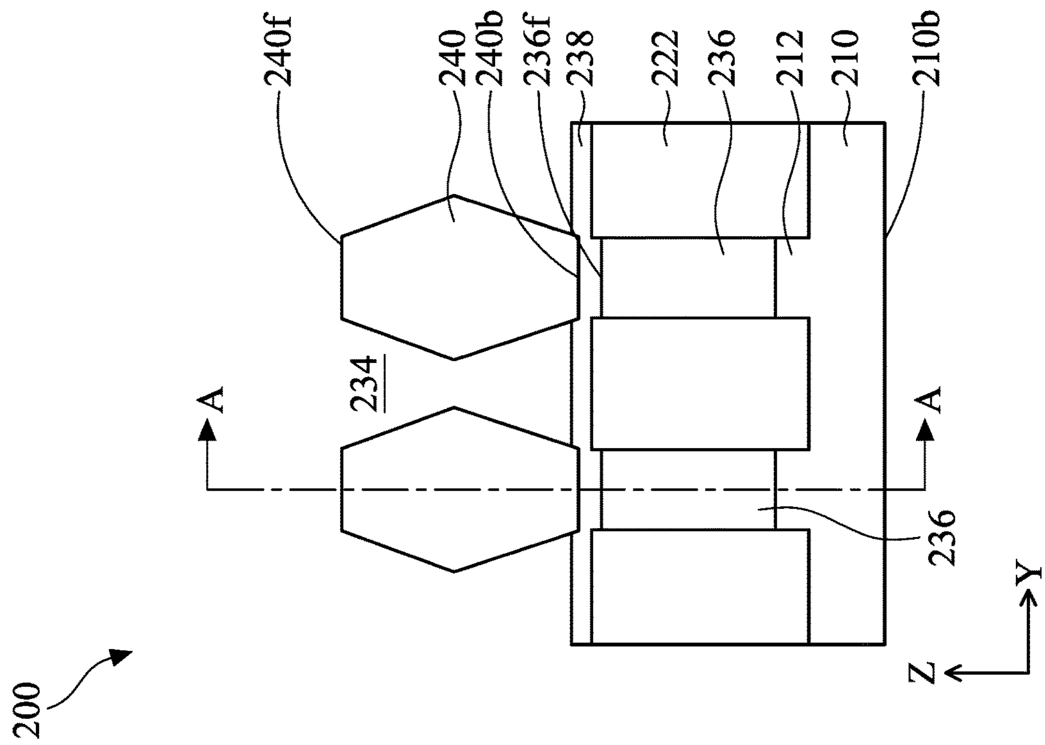
Figure 4A:
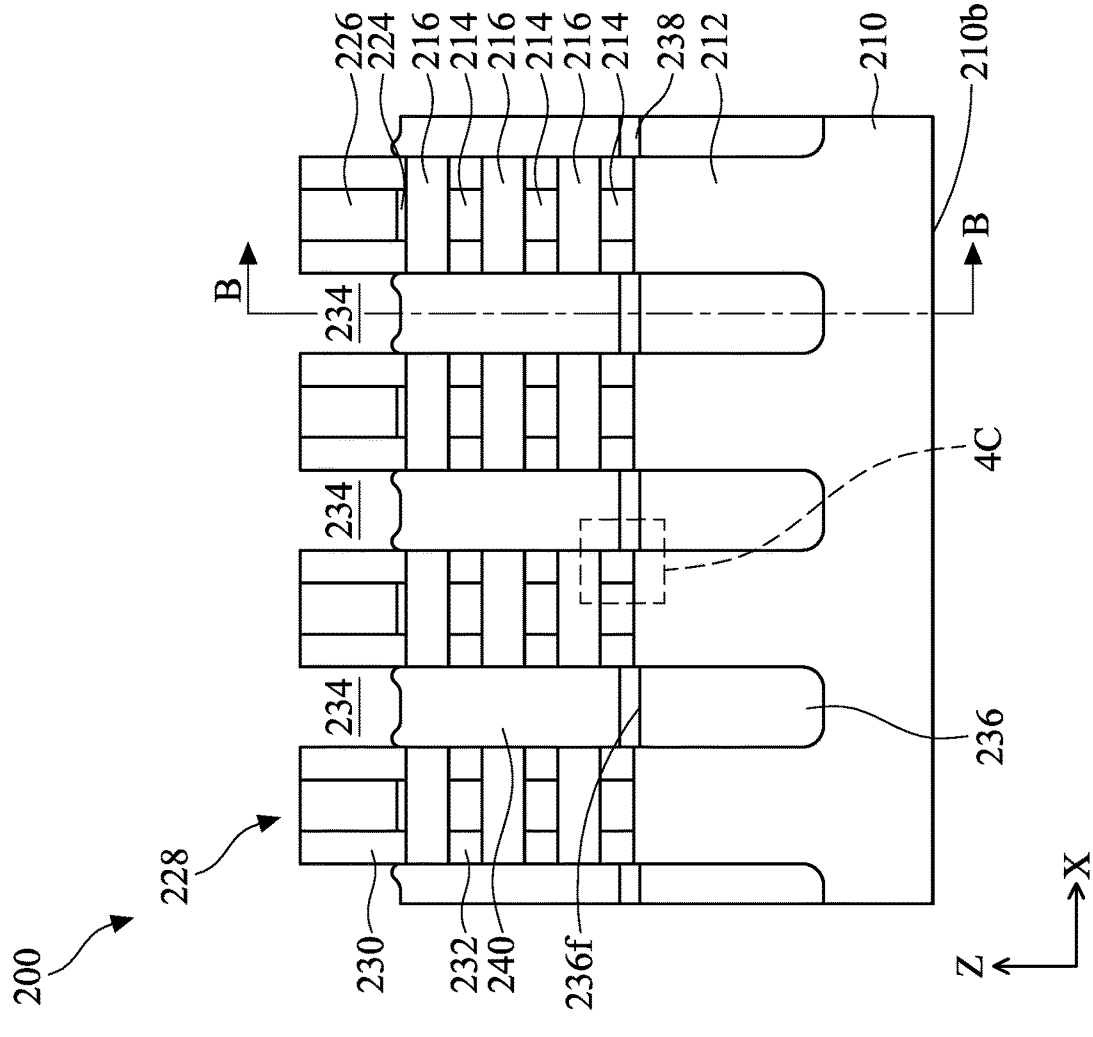
Figure 4C:
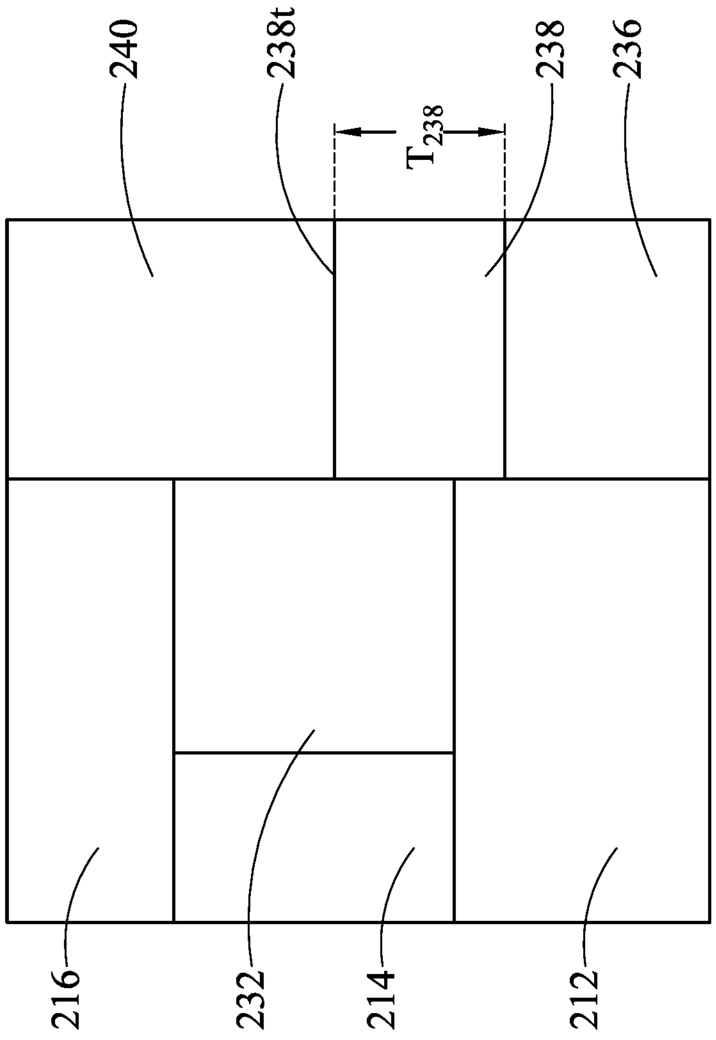

In operation 108, an optional flexible bottom isolation layer 238 is formed on bottoms of the source/drain recesses 234, as shown in FIGS. 4A-4C. FIGS. 4A-4B are schematic cross-sectional views of the semiconductor device 200. FIG. 4A is a cross sectional view of the semiconductor device 200 along the line A-A in FIG. 4B. FIG. 4B is a cross sectional view of the semiconductor device 200 along the line B-B in FIG. 4A. FIG. 4C is a partial enlarged view of an area 4C in FIG. 4A.

As shown in FIGS. 4A and 4B, the flexible bottom isolation layer 238 is formed on the front surface 236*f* of the buried features 236. The flexible bottom isolation layer 238 may also cover exposed surfaces of the isolation layer 222. The flexible bottom isolation layer 238 may include one or more layers of dielectric material. The flexible bottom isolation layer 238 may be function as an etch stop layer during backside processes. The flexible bottom isolation layer 238 may also protect the source/drain regions to be formed thereover during backside processes. The flexible bottom isolation layer 238 may also provide electrical isolation between the well portion 212 of the substrate 210 and the source/drain regions during operation.

As shown in FIG. 4C, the flexible bottom isolation layer 238 may have a thickness $T_{238}$ over the buried features 236. In some embodiments, the thickness $T_{238}$ is in a range between about 3 nm and about 8 nm. In some embodiments, a top surface 238*f* of the flexible bottom isolation layer 238 may intersect with the bottom most inner spacer 232*l* so that the flexible bottom isolation layer 238 covers the well portion 212 of the substrate 210 while keeping the bottom most semiconductor layer 216 exposed.

In some embodiments, the flexible bottom isolation layer 238 may be formed from a dielectric material, such as silicon nitride containing material, such as SiN, SiON, SiOCN, SiOC, SiCN, a metal oxide, such as AlOx, HfOx, or a combination thereof. The flexible bottom isolation layer 238 may be formed by any suitable method, such as by ALD, CVD, or any suitable deposition technique.

In operation 110, epitaxial source/drain regions 240 are formed in the source/drain recesses 234, as sown in FIGS. 4A-4B. In some embodiments, a preclean process may be performed prior to epitaxial growth of epitaxial source/drain regions 240 in the source/drain recesses 234. The epitaxial source/drain regions 240 are formed by an epitaxial growth method using CVD, ALD or molecular beam epitaxy (MBE). The epitaxial source/drain regions 240 may include one or more layers of Si, SiP, SiC and SiCP for NFET or Si, SiGe, Ge for a PFET. For the PFET, p-type dopants, such as boron (B), may also be included in the epitaxial source/drain regions 240.

In some embodiments, the epitaxial source/drain regions 240 are formed over the top surface 238*f* of the flexible bottom isolation layer 238 if present. The epitaxial source/drain regions 240 are grown from exposed semiconductor surfaces, such as the second semiconductor layers 216 under the sacrificial gate structure 228. In some embodiments, the epitaxial source/drain regions 240 are grown pass the topmost semiconductor channel, i.e., the second semiconductor layer 216 under the sacrificial gate structure 228, to be in contact with the gate sidewall spacers 230. The first semiconductor layers 214 under the sacrificial gate structure 228 are separated from the epitaxial source/drain regions 240 by the inner spacers 232. For clarity of description, the epitaxial source/drain regions 240 are in contact with the flexible bottom isolation layer 238 if present or with the source/drain buried feature 236 at front surfaces 240*f*. Front surfaces 240*f* of the epitaxial source/drain regions 240 are the opposing surfaces to the front surface 240*f*, as shown in FIGS. 4A-4B.

The epitaxial source/drain regions 240 may function as source regions and drain regions and are subsequently connected to power line or signal lines according to circuit design. For example, the epitaxial source/drain regions 240 that function as drain regions may be connected to signal lines; and the epitaxial source/drain regions 240 that function as source regions may be connected to a power rail. According to embodiments of the present disclosure, a portion of the epitaxial source/drain regions 240 may be connected to signal lines or power lines through connectors formed through the front surfaces 240*f* of the epitaxial source/drain regions 240 while another portion of the epitaxial source/drain regions 240 may be connected to signal lines or power lines through connectors formed through the back surfaces 240*b* of the epitaxial source/drain regions 240.

As shown in FIG. 4C, the optional flexible bottom isolation layer 238 improves the isolation between the epitaxial source/drain region 240 with the well portion 212 of the substrate 210 near the bottom most inner spacer 232.

Figure 5B:
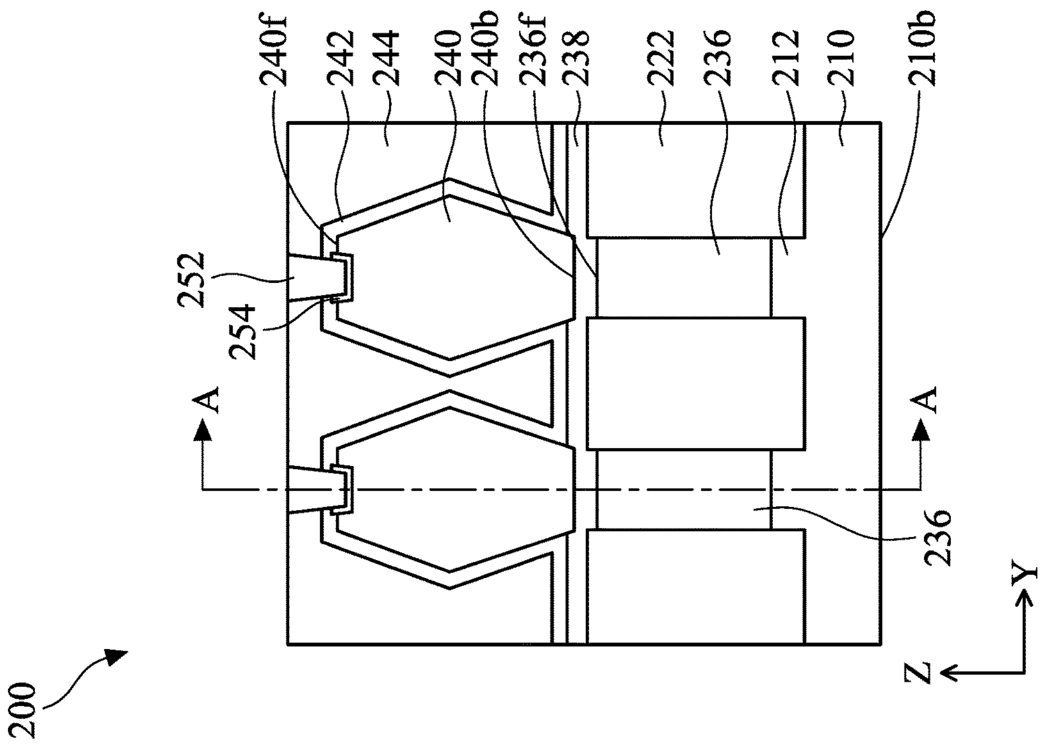
Figure 5A:
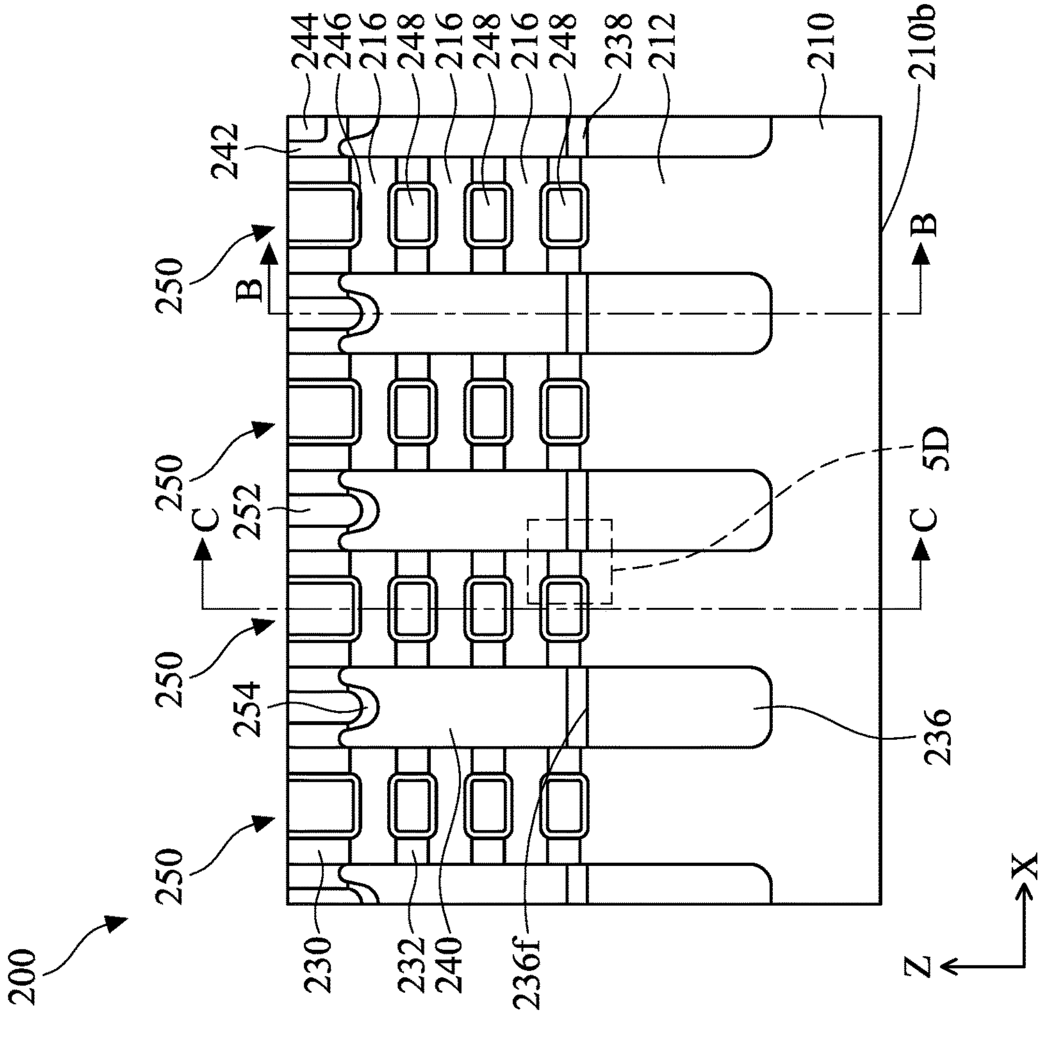
Figure 5C:
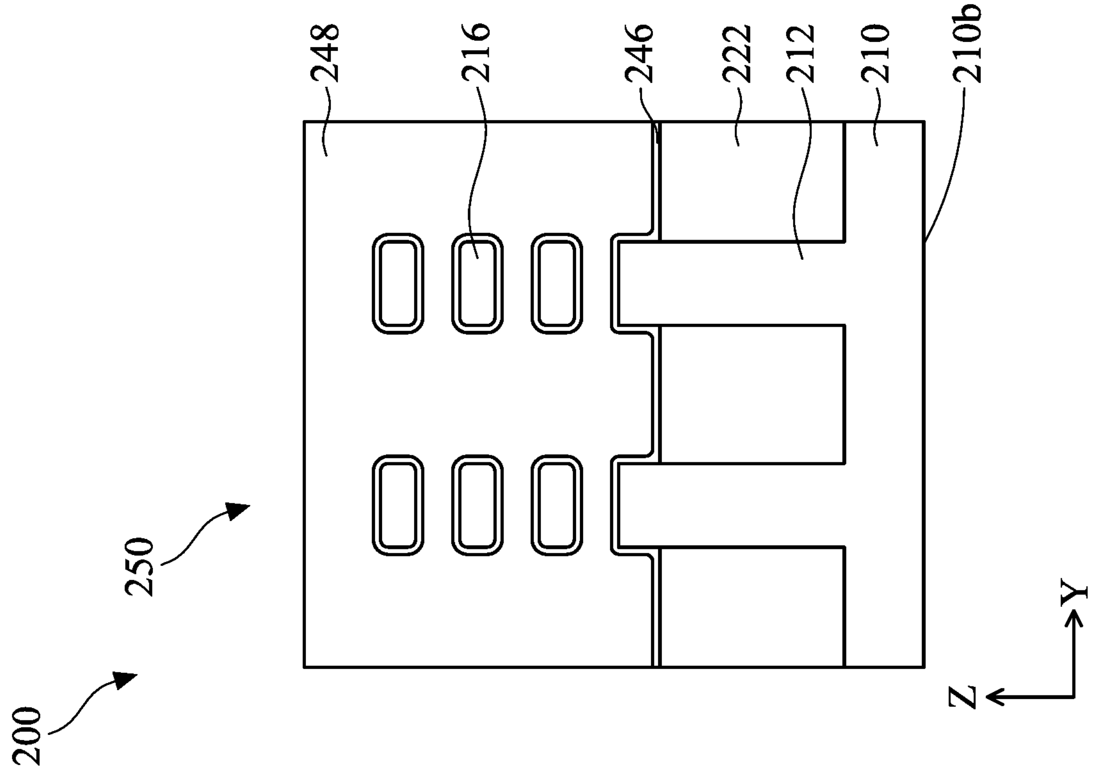

In operation 112, a contact etch stop layer (CESL) 242 and an interlayer dielectric (ILD) layer 244 are formed over the exposed surfaces as shown in FIGS. 5A-5C. FIGS. 5A-5C are schematic cross-sectional views of the semiconductor device 200. FIG. 5A is a cross sectional view of the semiconductor device 200 along the line A-A in FIG. 5B. FIGS. 5B and 5C are cross sectional views of the semiconductor device 200 along the lines B-B and C-C in FIG. 5A.

The CESL 242 is formed on the epitaxial source/drain regions 240, the gate sidewall spacers 230, and the flexible bottom isolation layer 238 if present. In some embodiments, the CESL 242 has a thickness in a range between about 1 nm and about 15 nm. The CESL 242 may include $Si_3N_4$, SiON, SiCN or any other suitable material, and may be formed by CVD, PVD, or ALD.

The interlayer dielectric (ILD) layer 244 is formed over the contract etch stop layer (CESL) 242. The materials for the ILD layer 244 include compounds comprising Si, O, C, and/or H, such as silicon oxide, SiCOH and SiOC. Organic materials, such as polymers, may be used for the ILD layer 244. After the ILD layer 244 is formed, a planarization operation, such as CMP, is performed to expose the sacrificial gate electrode layer 226 for subsequent removal of the sacrificial gate structures 228. The ILD layer 244 protects the epitaxial source/drain regions 240 during the removal of the sacrificial gate structures 228.

In operation 114, replacement gate structures 250 are formed in place of the sacrificial gate structures 228 and the sacrificial, as shown in FIGS. 5A-5D. The sacrificial gate structures 228 are first removed. Particularly, the sacrificial gate electrode layer 226 and the sacrificial gate dielectric layer 224 are removed sequentially resulting in gate openings and exposing the channel portion 218. The sacrificial gate electrode layer 226 can be removed using plasma dry etching and/or wet etching. When the sacrificial gate electrode layer 226 is polysilicon and the ILD layer 244 is silicon oxide, a wet etchant such as a Tetramethylammonium hydroxide (TMAH) solution can be used to selectively remove the sacrificial gate electrode layer 226 without removing the dielectric materials of the ILD layer 244, the CESL 242, and the gate sidewall spacers 230. After removal of the sacrificial gate electrode layer 226, the sacrificial gate dielectric layer 224 is exposed. The sacrificial gate dielectric layer 224 can be removed using suitable etching methods, such as plasma dry etching and/or wet etching.

After removal of the sacrificial gate dielectric layer 224, the first semiconductor layers 214 and the second semiconductor layers 216 are exposed to the gate openings. The first semiconductor layers 214 are then selectively removed using an etchant with a higher etch rate with respect to the first semiconductor layers 214 than the etch rate with respect to the second semiconductor layers 216. When the first semiconductor layers 214 are Ge or SiGe and the second semiconductor layers 216 are Si, the first semiconductor layers 214 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution. After the first semiconductor layers 214 are removed, the second semiconductor layers 216 are exposed to the gate openings resulting in a semiconductor channel region including the second semiconductor layers 216 in connection to the epitaxial source/drain regions 240.

The replacement gate structures 250 are then formed around the channel region. A gate dielectric layer 246 is formed around each of the second semiconductor layers 216 and a gate electrode layer 248 is formed on the gate dielectric layer 246. The gate dielectric layer 246 and the gate electrode layer 248 may be referred to as a replacement gate structure 250.

The gate dielectric layer 246 may be formed by CVD, ALD or any suitable method. In one embodiment, the gate dielectric layer 246 is formed using a highly conformal deposition process such as ALD in order to ensure the formation of a gate dielectric layer 246 having a uniform thickness around each of the second semiconductor layers 216. In some embodiments, the thickness of the gate dielectric layer 246 is in a range between about 1 nm and about 6 nm.

The gate dielectric layer 246 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSION, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, an interfacial layer (not shown) is formed between the second semiconductor layer 16 and the gate dielectric layer 246. In some embodiments, one or more work function adjustment layers (not shown) are interposed between the gate dielectric layer 246 and the gate electrode layer 248.

The gate electrode layer 248 is formed on the gate dielectric layer 246 to surround each of the second semiconductor layer 216 (i.e., each channel) and the gate dielectric layer 246. The gate electrode layer 248 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 248 may be formed by CVD, ALD, electro-plating, or other suitable method.

Figure 5D:
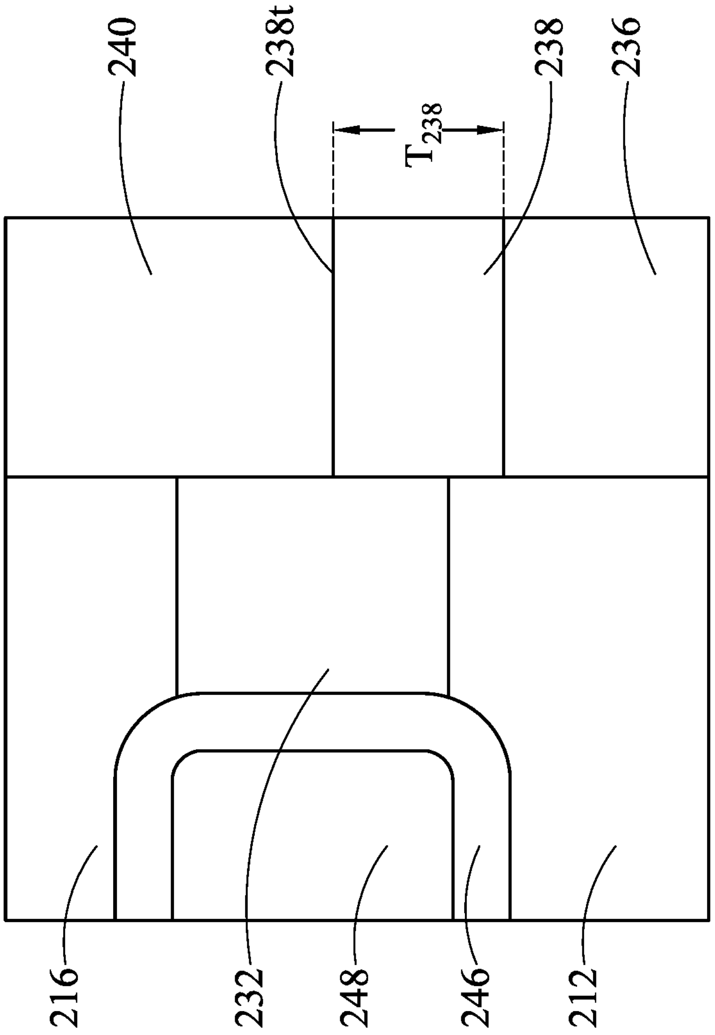

FIG. 5D is a partial enlarged view of an area 5D in FIG. 5A. FIGS. 4C and 5D are views of the same region prior to and after formation of the replacement gate structure 250. Comparing FIGS. 4C and 5D, a portion of the well portion 212 is etched away during the replacement process. In some circumstances, etch chemistry used in the replacement gate process may inadvertently breach the well portion 212 and potentially damage the epitaxial source/drain region 240. The flexible bottom isolation layer 238, positioned between the well portion 212 and the epitaxial source/drain region 240, can provide protection to the epitaxial source/drain region 240 during the replacement processes.

After the formation of the gate electrode layer 248, a planarization process, such as a CMP process, is performed to remove excess deposition of the gate electrode material and expose the top surface of the ILD layer 244.

In operation 116, front side source/drain contacts 252 are formed in the ILD layer 244 through the front surface **240*f* of the epitaxial source/drain regions 240, as shown in FIGS. 5A-5B. Prior to forming the front side source/drain contacts 252, contact holes are formed in the ILD layer 244, the CESL 242, and a portion of the epitaxial source/drain regions 240. Suitable photolithographic and etching techniques are used to form the contact holes through various layers, including the ILD layer 244 and the CESL 242 to expose the epitaxial source/drain regions 240**.

After the formation of the contact holes, a silicide layer 254 is selectively formed over an exposed surface of the epitaxial source/drain regions 240. The silicide layer 254 conductively couples the epitaxial source/drain regions 240 to the subsequently formed front side source/drain contacts 252. The silicide layer 254 may be formed by depositing a metal source layer to cover the epitaxial source/drain regions 240 and performing a rapid thermal annealing process. In some embodiments, the metal source layer includes a metal layer selected from W, Co, Ni, Ti, Mo, and Ta, or a metal nitride layer selected from tungsten nitride, cobalt nitride, nickel nitride, titanium nitride, molybdenum nitride, and tantalum nitride. After the formation of the metal source layer, a rapid thermal anneal process is performed, for example, a rapid anneal a rapid anneal at a temperature between about 700° C. and about 900° C. During the rapid anneal process, the portion of the metal source layer over the epitaxial source/drain regions 240 reacts with silicon in the epitaxial source/drain regions 240 to form the silicide layer 254. Unreacted portion of the metal source layer is then removed. In some embodiments, the silicide layer 254 includes one or more of WSi, CoSi, NiSi, TiSi, MoSi, and TaSi. In some embodiments, the silicide layer 254 has a thickness in a range between about 4 nm and 10 nm, for example between 5 nm and 6 nm.

After the silicide layer 254 is formed, the front side source/drain contacts 252 are formed in the contact holes by CVD, ALD, electro-plating, or other suitable method. The front side source/drain contacts 252 may be in contact with the silicide layer 254. The front side source/drain contacts 252 may include one or more of Co, Ni, W, Ti, Ta, Cu, Al, TiN and TaN. In some embodiments, a barrier layer (not shown) may be formed on sidewalls of the contact holes prior to forming the front side source/drain contacts 252.

In some embodiments, the front side source/drain contacts 252 are selectively formed over some of the epitaxial source/drain regions 240 according to circuit design. The front side source/drain contacts 252 are formed over the epitaxial source/drain regions 240, which are designed to directly connect with the subsequent formed front side interconnect structure, but not over the epitaxial source/drain regions 240 which are designed to connect with signal lines or power lines front contacts formed on the backside. A suitable patterning process may be performed selectively form the front side source/drain contacts 252. In other embodiments, the front side source/drain contacts 252 are formed over the epitaxial source/drain regions 240 for structural balance in the circuit design regardless of the subsequent design scheme. Some front side source/drain contacts 252 may be dummy contacts without connecting to the interconnect structure.

After formation of the front side source/drain contacts 252 are formed, a front side interconnect structure (not shown) is formed by a middle end of line process. The front side interconnect structure includes multiple dielectric layers having metal lines and vias formed therein. The metal lines and vias in the front side interconnect structure may be formed of copper or copper alloys using one or more damascene processes. The front side interconnect structure may include multiple sets of interlayer dielectric (ILD) layers and inter-metal dielectrics (IMDs) layers.

Figure 6B:
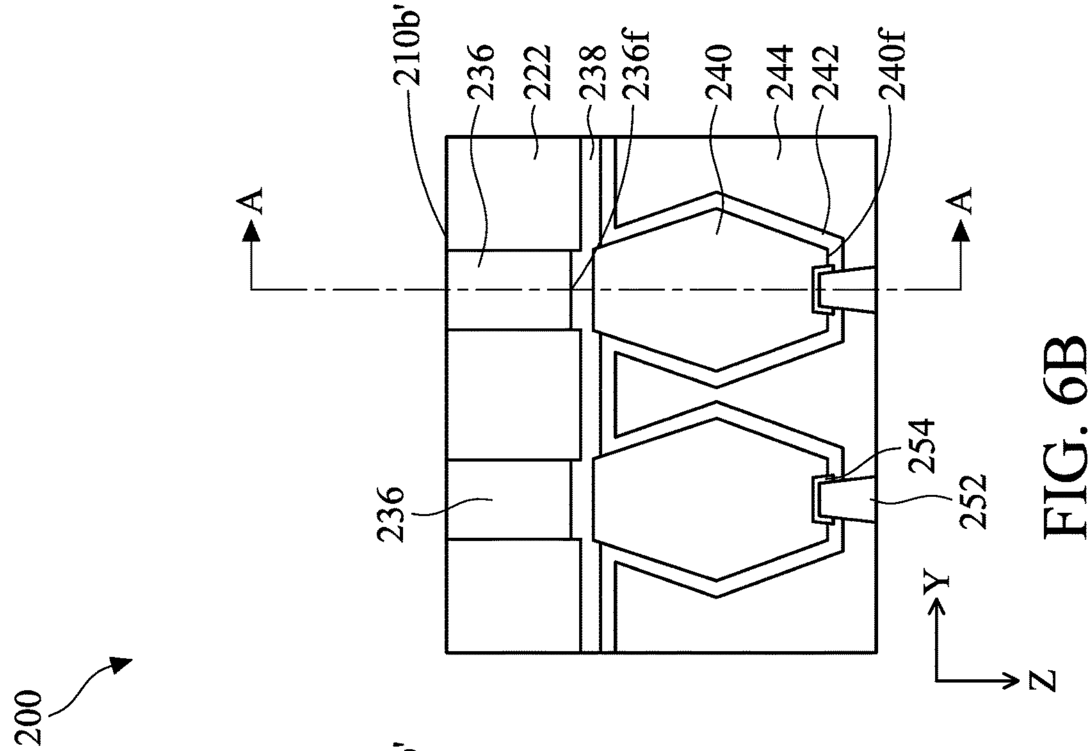
Figure 6A:
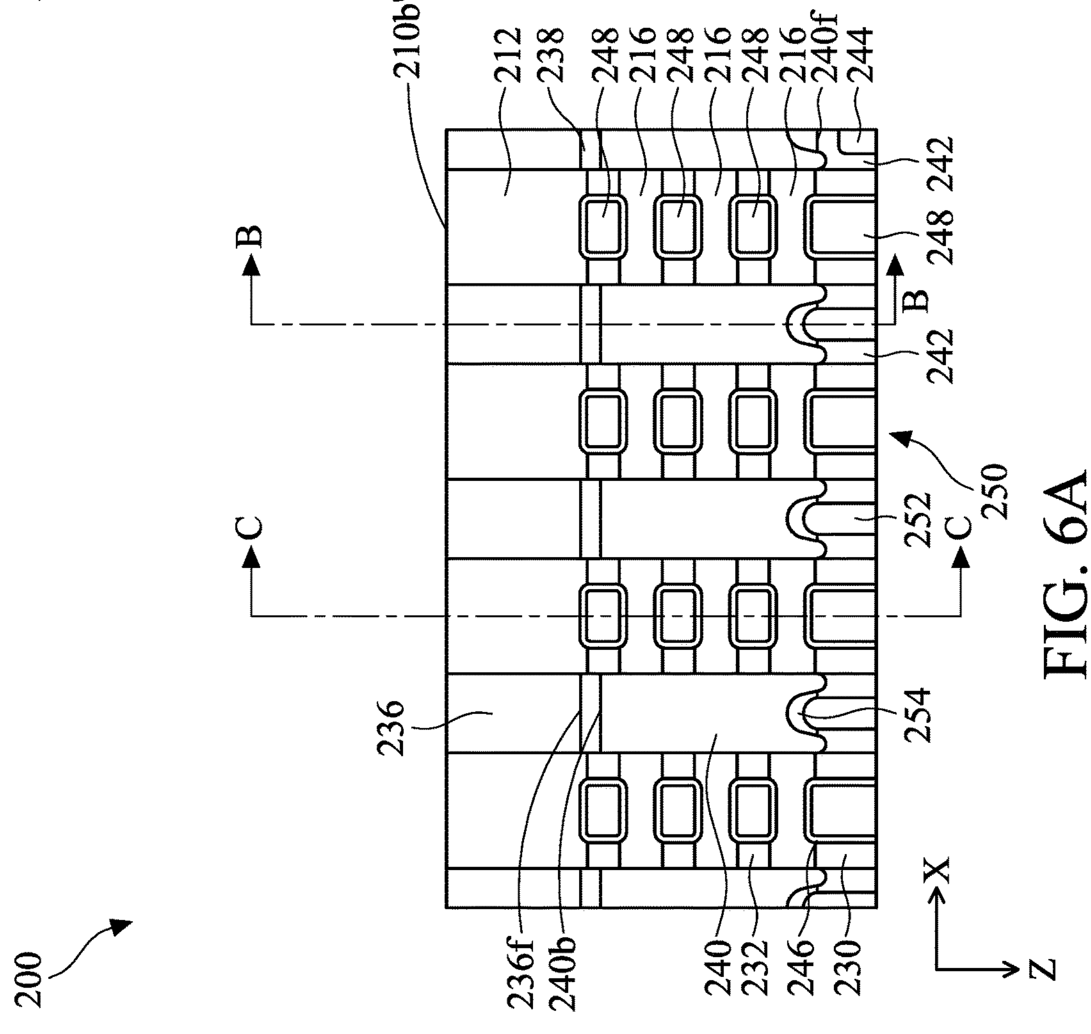
Figure 6C:
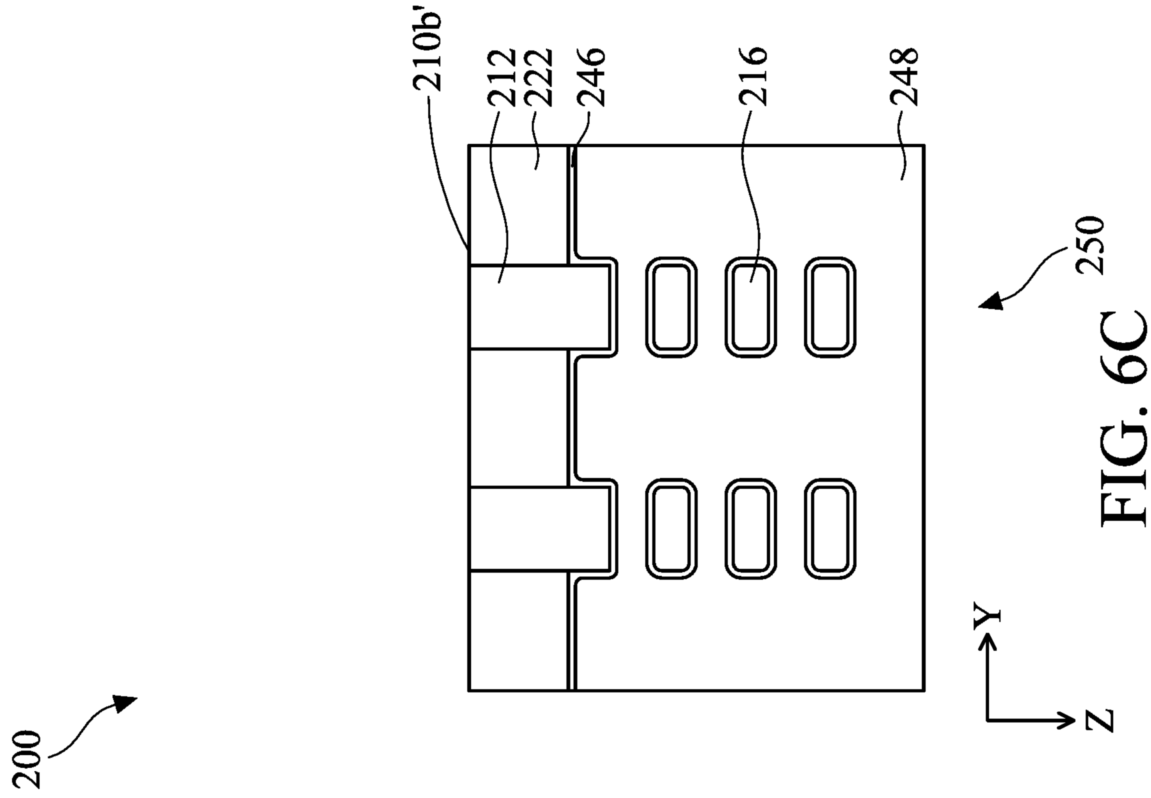
Figure 6D:
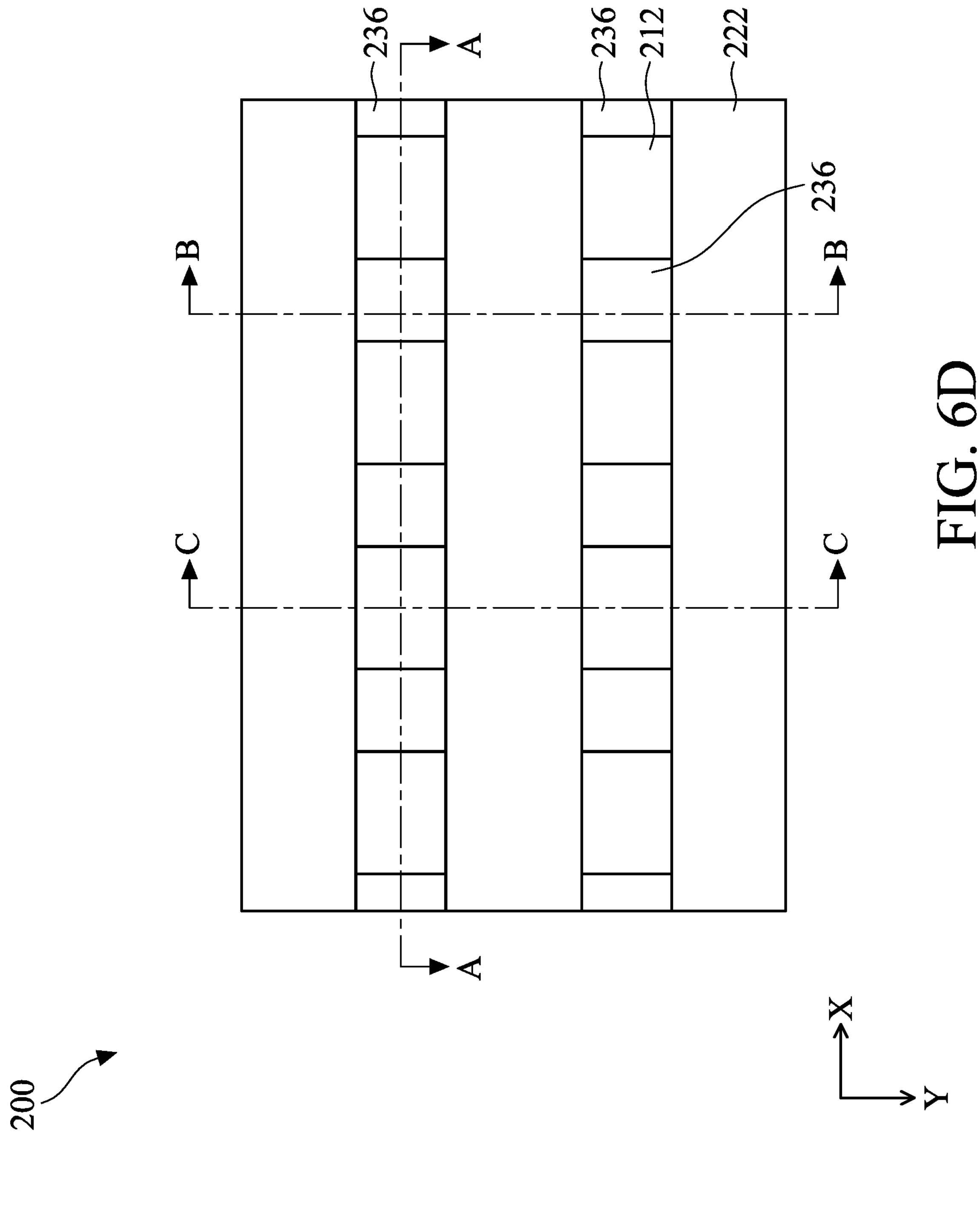

In operation 118, the semiconductor device 200 is flipped over and a back side thinning process is performed, as shown in FIGS. 6A-6D. FIGS. 6A-6C are schematic cross-sectional views of the semiconductor device 200, and FIG. 6D is a schematic top view of the semiconductor device 200. Particularly, FIG. 6A is a cross sectional view of the semiconductor device 200 along the line A-A, shown in FIG. 6D. FIGS. 6B and 6C are cross sectional views of the semiconductor device 200 along the lines B-B and C-C in FIGS. 6A and 6D.

In some embodiments, a carrier wafer (not shown) may be bond to a front side of the substrate 210, and the substrate 210 is flipped over so that the backside of the substrate 210, i.e., the back surface **210*b*, is facing up for backside processing. A backside grinding is performed thin down the substrate 210. For example, the back side grinding, such as a CMP process, may be performed to expose the buried features 236. As shown in FIGS. 6A-6D, after the thinning process, the semiconductor device 200 forms a planar back surface 210*b*', which includes the isolation layer 222, the well portion 212, and the buried features 236**.

Figure 7B:
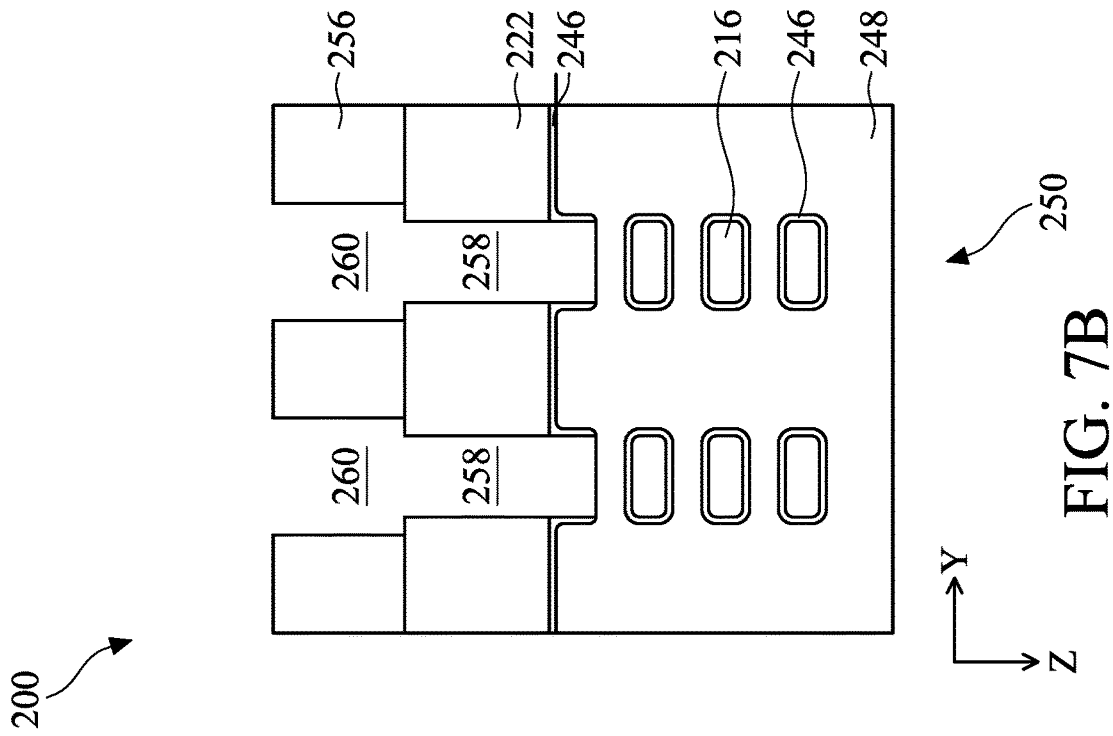
Figure 7A:
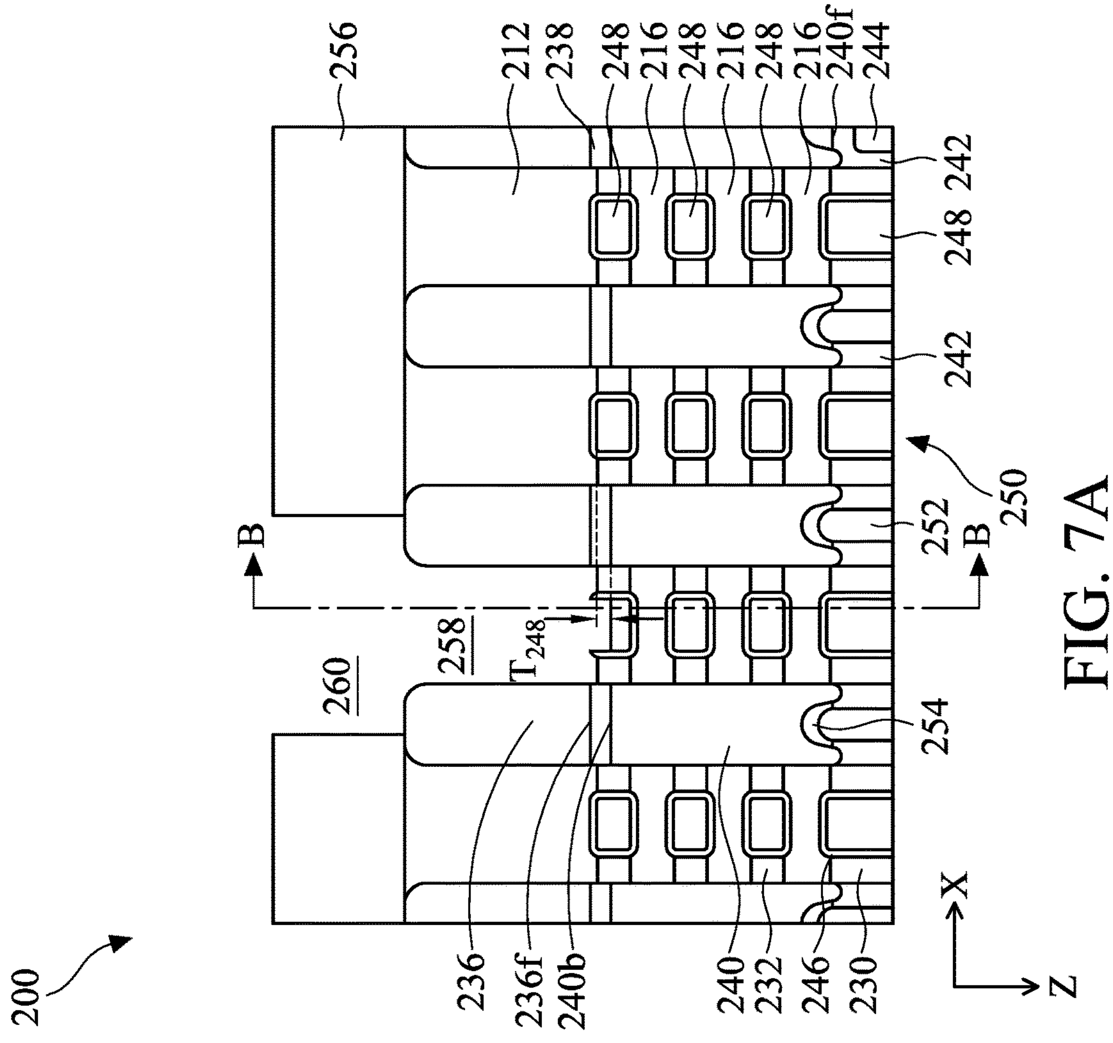
Figure 7C:
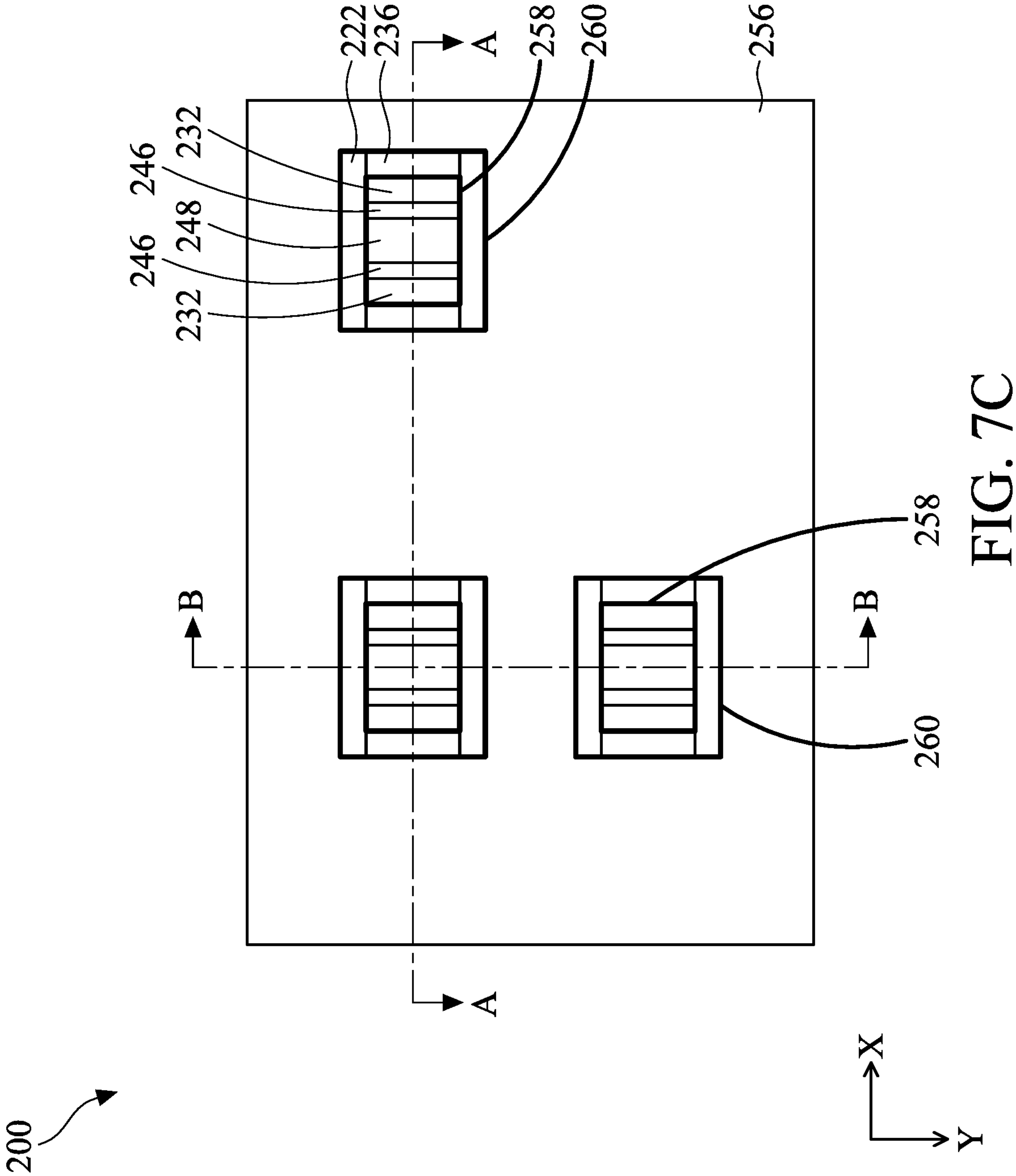

In operation 120, backside gate contact openings 258 are formed, as shown FIGS. 7A-7C. FIGS. 7A-7B are schematic cross-sectional views of the semiconductor device 200, and FIG. 7C is a schematic top view of the semiconductor device 200. Particularly, FIG. 7A is a cross sectional view of the semiconductor device 200 along the line A-A, shown in FIG. 7C. FIG. 7B is a cross sectional views of the semiconductor device 200 along the line B-B in FIG. 7C.

In some embodiments, a mask layer 256 may be formed over the back surface **210*b*'. The mask layer 256 is then patterned to form openings over the gate structures 250 according to the circuit design. A patterning process is performed to form openings 260 through the mask layer 256. Each opening 260 exposes the well portion 212 corresponding to the replacement gate structure 250 underneath. The openings 260 are larger than well portion 212, thus exposes the adjacent buried features 236 and isolation layer 222. Because the buried features 236 and the well portion 212 of the substrate 210 have high etching selectivity, the well portion 212 may be selectively removed, therefore function as an alignment feature to the replacement gate structure 250. In some embodiments, an etch process is then performed to selectively remove the well portion 212 to form the backside gate contact openings 258. The backside gate contact openings 258 expose the gate dielectric layer 246 and the inner spacers 232. The gate dielectric layer 246 is then removed to expose the gate electrode layer 248. In some embodiments, the gate electrode layer 248 may be slightly removed to ensure quality contact between the gate electrode layer 248 and subsequently formed conductive feature. For example, the gate electrode layer 248** may be etch for a thickness $T_{248}$ in a range between about 0 nm and about 5 nm.

As shown in FIG. 7C, the backside gate contact openings 258 are smaller than the openings 260 in the mask layer 256. Location, dimension, and shape of the backside gate contact openings 258 are determined by the well portion 212, or the dimension and location of the semiconductor fins 220 and the sacrificial gate structures 228. Particularly, the backside gate contact opening 258 may have a substantially rectangular cross section in the x-y plane, with a length along the x direction substantially similar to the gate width $W_{228}$, and a length along the y direction substantially similar to the channel width $W_{220}$.

Figure 8B:
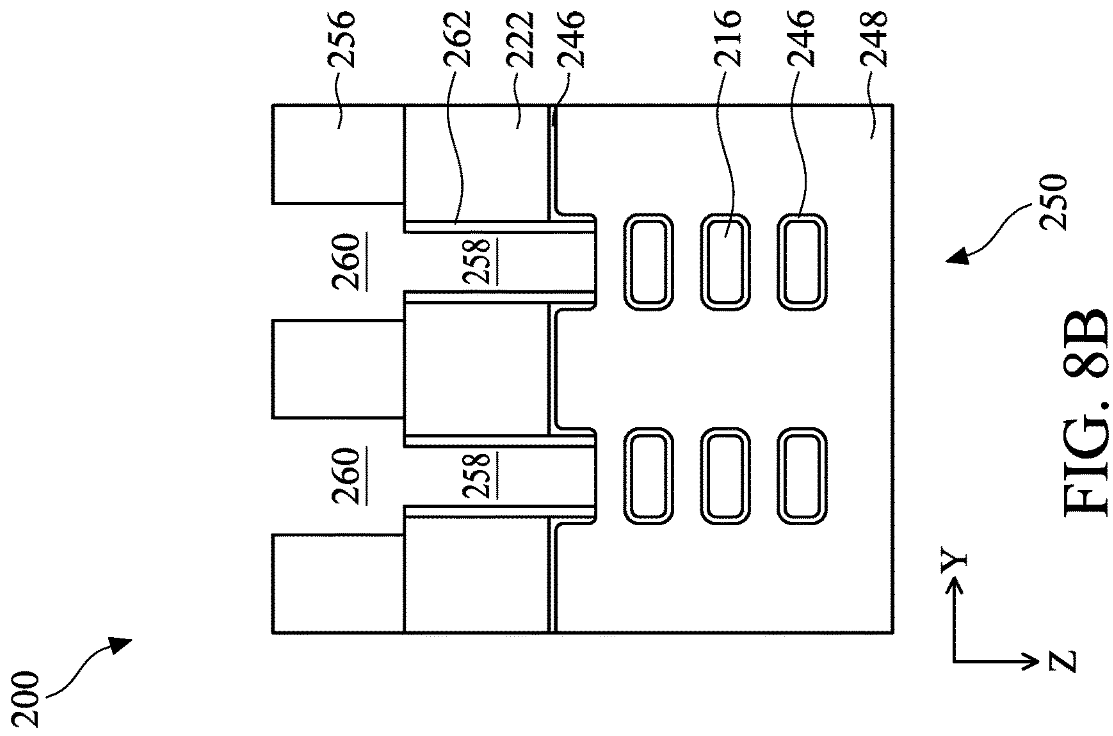
Figure 8A:
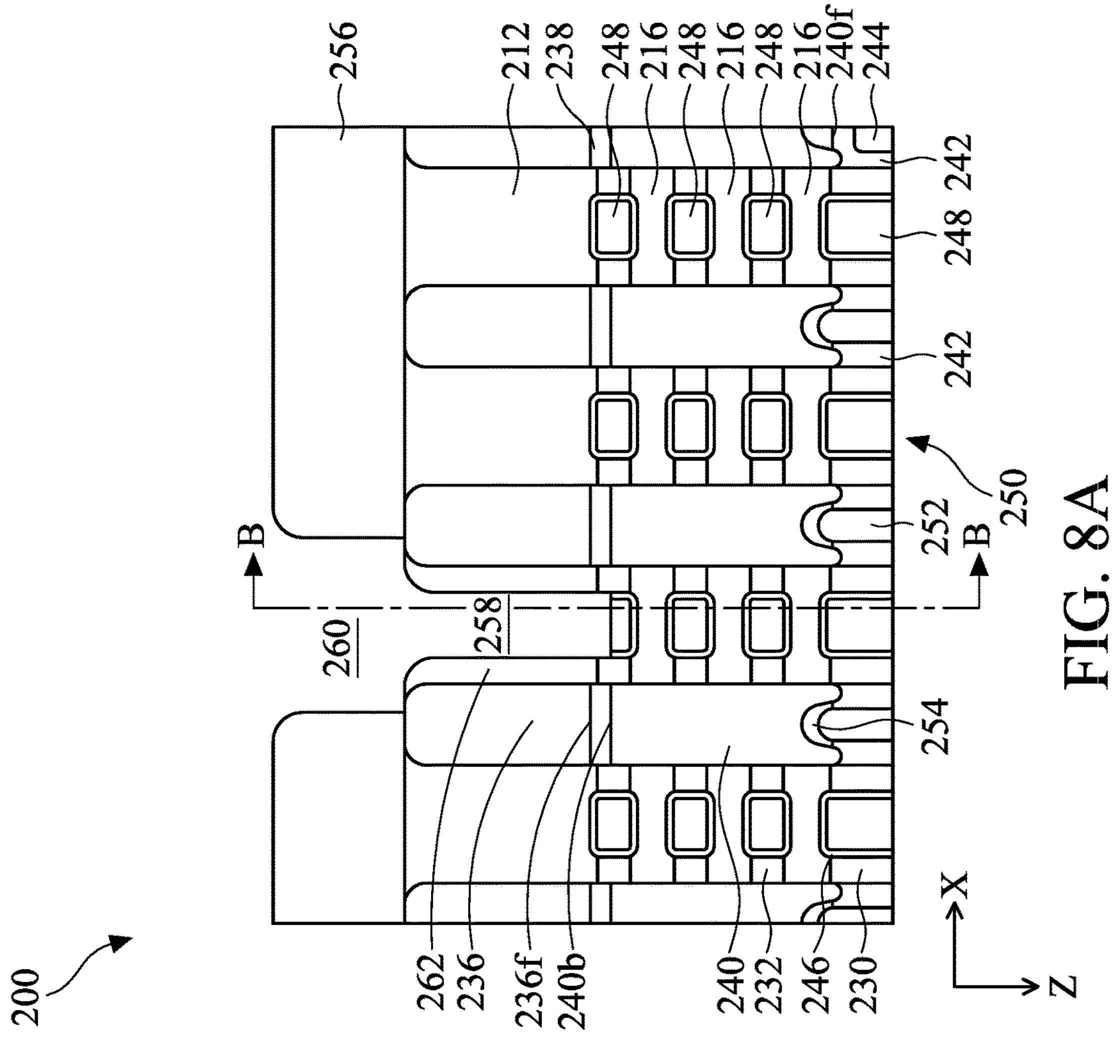
Figure 8C:
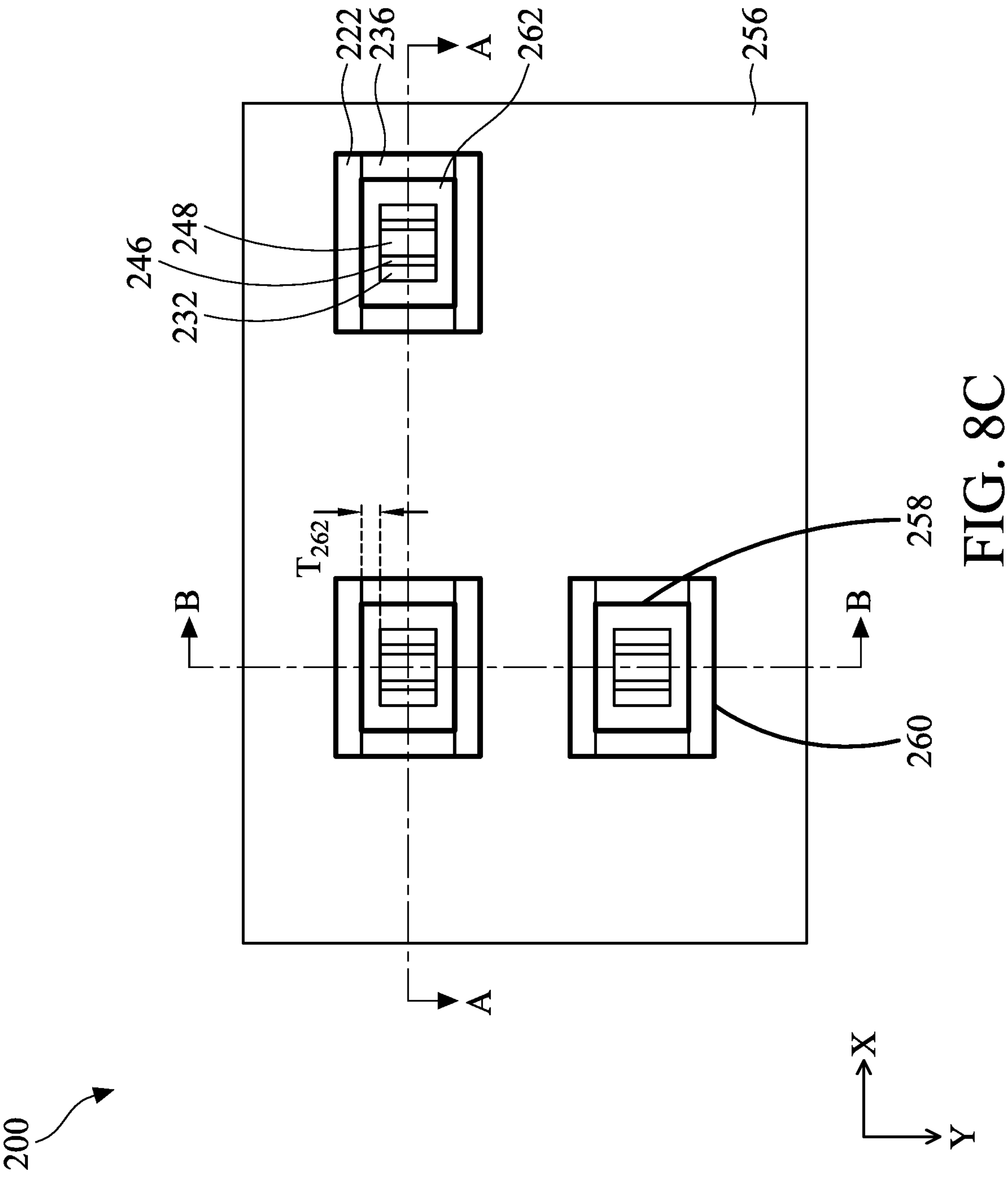

In operation 122, gate contact spacers 262 are formed on sidewalls of the backside gate contact openings 258, as show in FIGS. 8A-8C. FIGS. 8A-8B are schematic cross-sectional views of the semiconductor device 200, and FIG. 8C is a schematic top view of the semiconductor device 200. Particularly, FIG. 8A is a cross sectional view of the semiconductor device 200 along the line A-A, shown in FIG. 8C. FIG. 8B is a cross sectional views of the semiconductor device 200 along the line B-B in FIG. 8C.

The gate contact spacers 262 are intended to provide electrical isolation to the subsequently formed backside gate contacts from surrounding materials. The gate contact spacers 262 may be formed by conformally forming an insulating material followed by anisotropic etch, such as a dry etch, to remove insulating material from horizontal surfaces. The gate contact spacers 262 may have a thickness $T_{262}$ in a range between about 0 nm and about 8 nm. In some embodiments, the insulating material of the gate contact spacers 262 may be a low-k dielectric material comprising Si, O, C, N, and air gap. For example, the gate contact spacers 262 may include SiO, SiN, SiON, SiOCN, SiCN, or combinations thereof.

As shown in FIG. 8C, depending on the relative dimension of the gate contact spacers 262 and the inner spacers 232, the inner spacers 232 and the gate dielectric layer 246 may or may not be exposed at a bottom of the backside gate contact openings 258 after formation of the gate contact spacers 262.

Figure 9B:
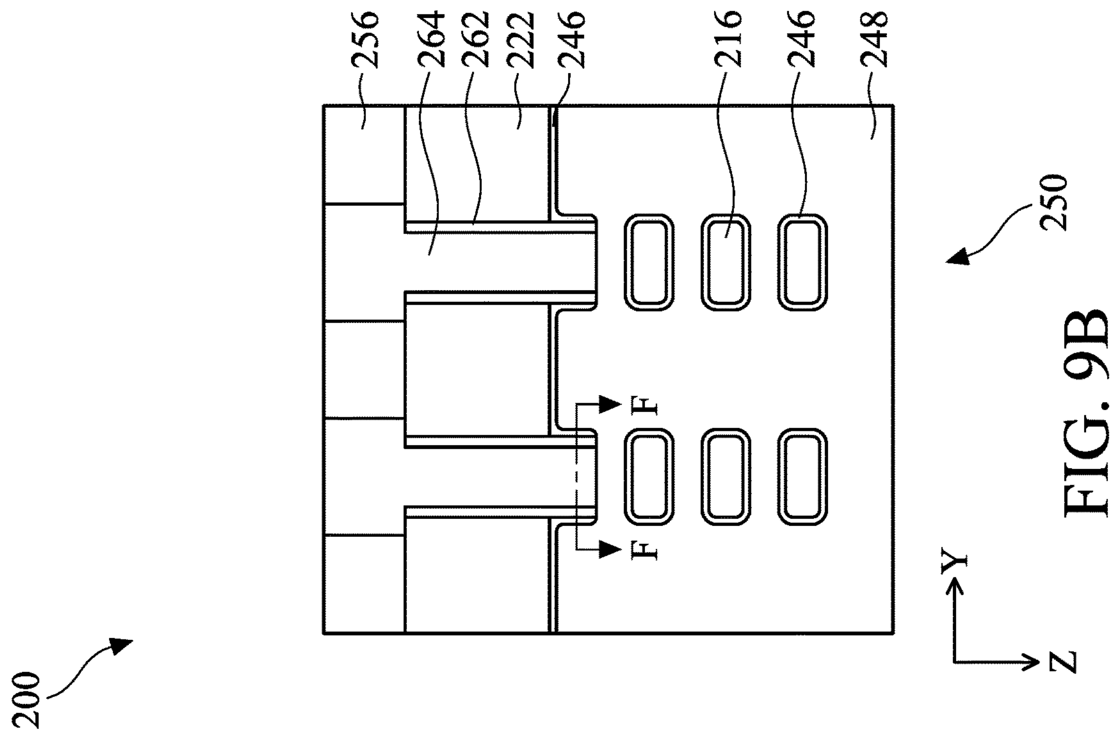
Figure 9A:
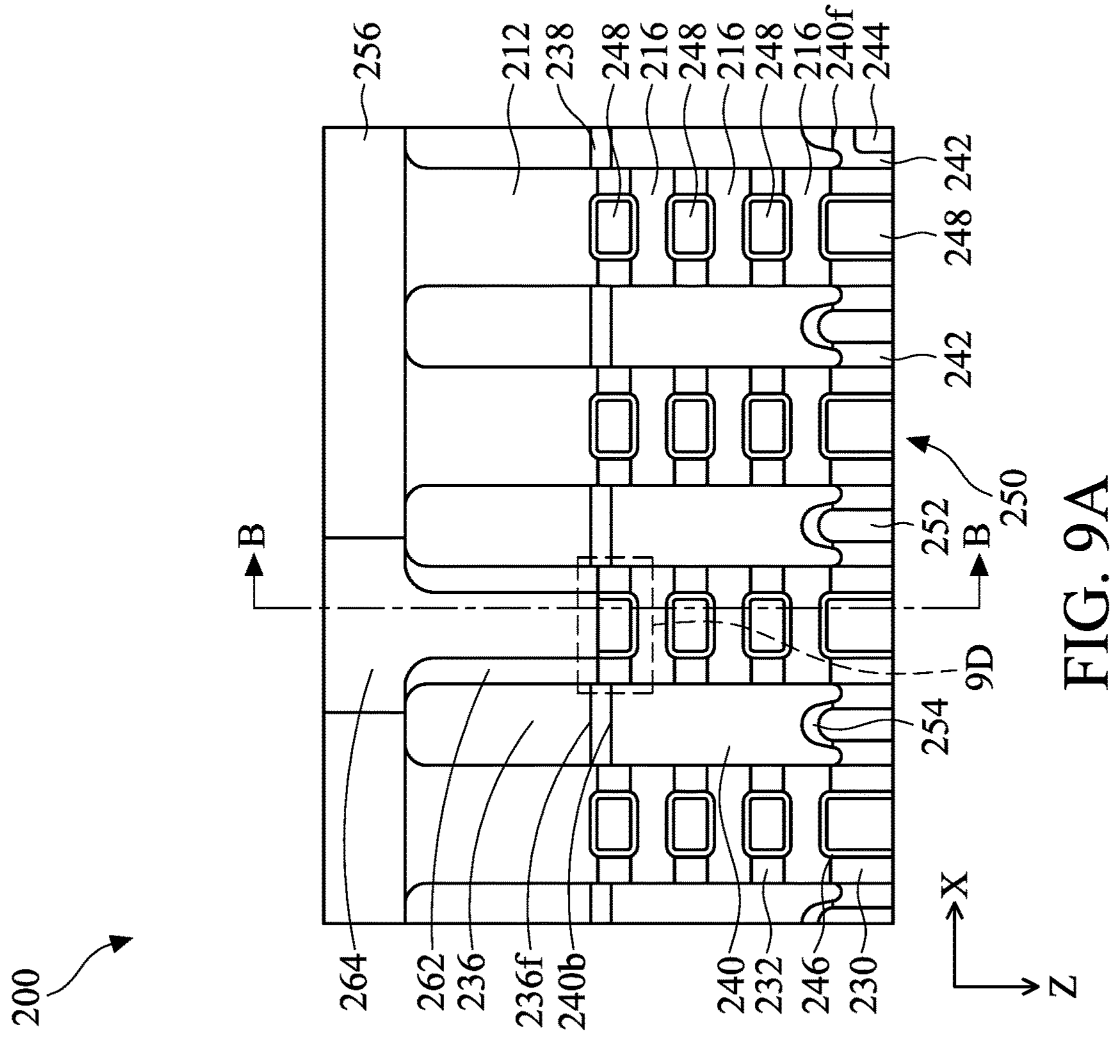
Figure 9C:
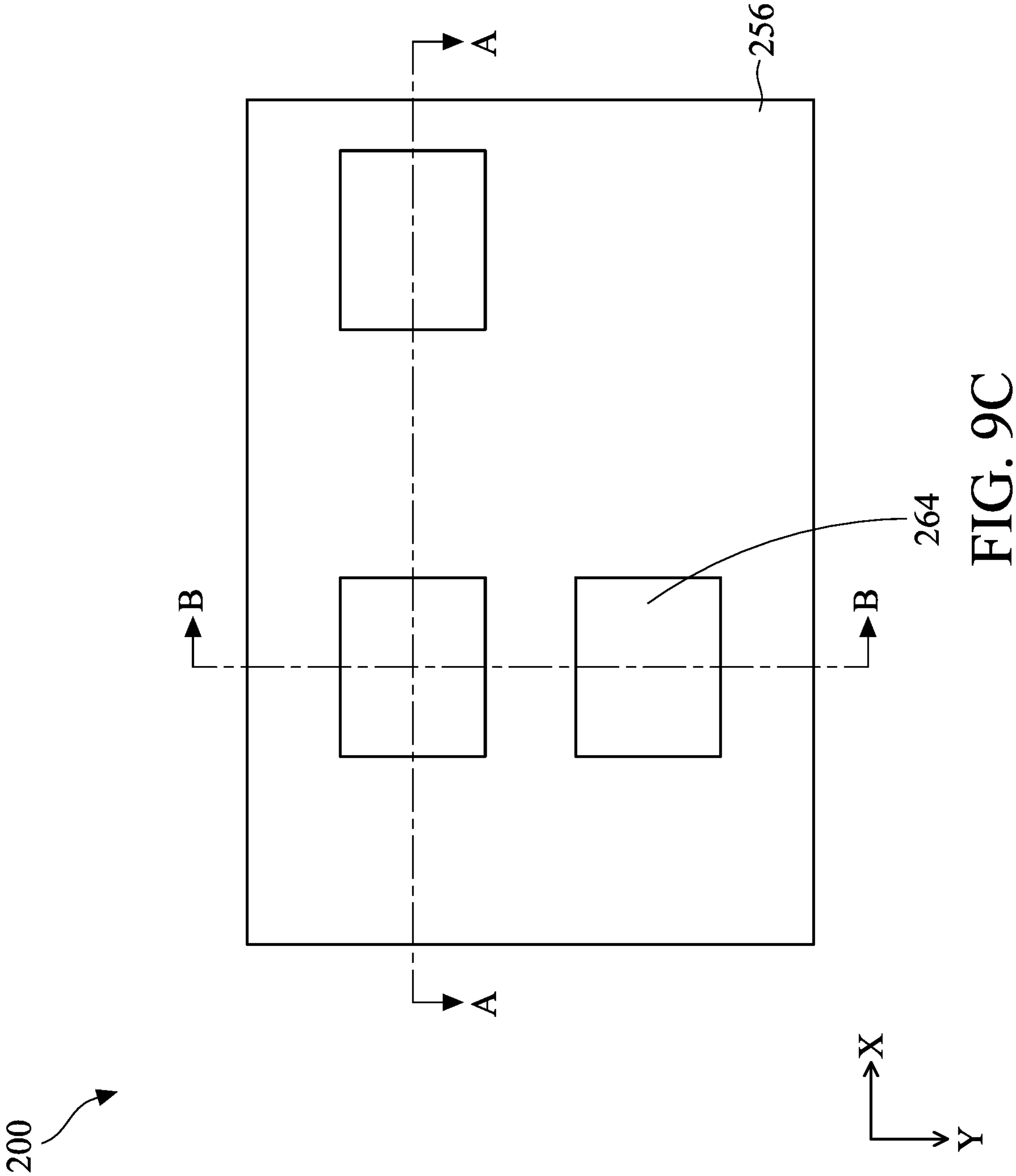
Figure 9D:
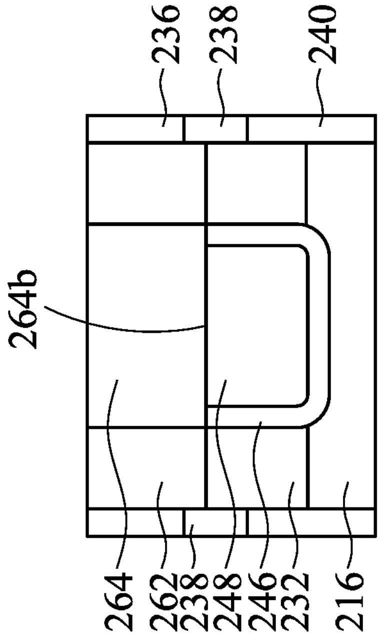
Figure 9E:
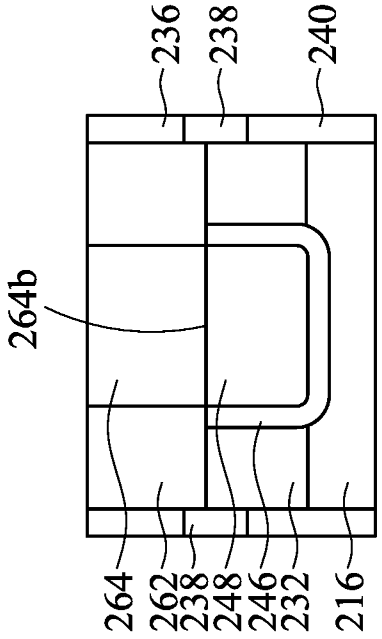
Figure 9F:
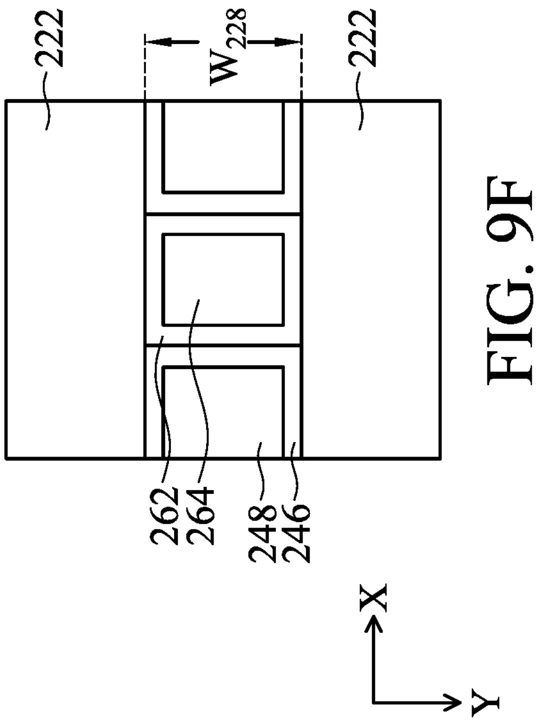

In operation 124, backside gate contacts 264 are formed in the backside gate contact openings 258, as shown in FIGS. 9A-9F. FIGS. 9A-9B are schematic cross-sectional views of the semiconductor device 200, and FIG. 9C is a schematic top view of the semiconductor device 200. Particularly, FIG. 9A is a cross sectional view of the semiconductor device 200 along the line A-A, shown in FIG. 9C. FIG. 9B is a cross sectional views of the semiconductor device 200 along the line B-B in FIG. 9C. FIG. 9D is enlarged sectional view of area 9D in FIG. 9A. FIG. 9E is an alternative embodiment of the FIG. 9D. FIG. 9F is a partial plan view of the semiconductor device 200 along line F-F in FIG. 9B.

The backside gate contacts 264 may be formed by filling a conductive material in the backside gate contact openings 258. As shown in FIGS. 9A and 9B, the backside gate contacts 264 are in direct contact with the gate electrode layer 248. The direct contact enables low resistance connections between the backside gate contacts 264 and the gate electrode layer 248, thus, improving device performance. The conductive material may be a metal, such as Ti, W, Ru, Mo, Co, Al, Cu, or compounds thereof. In some embodiments, the conductive material is filled in the contact holes by CVD, ALD, electro-plating, or other suitable method.

In some embodiments, a diffusion barrier layer, not shown, may be formed before deposition of the backside gate contacts 264. The diffusion barrier layer may include W, Co, Ni, Ti, Mo, and Ta, or a metal nitride layer selected from tungsten nitride, cobalt nitride, nickel nitride, titanium nitride, molybdenum nitride, and tantalum nitride. In some embodiments, a planarization process, such as CMP, may be performed after deposition.

As shown in FIG. 9A, because the backside gate contacts 264 is flanked by the buried features 236, the backside gate contacts 264 are symmetrically connected to the corresponding gate electrode layer 248 without shifting to either side along the x-direction.

As shown in the enlarged view in FIG. 9D, the backside gate contact 264 is in direct contact with the gate electrode layer 248 at a bottom surface 264*b*. When the gate contact spacer 262 is thinner than the inner spacer 232, the bottom surface 264*b* of the backside gate contact 264 may also contact the gate dielectric layer 246 and the inner spacer 232. In some embodiments, when the gate contact spacer 263 is thicker than the inner spacer 232, the bottom surface 264*b* of the backside gate contact 264 does not contact the inner spacer 232, as shown in FIG. 9E. As shown in both FIGS. 9D and 9E, the inner spacers 232 and the gate contact spacer 262 isolate the backside gate contact with the source/drain region 240.

In some embodiments, the backside gate contacts 264 have a substantially straight profile along the z-direction through the isolation layer 222 and into the gate structure 250. As show in FIG. 9F, the gate contact spacer 262 and the backside gate contact 264 fill a column along the z-direction. The column has a substantially rectangular cross section in the x-y plane, with a length along the x direction substantially similar to the gate width $W_{228}$, and a length along the y direction substantially similar to the channel width $W_{220}$. In the level into the gate structure 250, the gate contact spacer 262 is in contact with the isolation layer 222 and the gate dielectric layer 246.

Figure 10B:
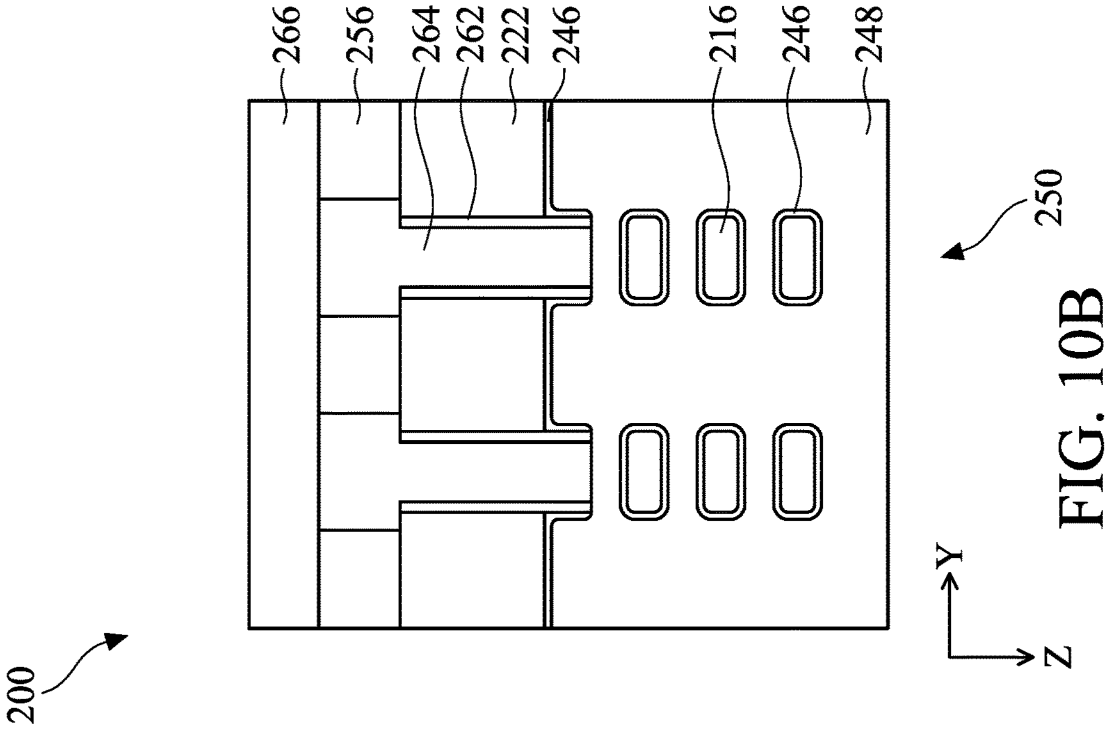
Figure 10A:
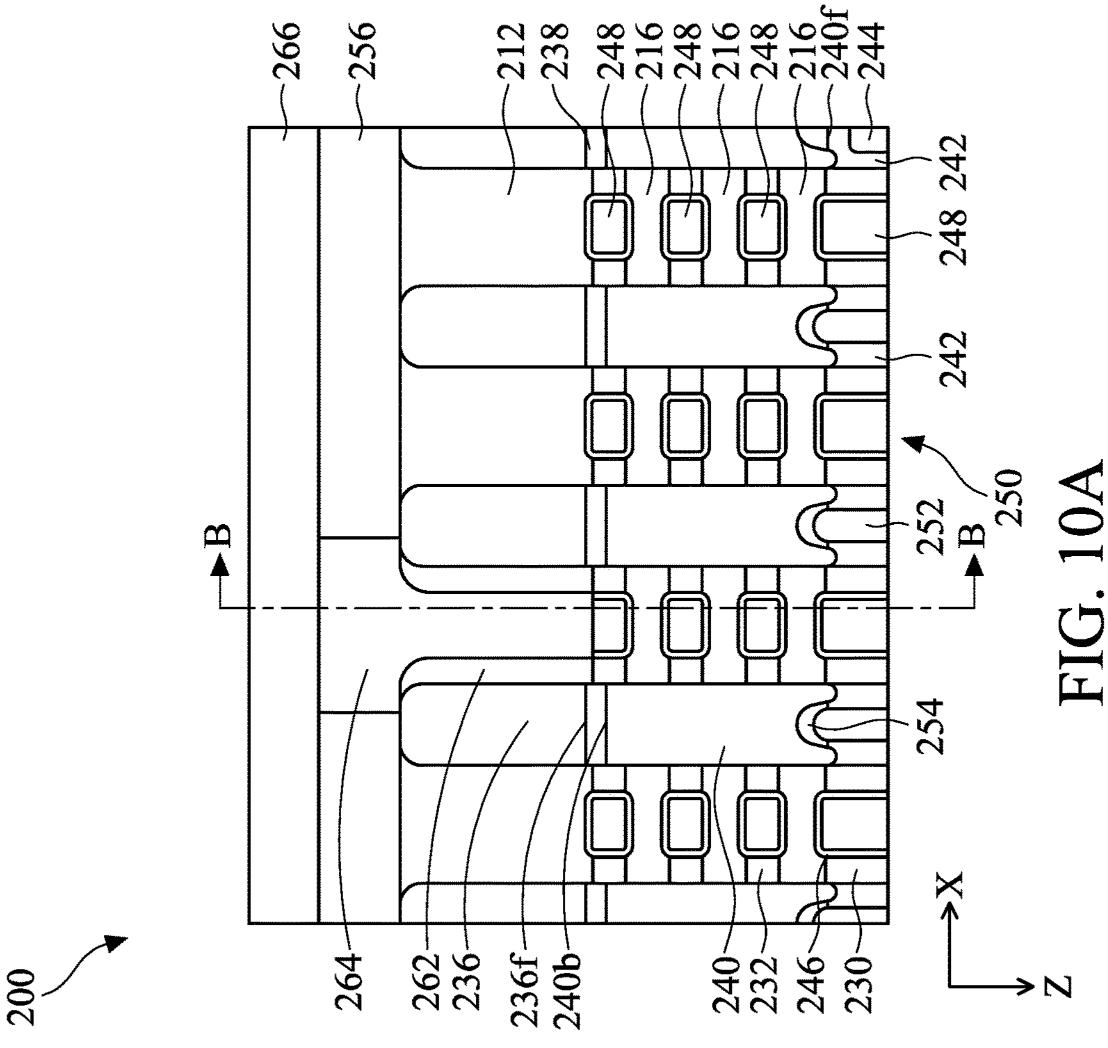

In operation 126, a second mask layer 266 is deposited, as shown in FIGS. 10A-10B. FIGS. 10A-10B are schematic cross-sectional views of the semiconductor device 200. FIG. 10A is a cross sectional view of the semiconductor device 200 along the line A-A in FIG. 10B. FIG. 10B is a cross sectional view of the semiconductor device 200 along the line B-B in FIG. 10A. The mask layer 266 may be formed from the same material as the mask layer 256.

Figure 11A:
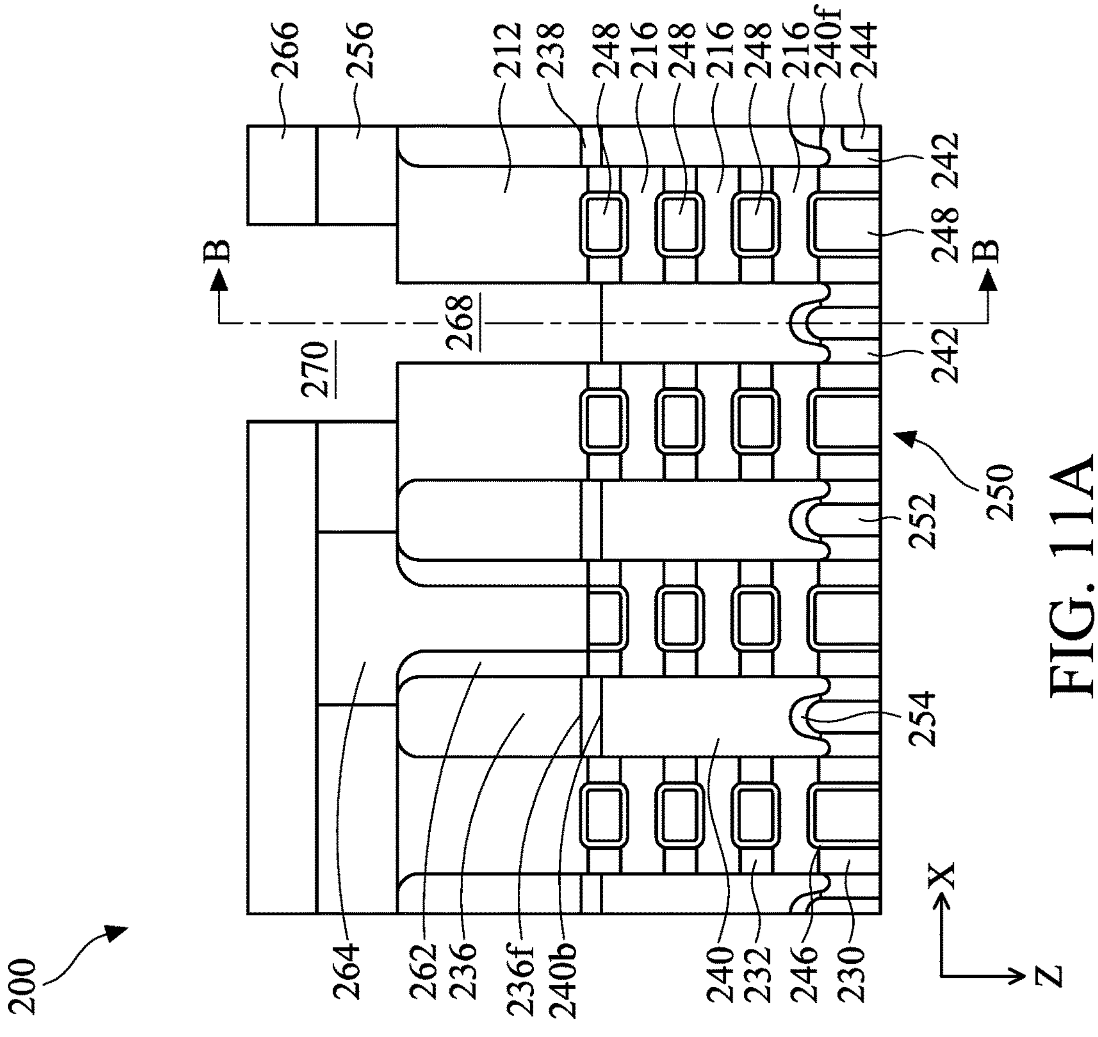
Figure 11B:
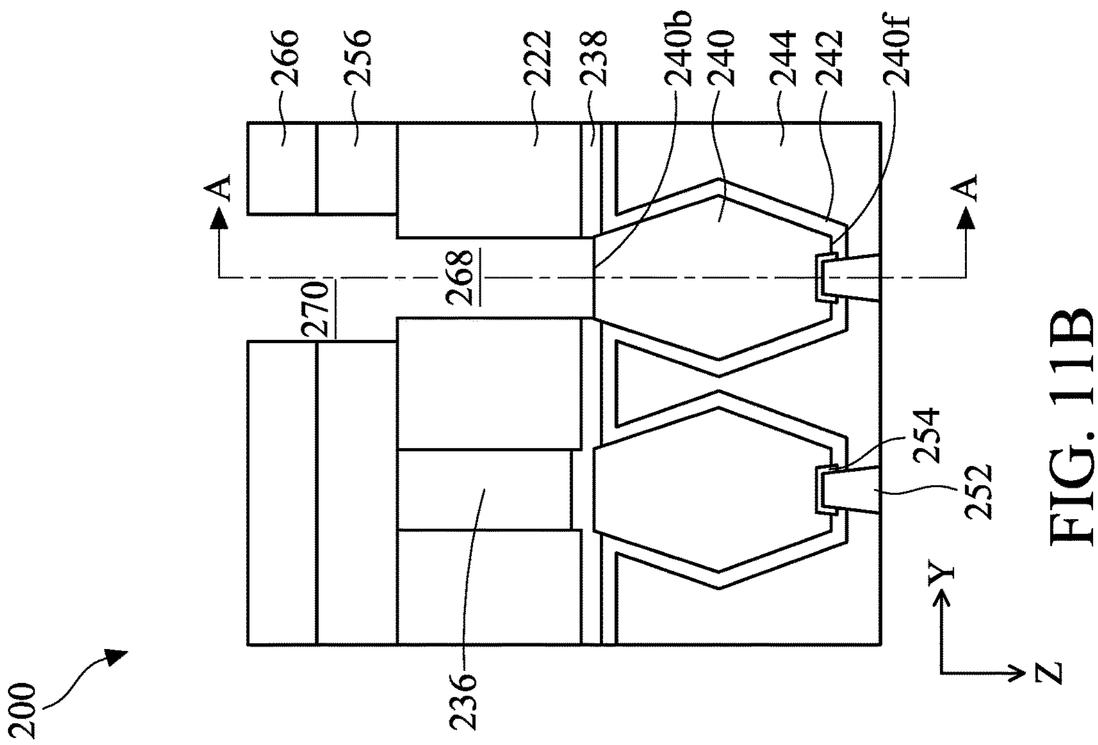
Figure 11C:
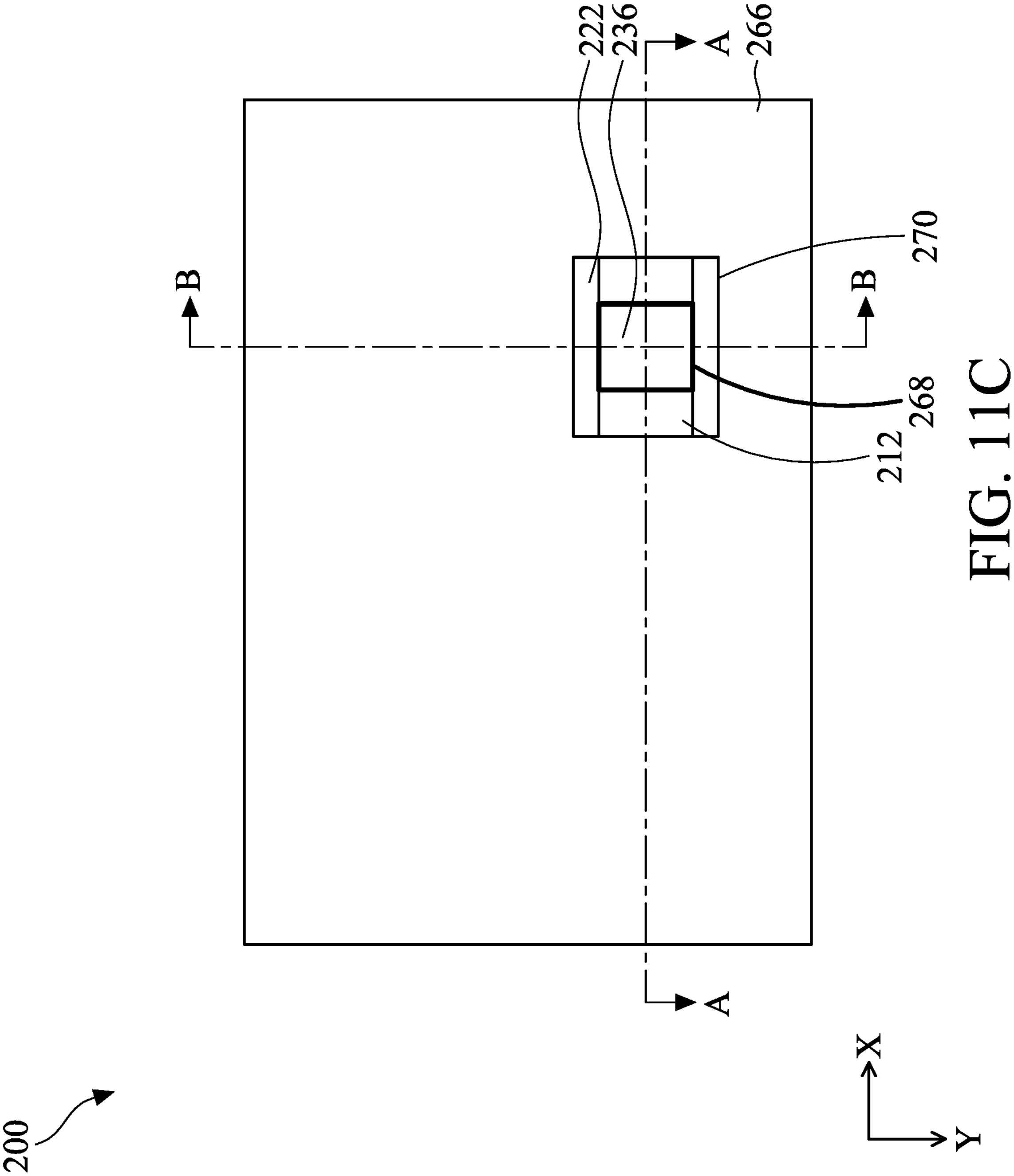

In operation 128, backside source/drain contact openings 268 are formed, as shown in FIGS. 11A-11C. FIGS. 11A-11B are schematic cross-sectional views of the semiconductor device 200, and FIG. 11C is a schematic top view of the semiconductor device 200. Particularly, FIG. 11A is a cross sectional view of the semiconductor device 200 along the line A-A, shown in FIG. 11C. FIG. 11B is a cross sectional views of the semiconductor device 200 along the line B-B in FIG. 11C.

The mask layers 256 and 266 are patterned to form openings 270 over selected source/drain regions 240 according to the circuit design. A suitable patterning process is performed to form the openings 270 through the mask layers 256 and 266. Each opening 270 exposes a source/drain buried feature 236. The openings 270 are larger than the source/drain buried feature 236, thus exposes the adjacent well portion 212 and isolation layer 222. Because the buried features 236 and the well portion 212 of the substrate 210 have high etching selectivity, the buried features 236 may be selectively removed from the well portion 212, therefore forming the backside source/drain contact openings 268 in alignment with the source/drain regions 240. During removal of the buried features 236, the flexible bottom isolation layer 238 functions as etch stop layer to protect the source/drain regions 240 from the etching chemistry. After the buried features 236 are removed, an etch process may be performed to remove the flexible bottom isolation layer 238 and expose the source/drain region 240.

Figures 12A, 12B:
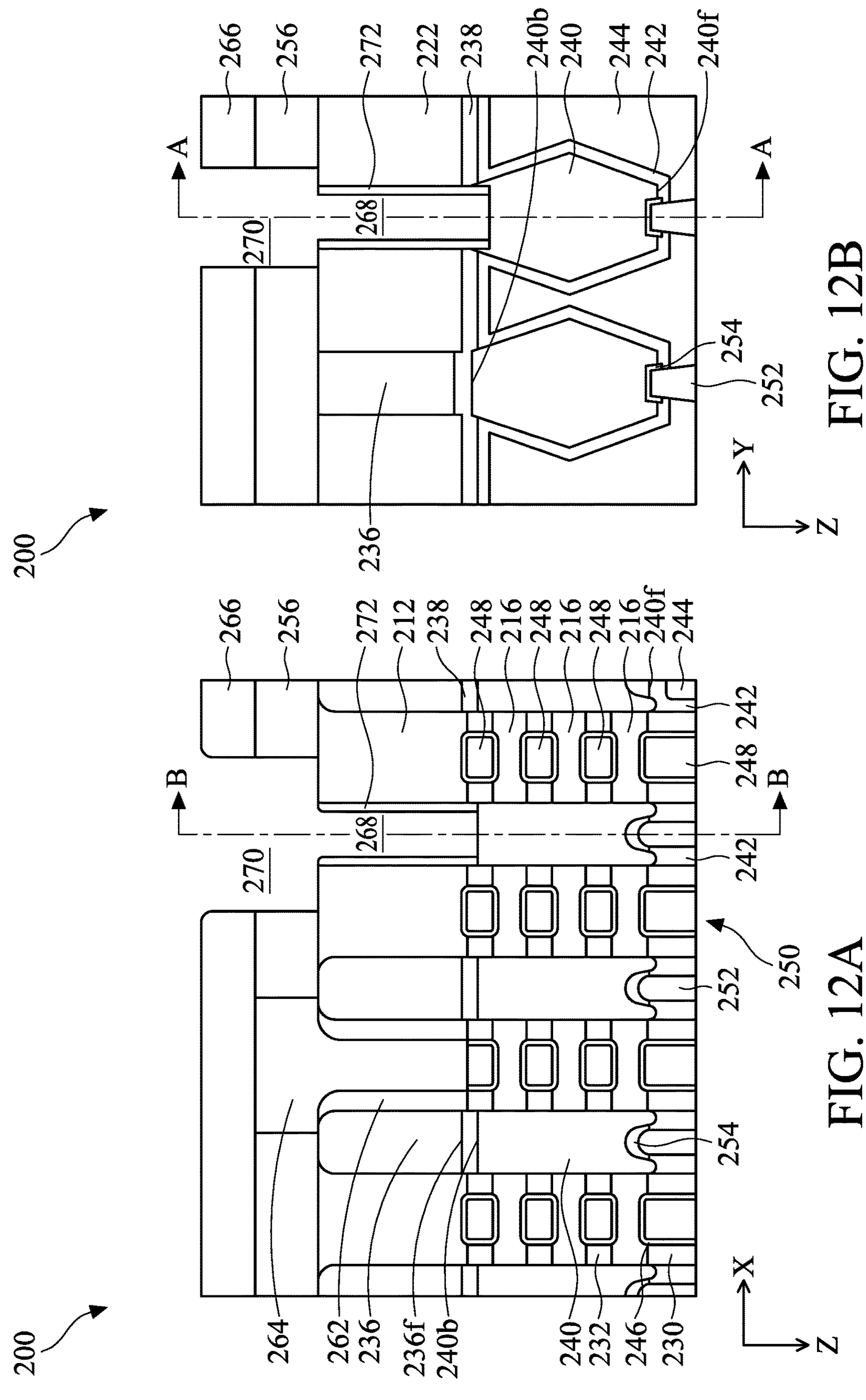
Figure 12C:
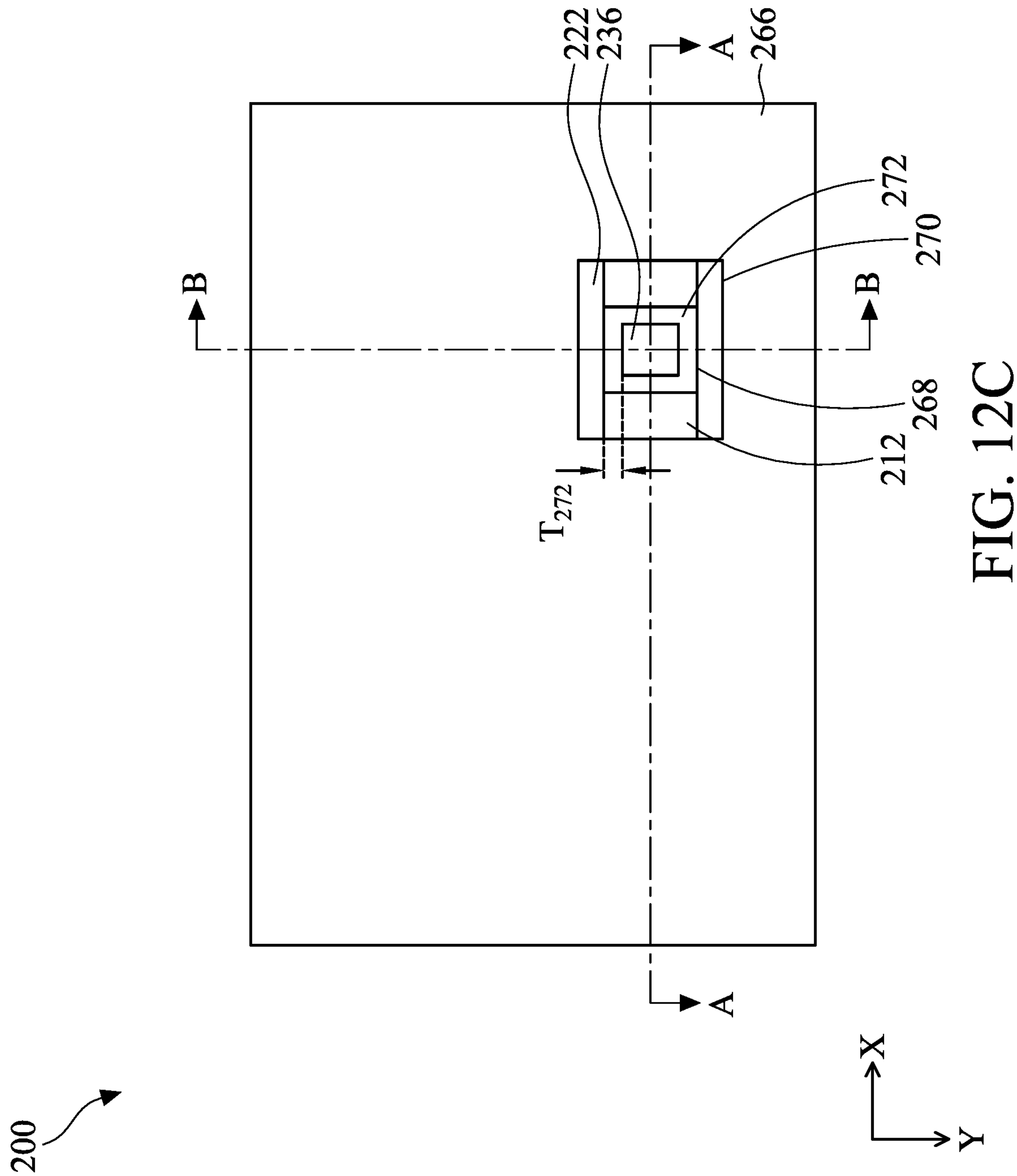

In operation 130, backside source/drain contact spacers 272 are formed on sidewalls of the backside source/drain contact openings 268, as show in FIGS. 12A-12C. FIGS. 12A-12B are schematic cross-sectional views of the semiconductor device 200, and FIG. 12C is a schematic top view of the semiconductor device 200. Particularly, FIG. 12A is a cross sectional view of the semiconductor device 200 along the line A-A, shown in FIG. 12C. FIG. 12B is a cross sectional views of the semiconductor device 200 along the line B-B in FIG. 12C.

The backside source/drain contact spacers 272 are intended to provide electrical isolation to the subsequently formed backside source/drain contacts from surrounding materials. The backside source/drain contact spacers 272 may be formed by conformally forming an insulating material followed by anisotropic etch, such as a dry etch, to remove insulating material from horizontal surfaces. The backside source/drain contact spacers 272 may have a thickness $T_{272}$ in a range between about 0 nm and about 8 nm. In some embodiments, the insulating material of the backside source/drain contact spacers 272 may be a low-k dielectric material comprising Si, O, C, N, and air gap. For example, the backside source/drain contact spacers 272 may include SiO, SiN, SION, SiOCN, SiCN, or combinations thereof.

As shown in FIGS. 12A-12C, the backside source/drain contact spacers 272 are in contact with the well portions 212 along to sidewalls and with the isolation layer 222 and the flexible bottom isolation layer 238 along two other sidewalls. The backside source/drain contact spacers 272 are in contact with the bottom most inner spacer 232*l* near the bottom of the backside source/drain contact openings 268.

Figure 13B:
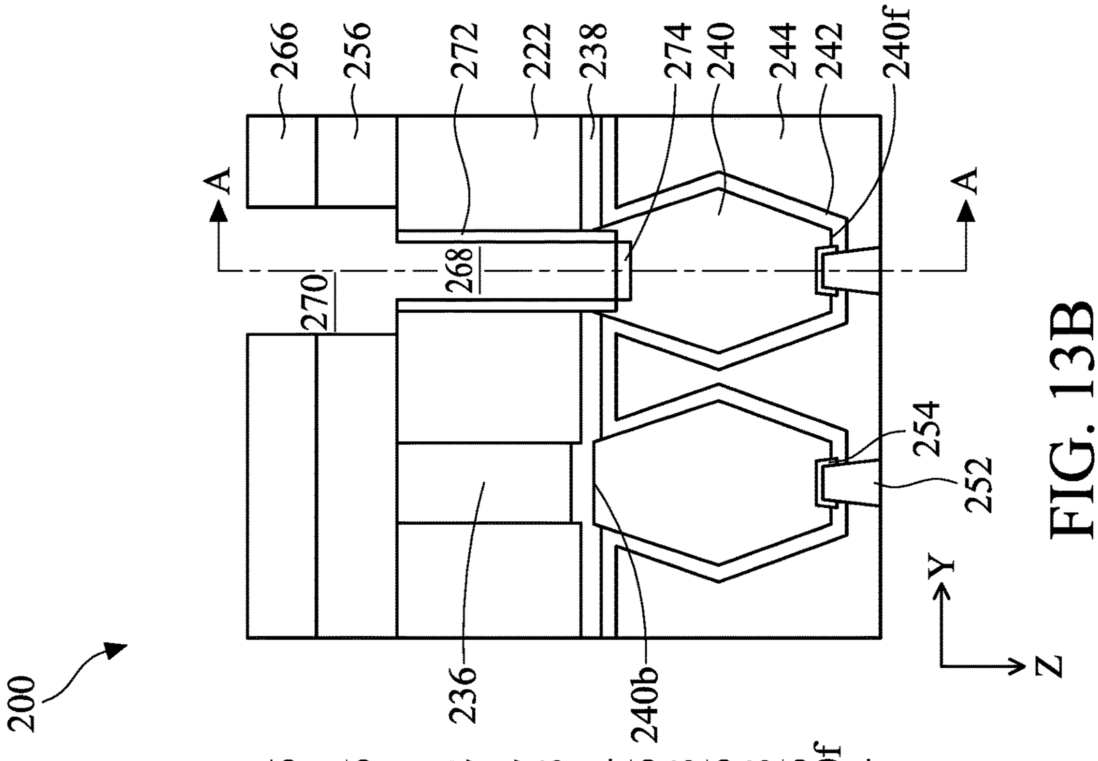
Figure 13A:
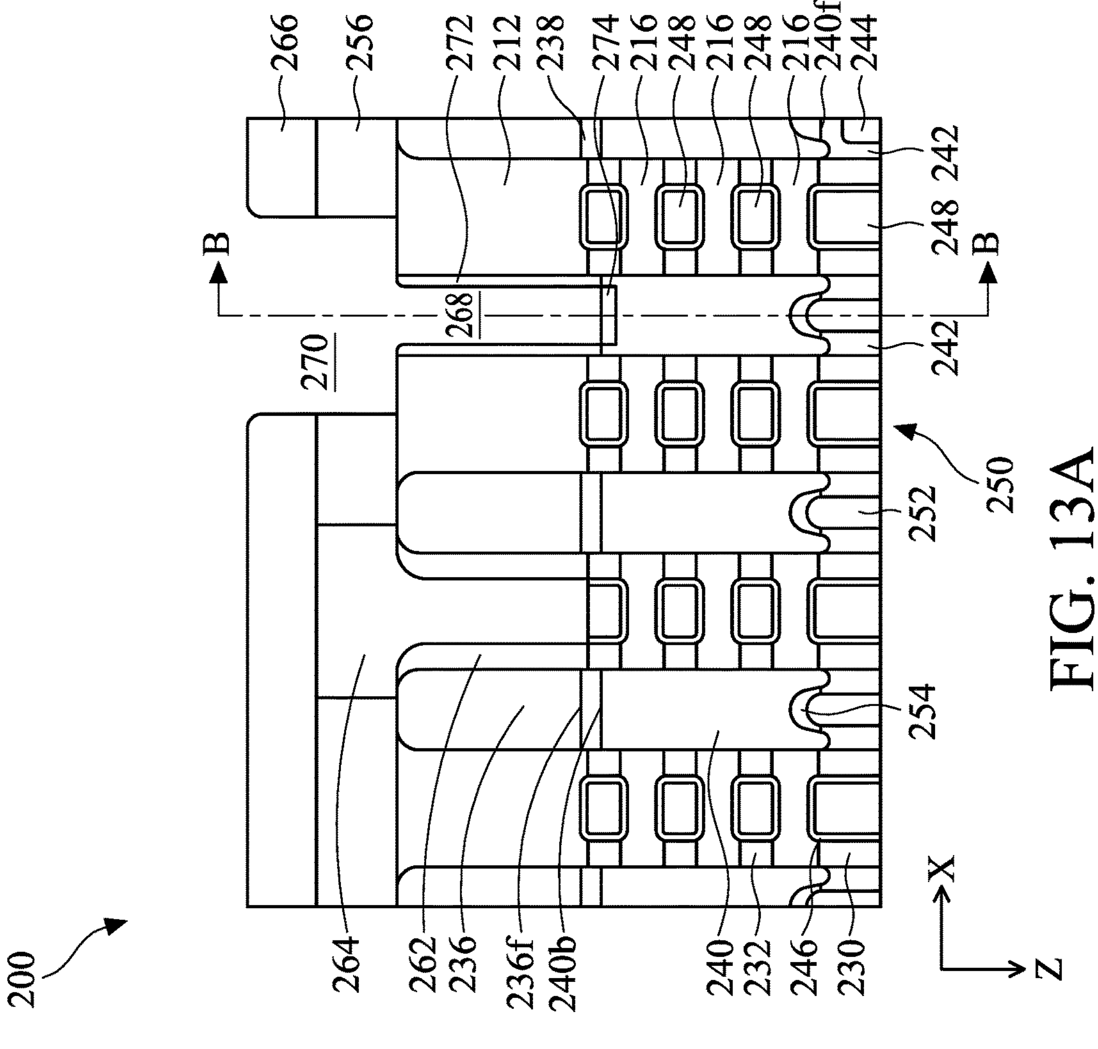

In operation 132, a silicide layer 274 is formed over the exposed source/drain region 240, as shown in FIGS. 13A-13B. FIGS. 13A-13B are schematic cross-sectional views of the semiconductor device 200. FIG. 13A is a cross sectional view of the semiconductor device 200 along the line A-A in FIG. 13B. FIG. 13B is a cross sectional view of the semiconductor device 200 along the line B-B in FIG. 13A.

In some embodiments, a preclean process may be performed using a plasma process. After preclean, a metal source layer may be formed on surfaces of the exposed source/drain region 240. The metal source layer may include W, Co, Ni, Ti, Mo, and Ta, or a metal nitride layer selected from tungsten nitride, cobalt nitride, nickel nitride, titanium nitride, molybdenum nitride, and tantalum nitride. The deposition of the metal source layer is followed by a rapid thermal annealing process at a temperature to form a silicide layer 274 on the exposed surface of the epitaxial source/drain regions 240. In some embodiments, the silicide layer 274 includes one or more of WSi, CoSi, NiSi, TiSi, MoSi, and TaSi. In some embodiments, the silicide layer 274 has a thickness in a range between about 4 nm and 10 nm, for example between 5 nm and 6 nm.

Figure 14A:
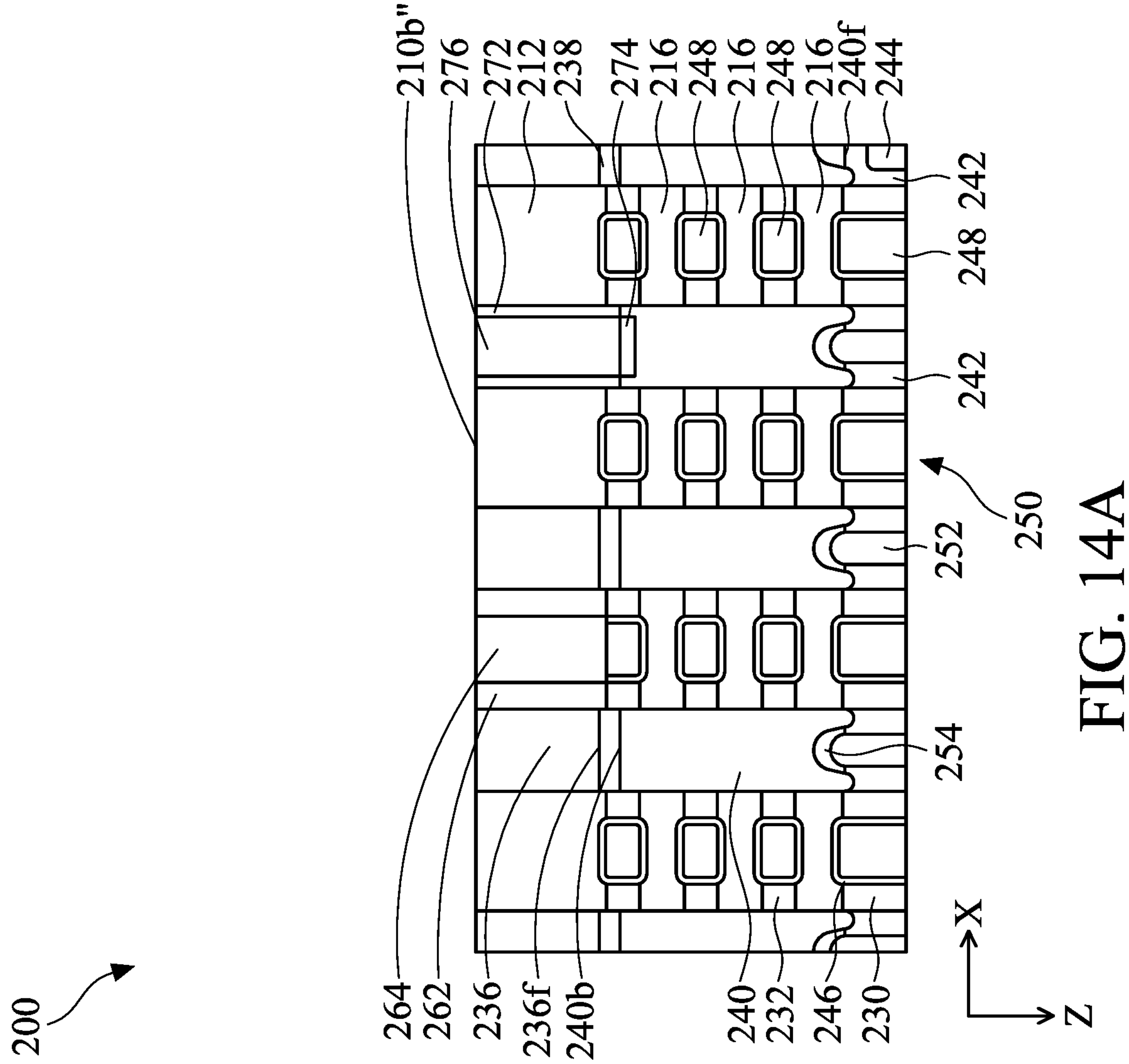
Figure 14C:
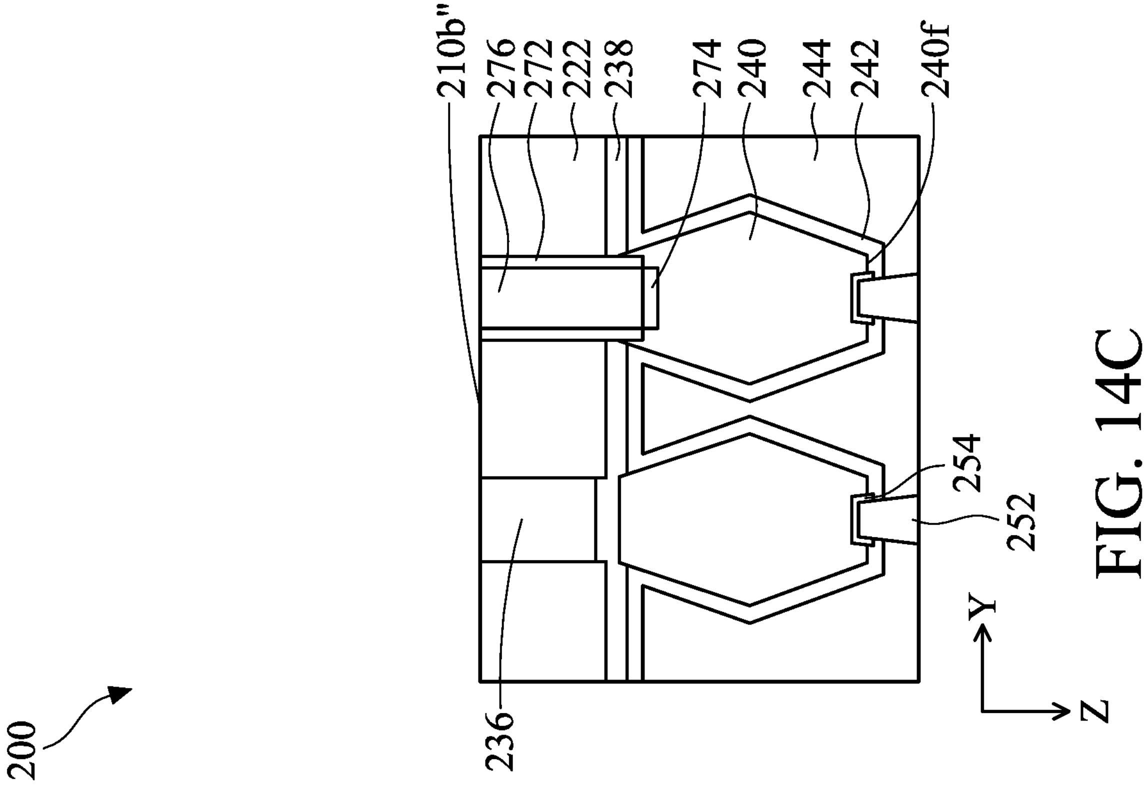
Figure 14B:
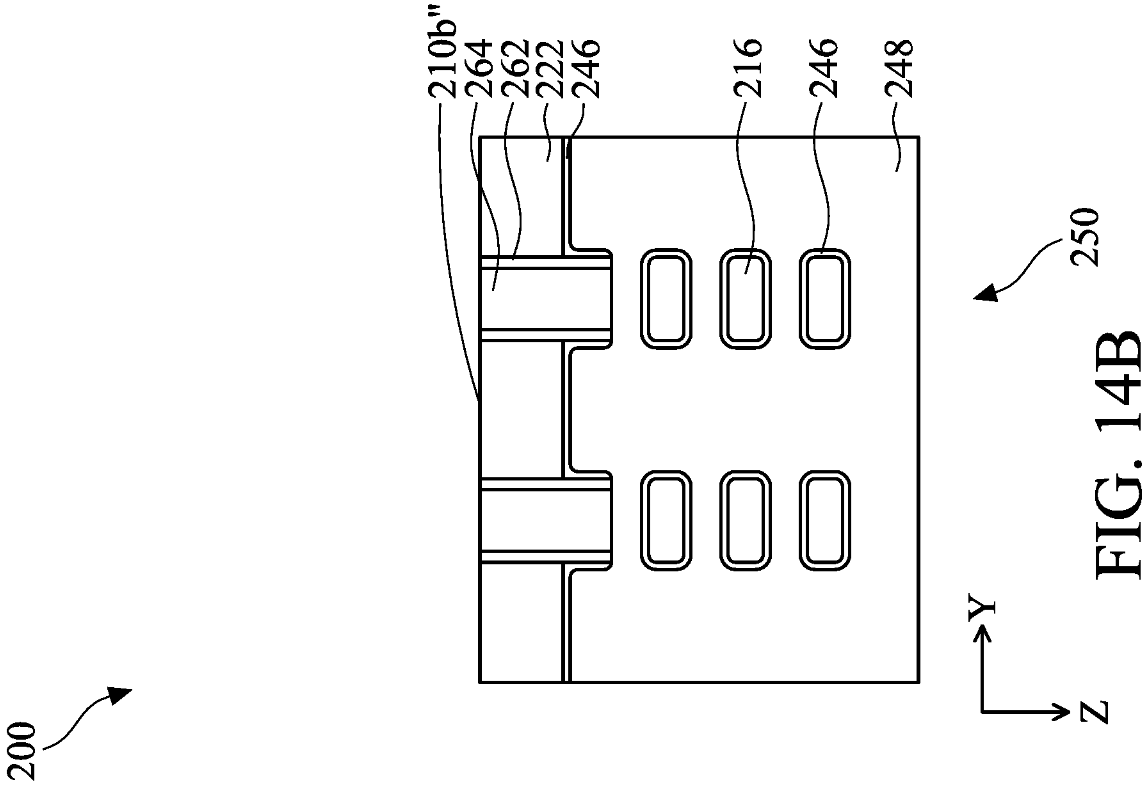
Figure 14D:
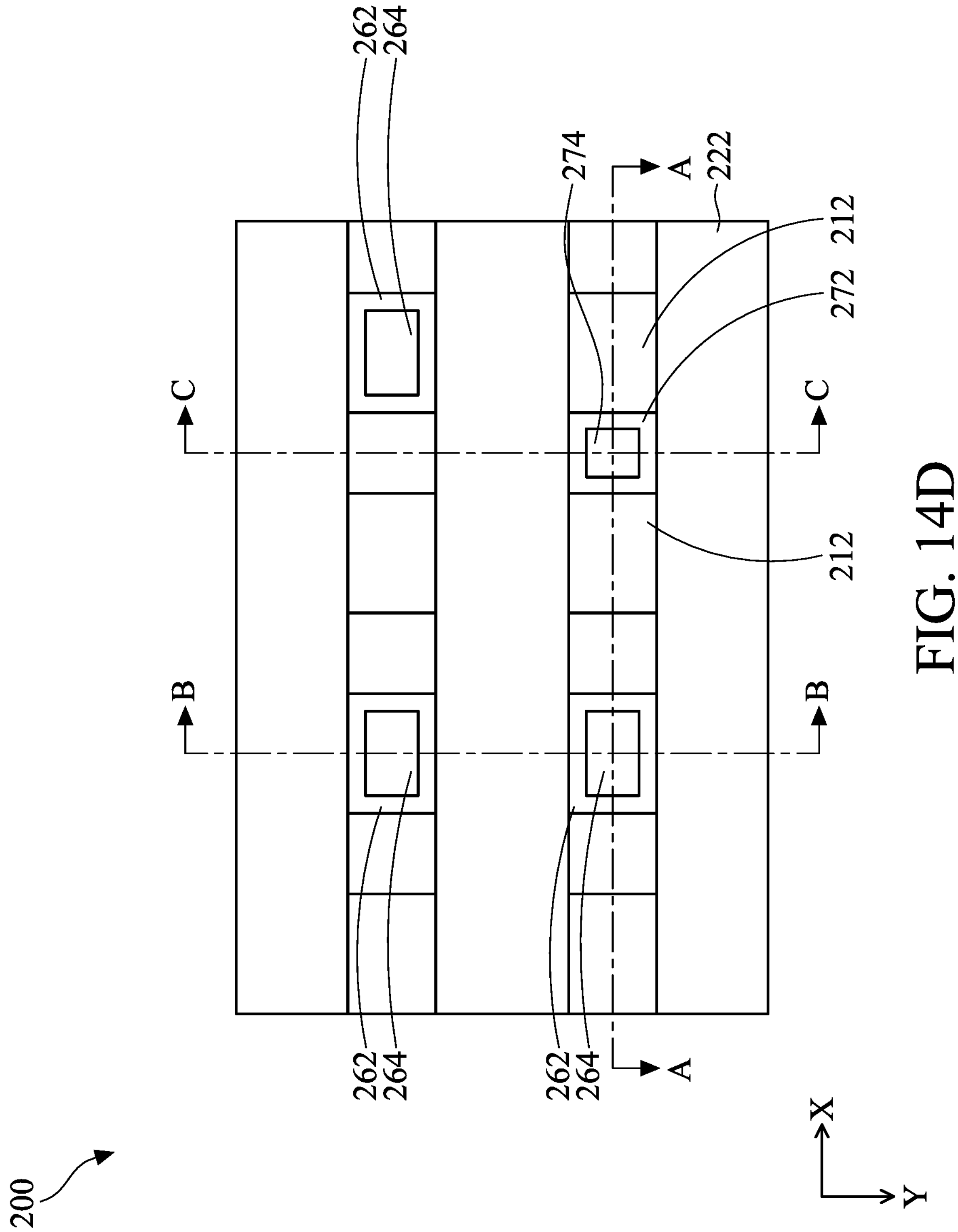

In operation 134, backside source/drain contacts 276 are formed in the backside source/drain contact openings 268, as shown in FIGS. 14A-14D. FIGS. 14A-14C are schematic cross-sectional views of the semiconductor device 200, and FIG. 14D is a schematic top view of the semiconductor device 200. Particularly, FIGS. 14A, 14B, 14C are cross sectional views of the semiconductor device 200 along the lines A-A, B-B, C-C in FIG. 14D.

The backside source/drain contacts 276 may be formed by filling a conductive material in the source/drain contact openings 268. As shown in FIGS. 14A and 14B, the backside source/drain contacts 276 are in electrical connection with the source/drain region 240 via the silicide layer 274. The conductive material may be a metal, such as Ti, W, Ru, Mo, Co, Al, Cu, or compounds thereof. In some embodiments, the conductive material is filled in the contact holes by CVD, ALD, electro-plating, or other suitable method.

After deposition of the backside source/drain contacts 276, a planarization process, such as CMP, may be performed to expose the isolation layer 222. The mask layers 256, 266 are removed from the CMP process resulting in a back surface 210*b*". As shown in FIG. 14D, the back surface 210*b*" includes the isolation layer 222 enclosing fin areas, which correspond to the fin structures 220. The fin areas include the backside gate contacts 264, the spacers 262, the backside source/drain contact 274, the spacers 272, the buried features 236, and the well portions 212.

Figure 15A:
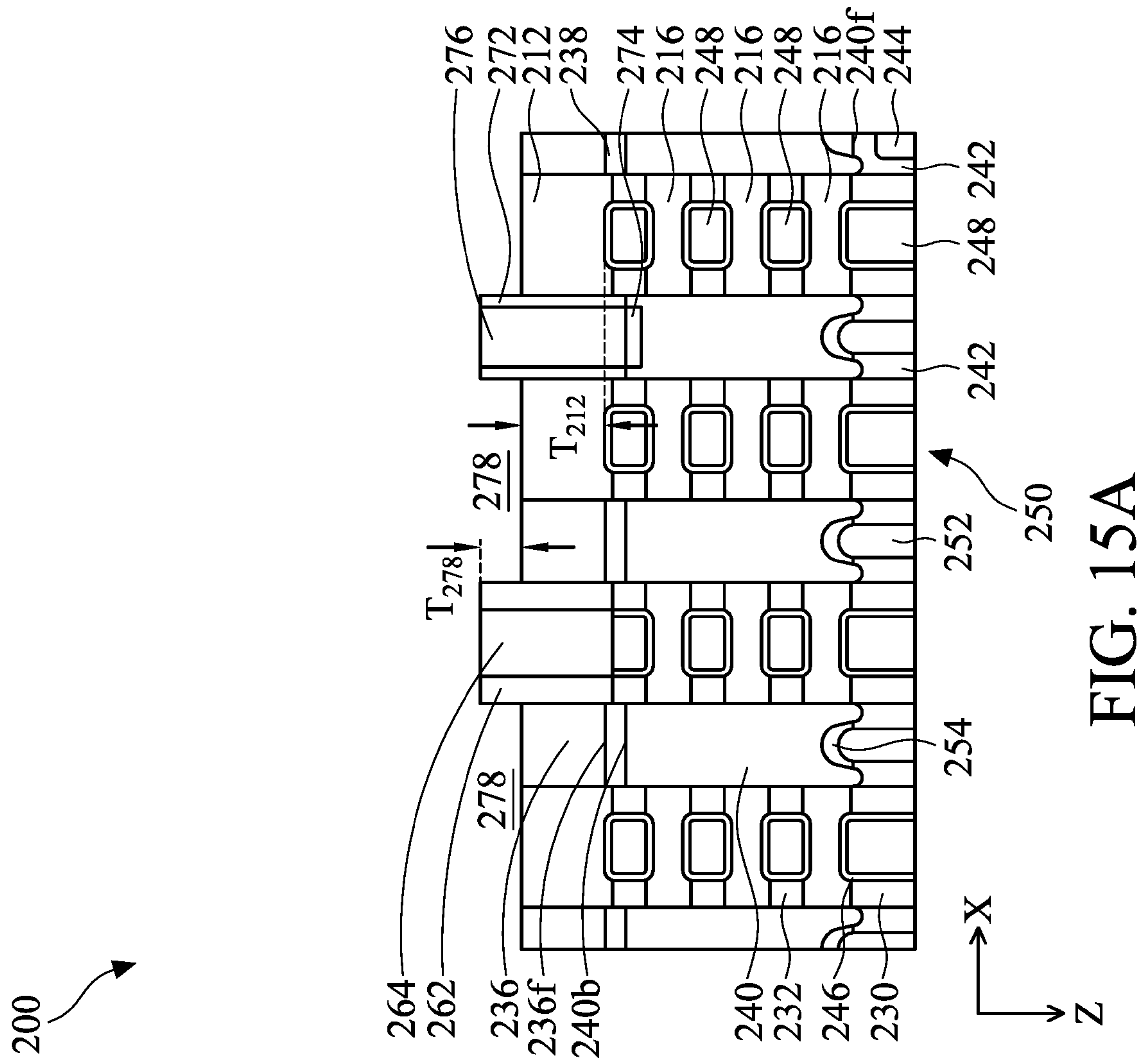
Figure 15B:
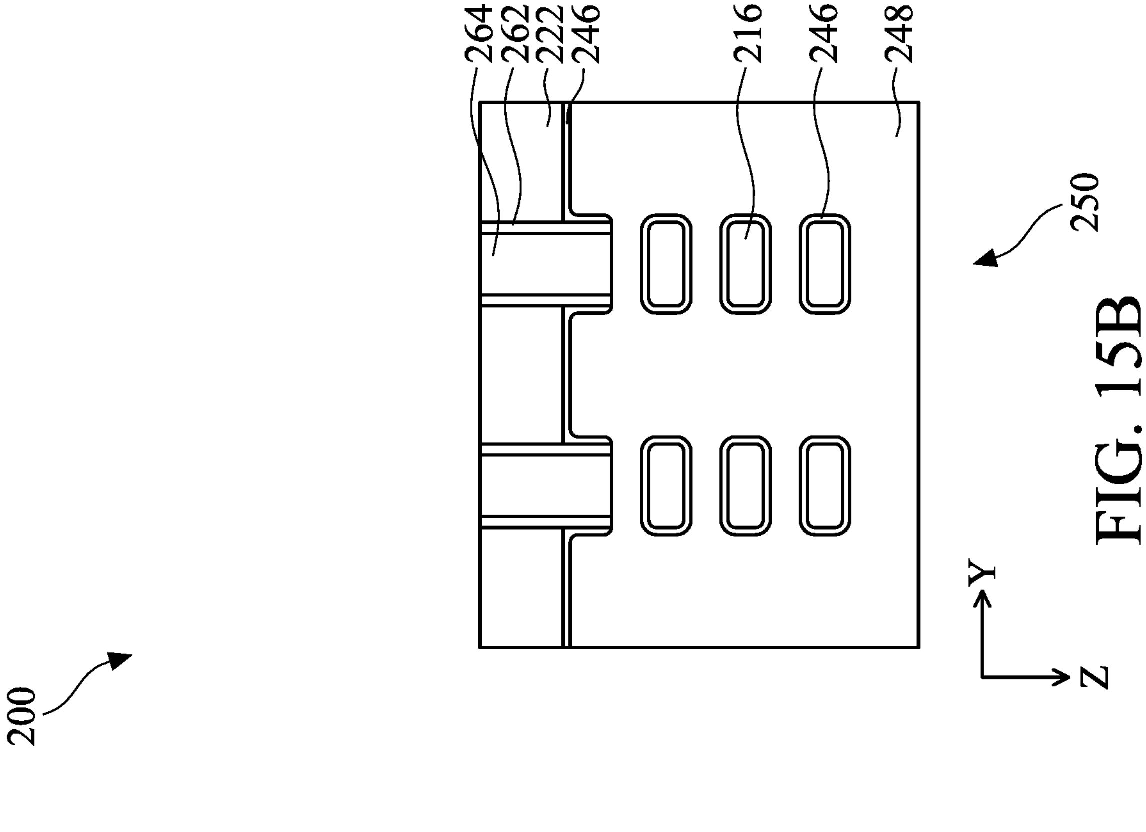
Figure 15C:
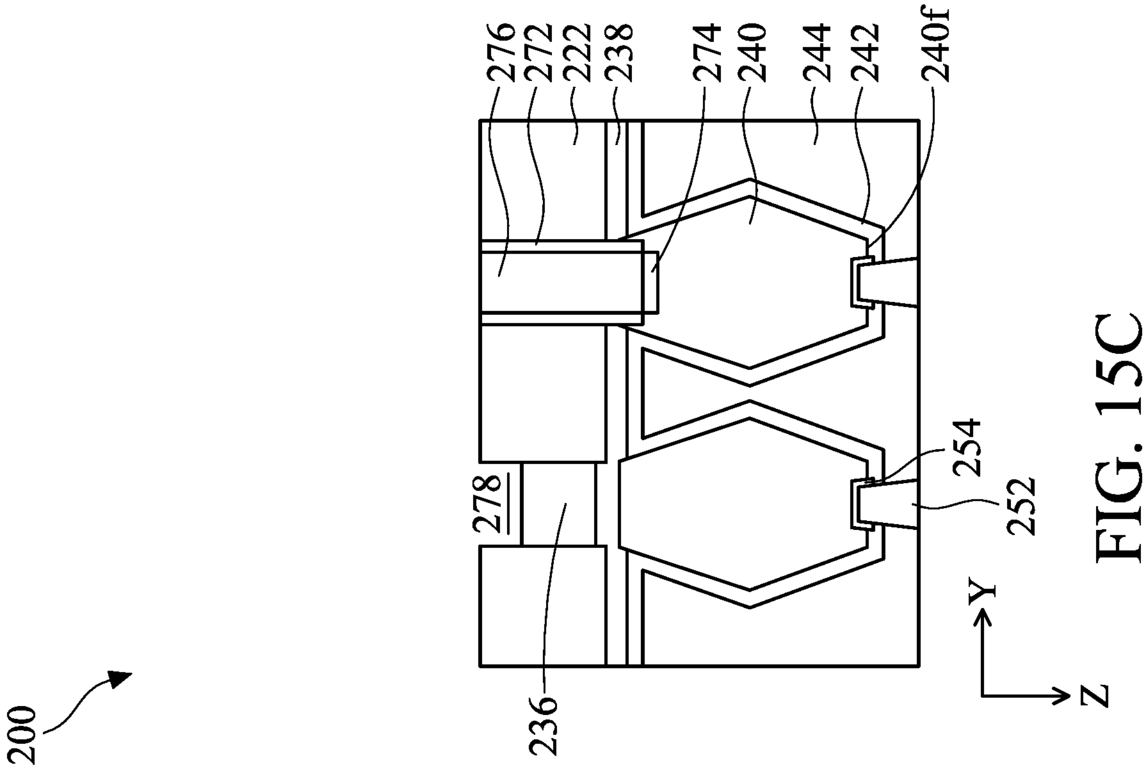

In operation 136, an etch back operation is performed to recess the semiconductor material exposed on the back surface 210*b*", as shown in FIGS. 15A-15C. FIGS. 15A-15C are schematic cross-sectional views of the semiconductor device 200.

One or more etch processes may be performed to recess the semiconductor material, i.e., the buried features 236, and the well portions 212. Cavities 278 are formed in the fin areas. In some embodiments, the semiconductor material is recessed for a thickness $T_{278}$ in a range between 10 nm and about 30 nm, for example about 20 nm. The semiconductor material is removed to have the cavities 278 deep enough for a dielectric plug sufficient to provide isolation between the remaining semiconductor material and the subsequently formed conductive layer. In some embodiments, the remaining semiconductor material, such as the buried features 236 and the well portions 212, have a thickness $T_{212}$ in a range between about 0 nm and about 50 nm. In some embodiments, the buried features 236 and the well portions 212 may be completely removed.

Figure 16A:
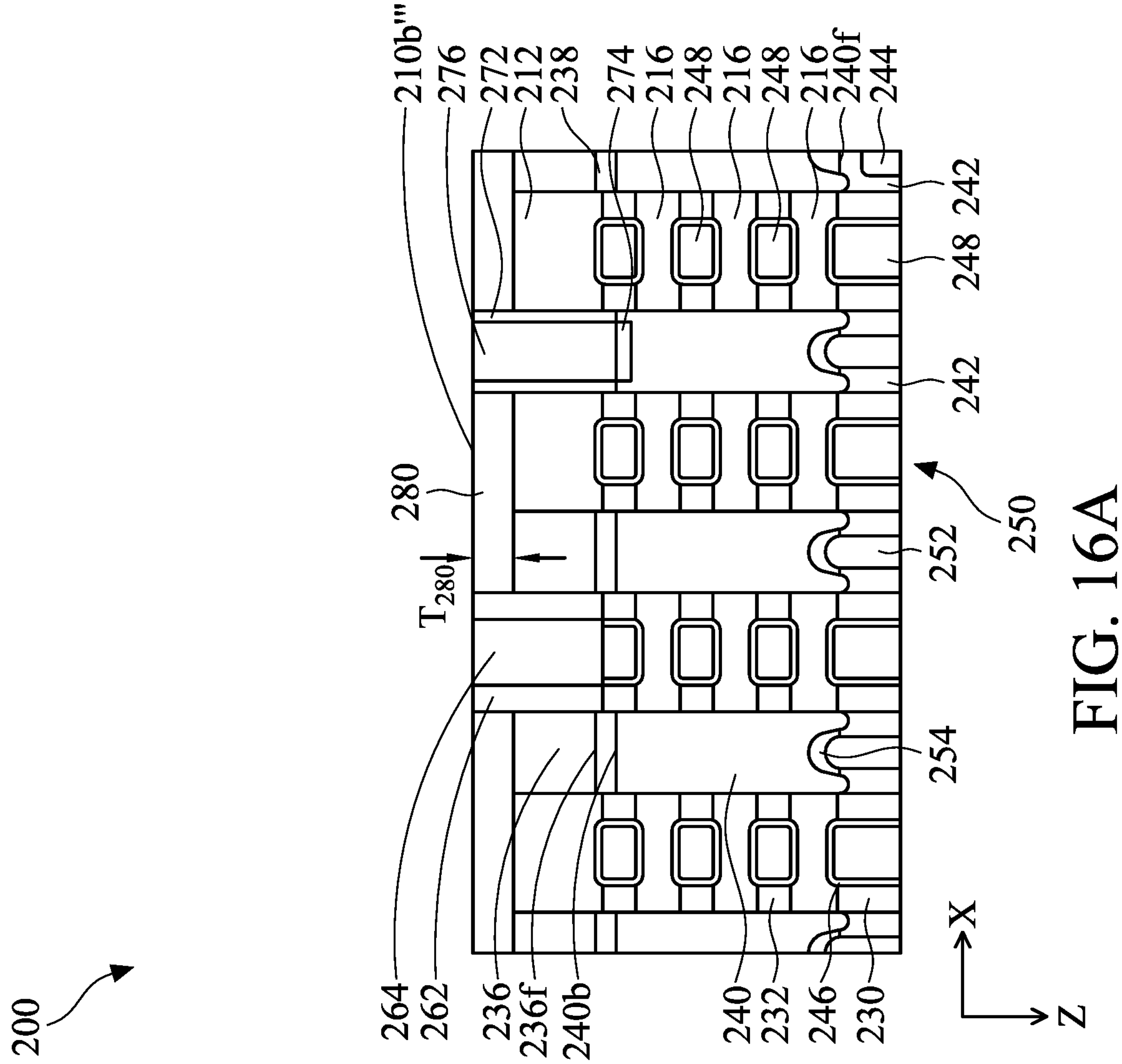
Figure 16C:
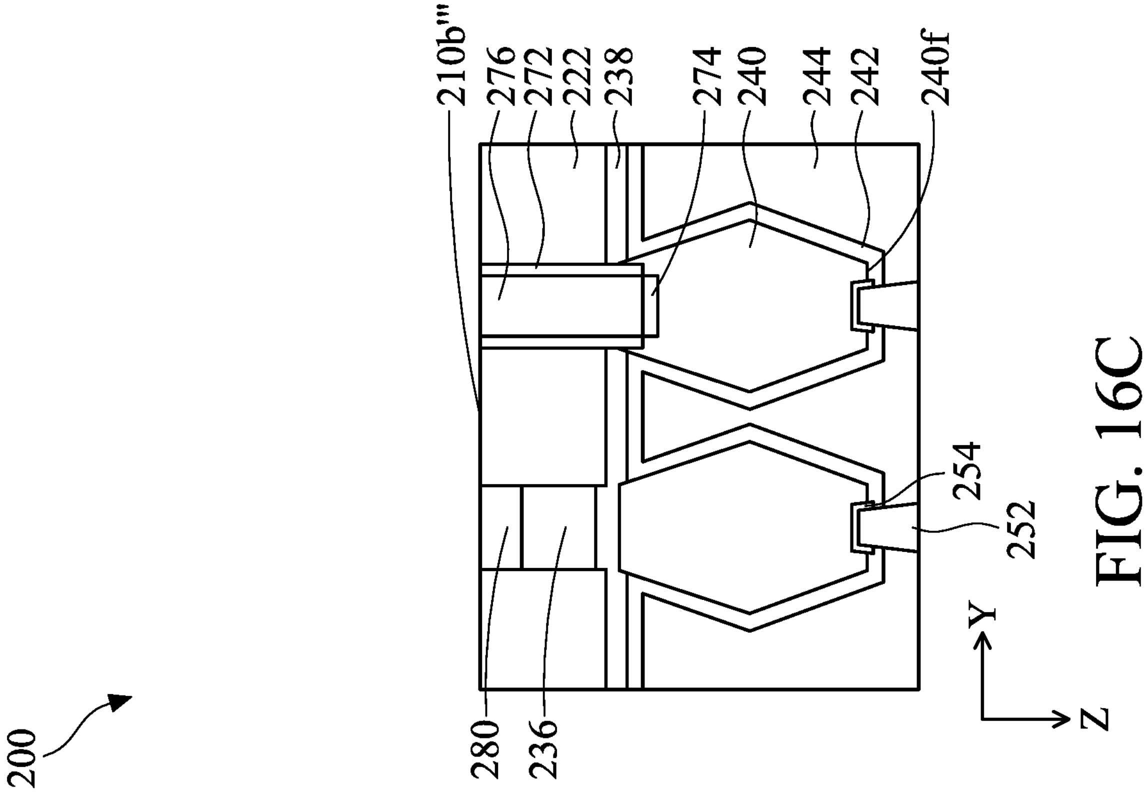
Figure 16B:
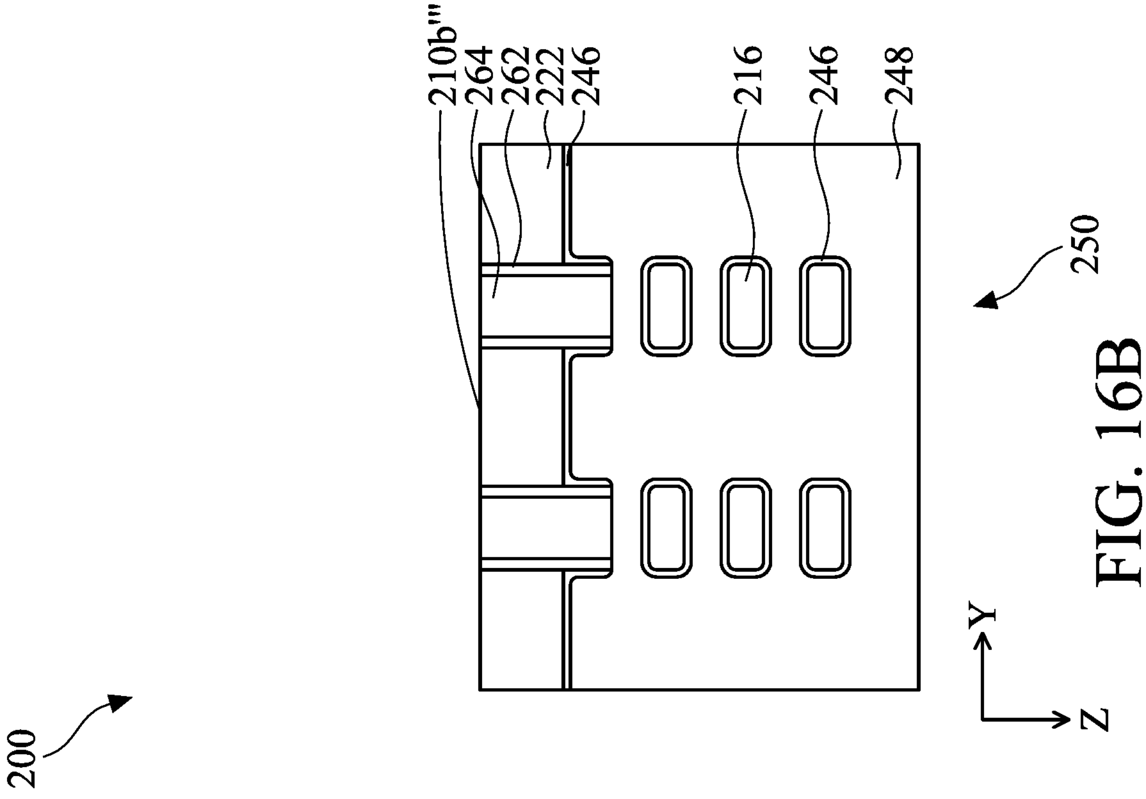
Figure 16D:
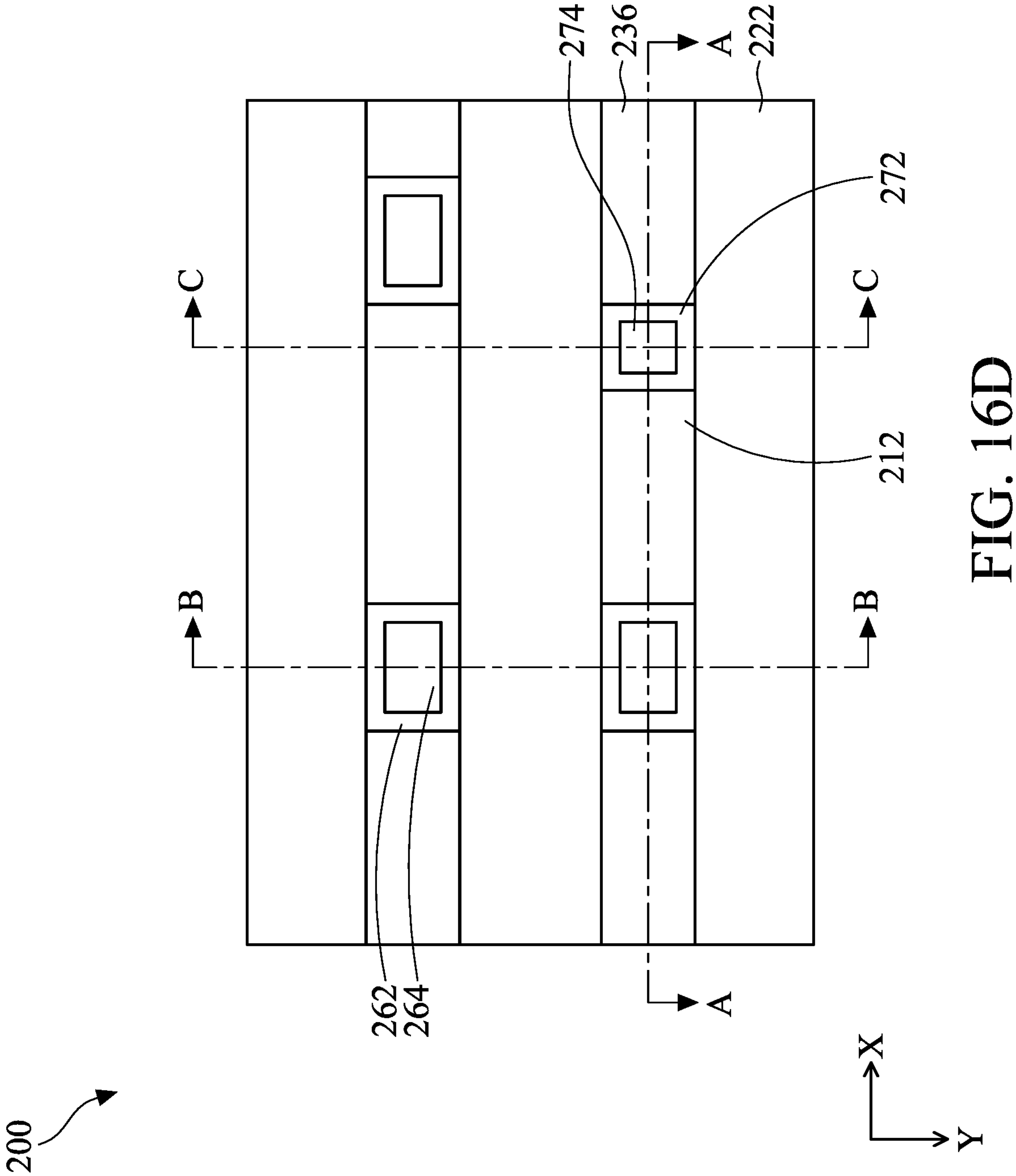

In operation 138, dielectric caps 280 are formed in the cavities 278, as shown in FIGS. 16A-16D. FIGS. 16A-16C are schematic cross-sectional views of the semiconductor device 200, and FIG. 16D is a schematic top view of the semiconductor device 200. Particularly, FIGS. 16A, 16B, 16C are cross sectional views of the semiconductor device 200 along the lines A-A, B-B, C-C in FIG. 17D.

The dielectric caps 280 may be formed by filling the cavities 278 with suitable dielectric material followed by a CMP process. The dielectric caps 280 may have a thickness $T_{280}$ in a range between 10 nm and about 30 nm, for example about 20 nm. After operation 138, the semiconductor device 200 has a back surface 212*b*" include conductive vias, i.e., the backside gate contacts 264 and the backside source/drain contacts 276, surrounded by dielectric material.

Figure 17A:
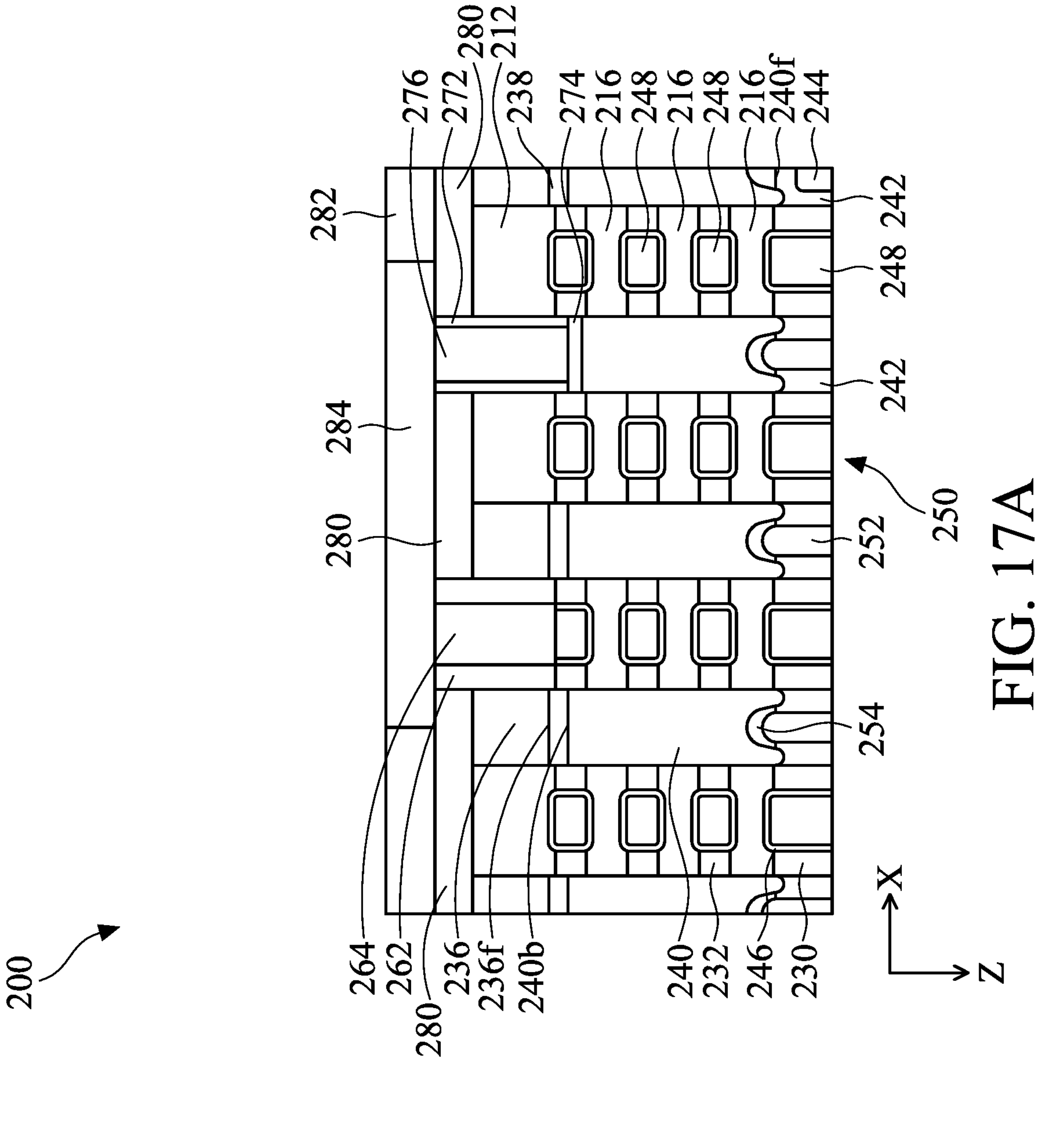
Figure 17C:
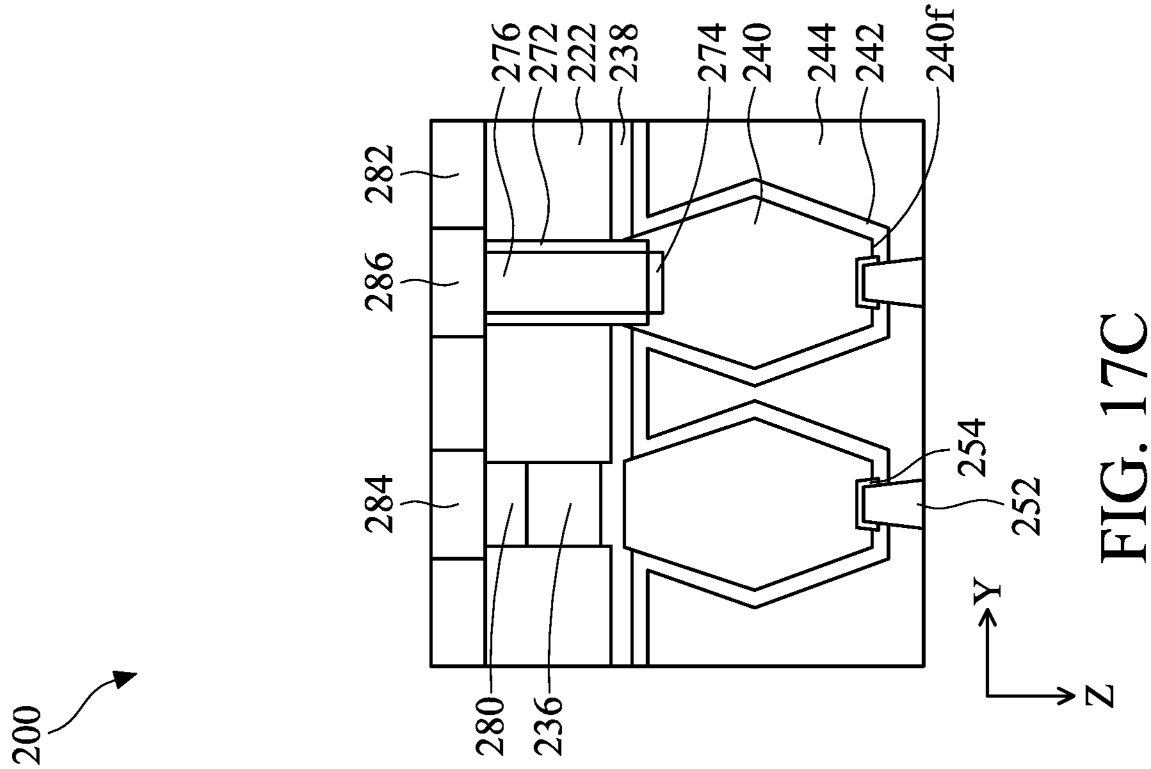
Figure 17B:
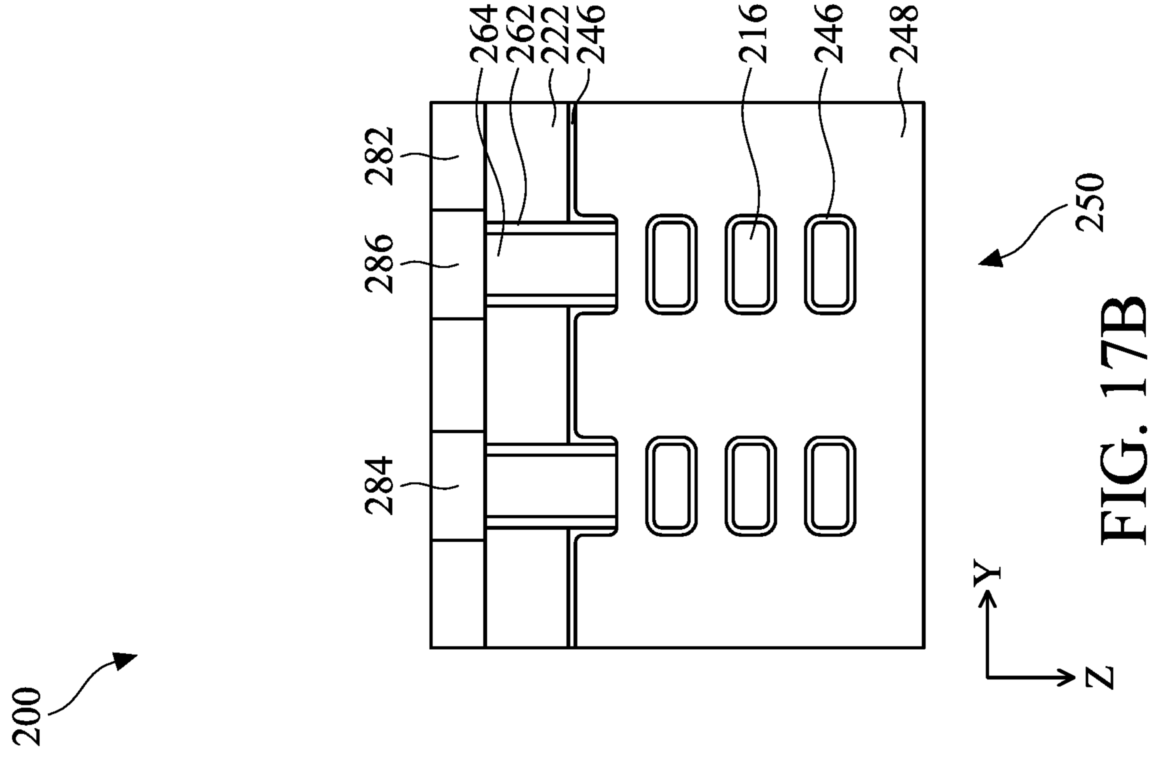
Figure 17D:
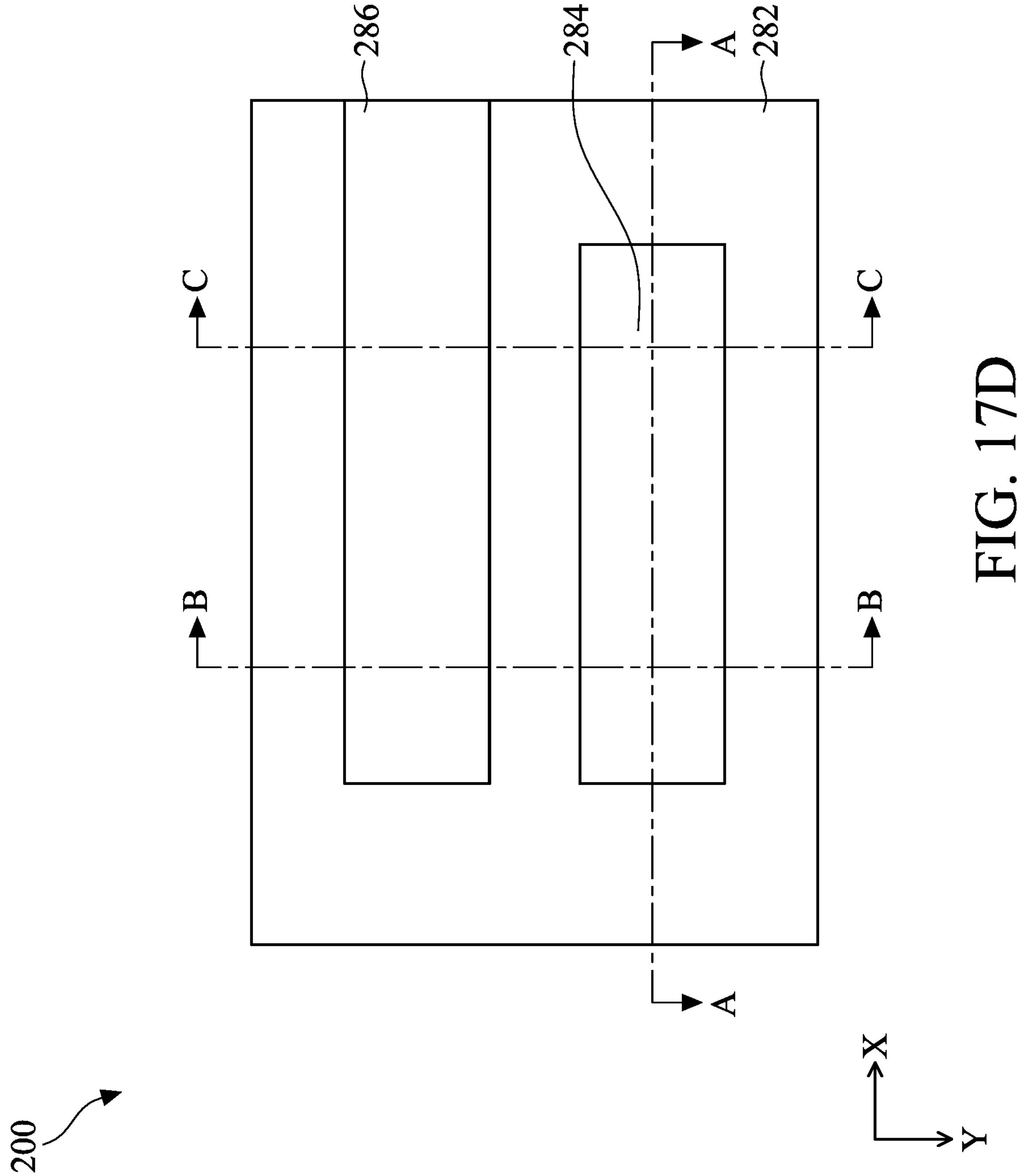

In operation 140, a backside interconnect structure is formed to the backside gate contacts 264 and the backside source/drain contact 276, as shown in FIG. 17A-17D. FIGS. 17A-17C are schematic cross-sectional views of the semiconductor device 200, and FIG. 17D is a schematic top view of the semiconductor device 200. Particularly, FIGS. 17A, 17B, 17C are cross sectional views of the semiconductor device 200 along the lines A-A, B-B, C-C in FIG. 17D.

In FIGS. 17A-17D, a backside IMD layer is formed over the back surface 212*b*'". The backside IMD layer includes conductive lines 284, 286 embedded in an interlayer dielectric layer 282. The backside IMD layer may be formed in any suitable process, such as a damascene process. In the example of FIGS. 17A-17D, the conductive lines 284, 286 extend along the direction of the semiconductor fins 220. The conductive line 284 provides local signal connection by connecting a source/drain region 240 to a gate electrode layer 248. The conductive line 286 provides common signal input by connecting the gate electrode layer 248 in two or more gate structures 250 together.

It should be noted that FIGS. 17A-17D only includes exemplary backside connections for the backside gate contacts 264 and the backside source/drain contacts 276. Different connections, such as power rail or other signal input or output lines, may be formed in the IMD layer. In some embodiments, additional IMD layers may be formed over the ILD layer 282 with conductive vias and lines to achieve various connections according to circuit design. In other embodiments, the semiconductor device 200 may include through silicon vias (TSVs) to connect the backside conductive lines 284, 286 with the front side interconnect structure.

Figure 18A:
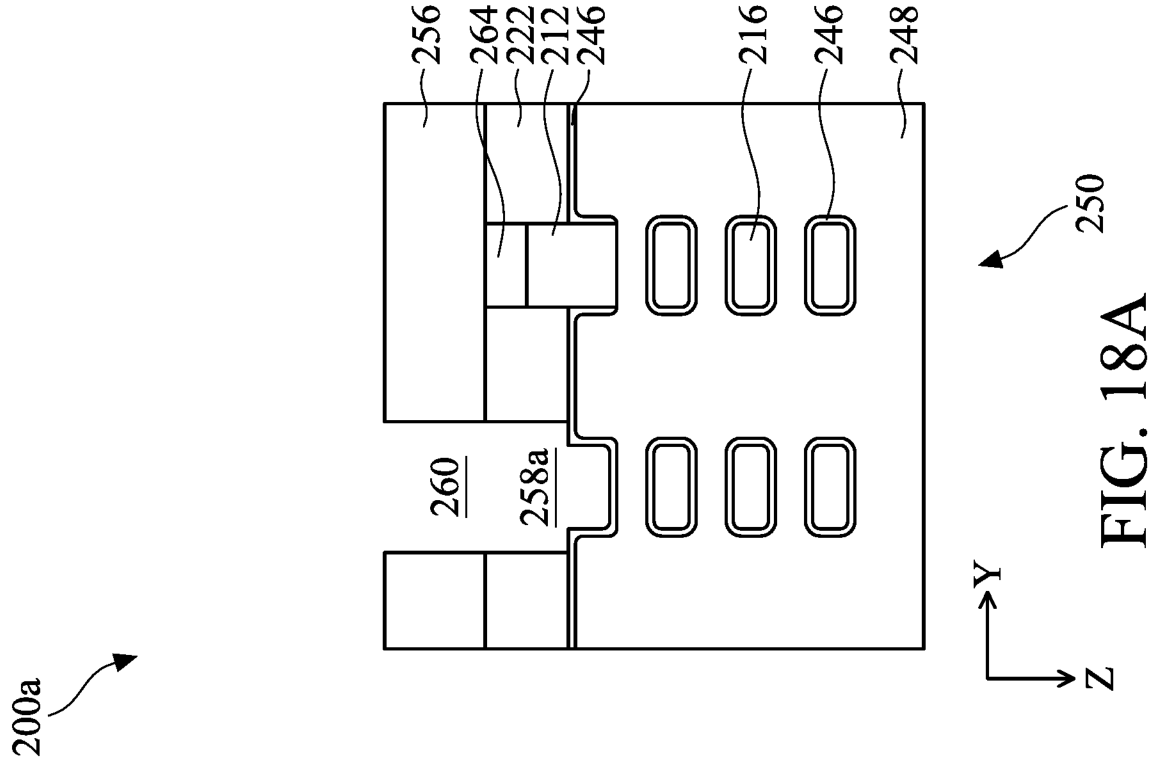
FIGS. 18A-18B, 19A-19C, 20A-20G, 21A-21C, 22, and 23 schematically illustrate various semiconductor devices according to embodiments of the present disclosure.
Figure 18B:
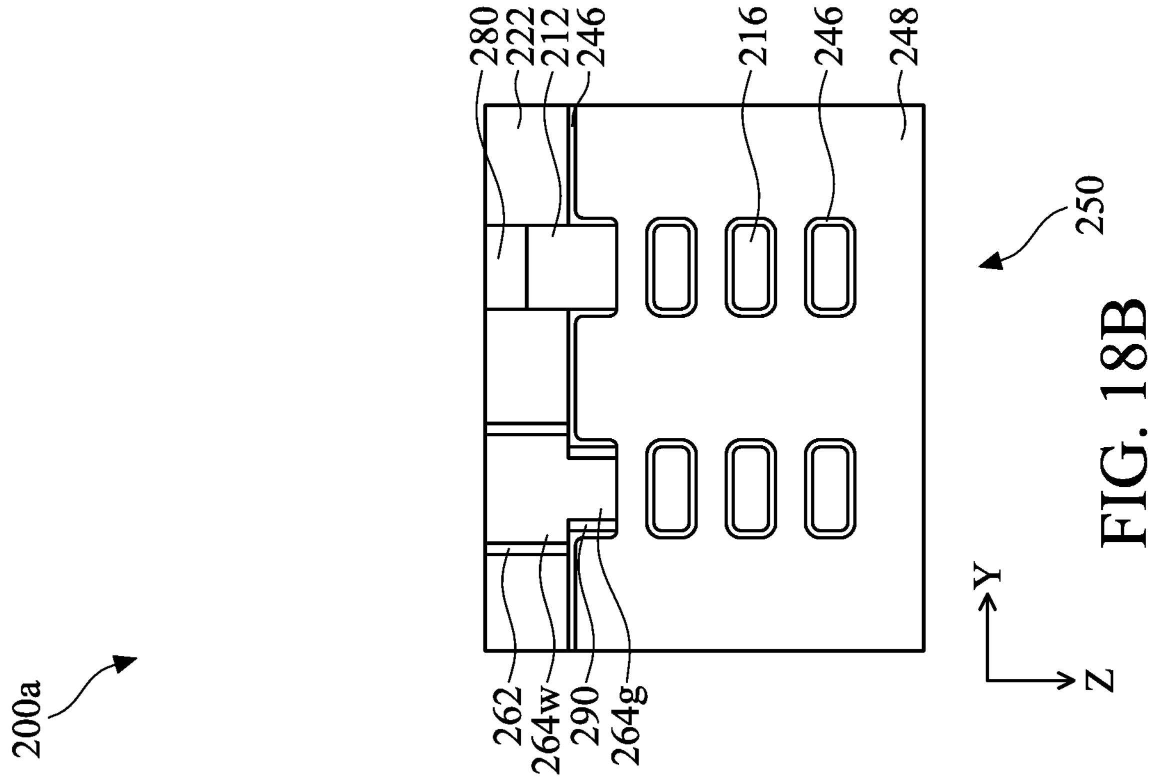

FIGS. 18A and 18B schematically demonstrate a semiconductor device 200*a* according to embodiments of the present disclosure. The semiconductor device 200*a* is substantially similar to the semiconductor device 200 except that the semiconductor device 200*a* includes a backside gate contact 264*a* having a step 290 in the profile in the y-x plane. The step 290 is a result of patterning the isolation layer 222 during formation of backside gate contact openings. The semiconductor device 200*a* may be fabricated according to the method 100. In operation 120, the isolation layer 222 is also etched using the opening 260 in the mask layer 256 as shown in FIG. 18A, which is a cross sectional view of the semiconductor device 200*a* after operation 120. FIG. 18B is a schematic cross-sectional view of the semiconductor device 200*a* after operation 136. As shown in FIG. 18B, the backside gate contacts 264*a* includes a gate portion 264*g* and a well portion 264*w*. The gate portion 264*g* is narrower than the well portion 264*w* along the y direction resulting the step 290. The wider well portion 264*w* provides an increased the contact surface with subsequent interconnect features, therefore reducing contact resistance.

Figure 19A:
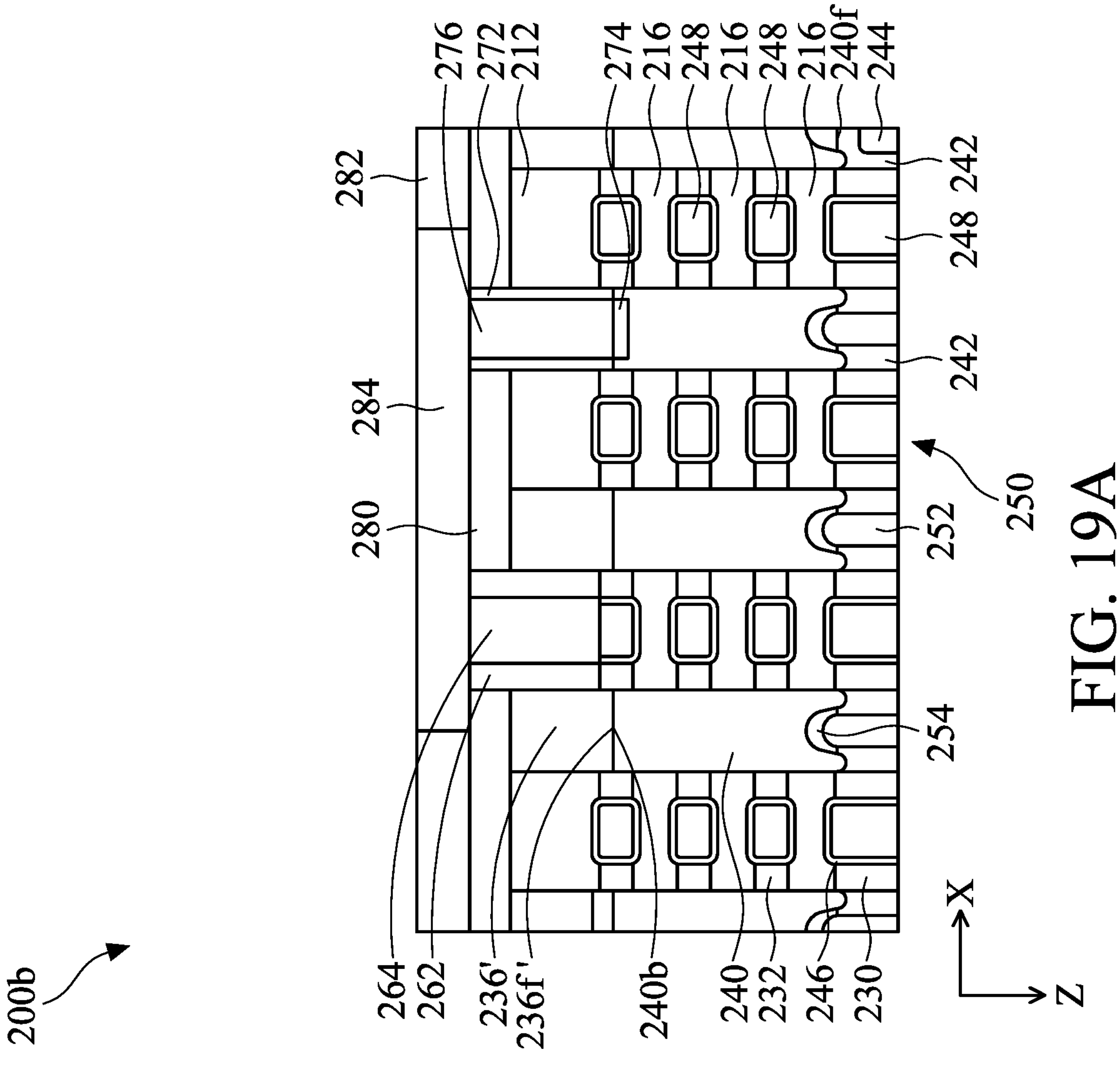
Figure 19B:
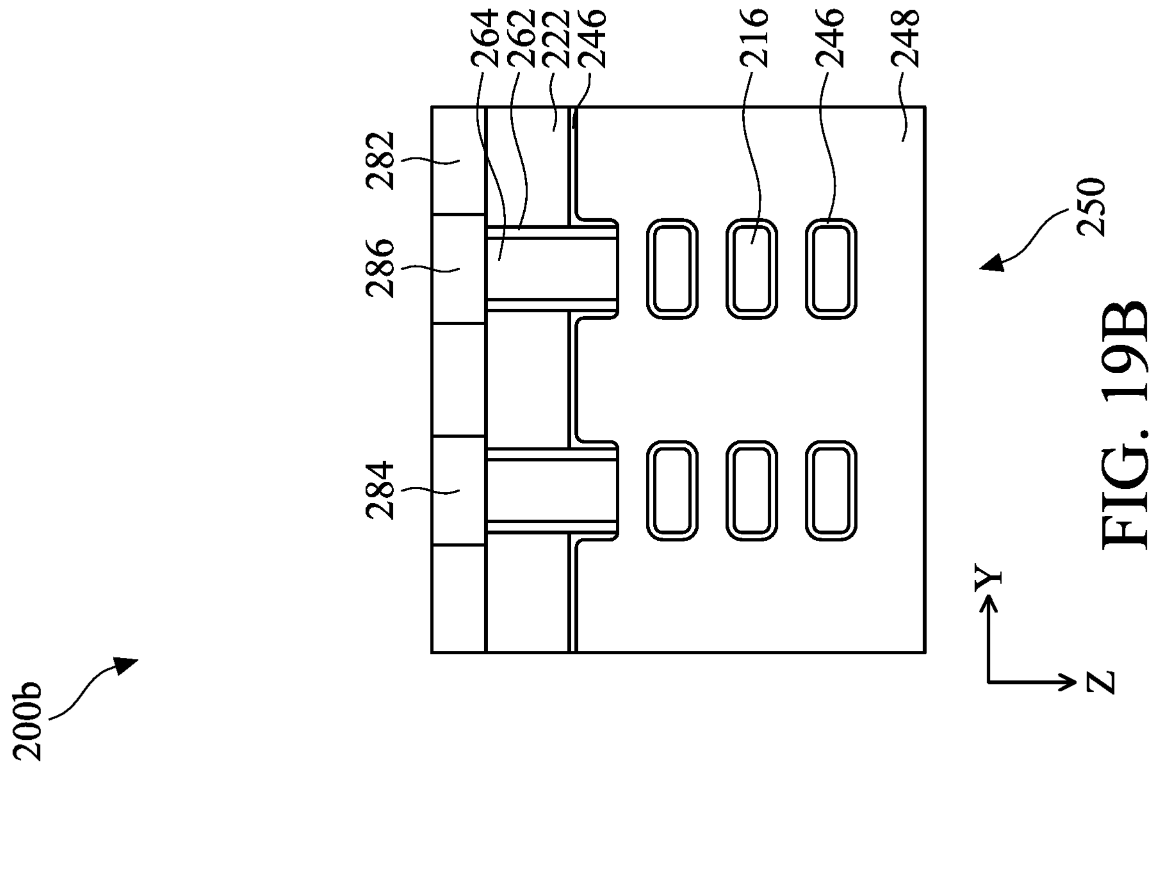
Figure 19C:
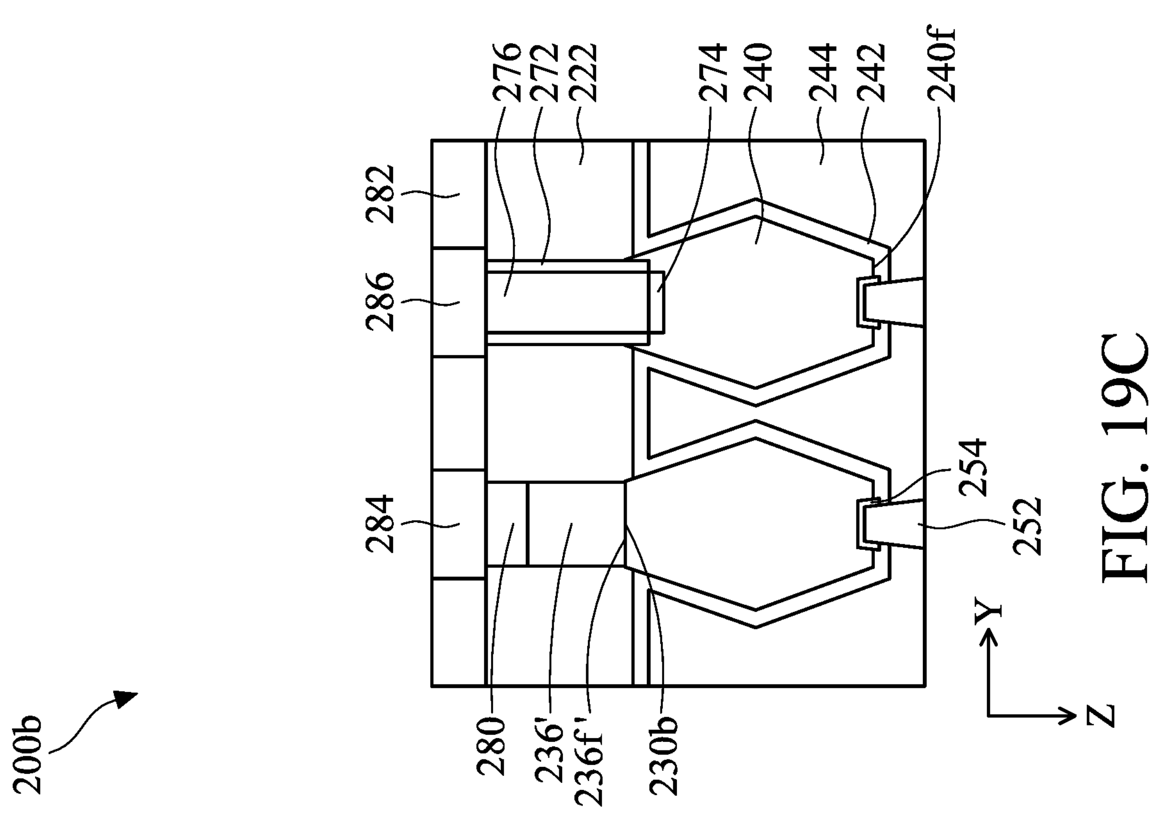

FIGS. 19A-19C schematically demonstrates a semiconductor device 200*b* according to embodiments of the present disclosure. The semiconductor device 200*b* is substantially similar to the semiconductor device 200 except that the semiconductor device 200*b* does not include the flexible bottom isolation layer 238. In some embodiments, the semiconductor device 200*b* includes buried features 236' formed from a dielectric material which provide isolation to the source/drain regions 240. The semiconductor device 200*b* may be fabricated according to the method 100. In operation 106, the buried features 236' are formed from one or more dielectric material, for example, the buried features 236' may include a dielectric material, such as silicon oxide, silicon nitride, silicon oxynitride, silicon oxycarbide, silicon nitride carbide, metal oxide, such as aluminum oxide, hafnium oxide, or a combination thereof. Operation 108 is omitted when fabricating the semiconductor device 200*b* using the method 100. The back surfaces 240*b* of the source/drain regions 240 are in direct contact with a top surface 236'*f* of the buried features 236'.

FIGS. 20A-20G schematically demonstrates a semiconductor device 200C according to embodiments of the present disclosure. The semiconductor device 200C is substantially similar to the semiconductor device 200 except that the semiconductor device 200C does not include the gate contact spacers 262. The semiconductor device 200C may be fabricated according to the method 100. Operation 122 is omitted when fabricating the semiconductor device 200C according to the method 100.

Figure 20B:
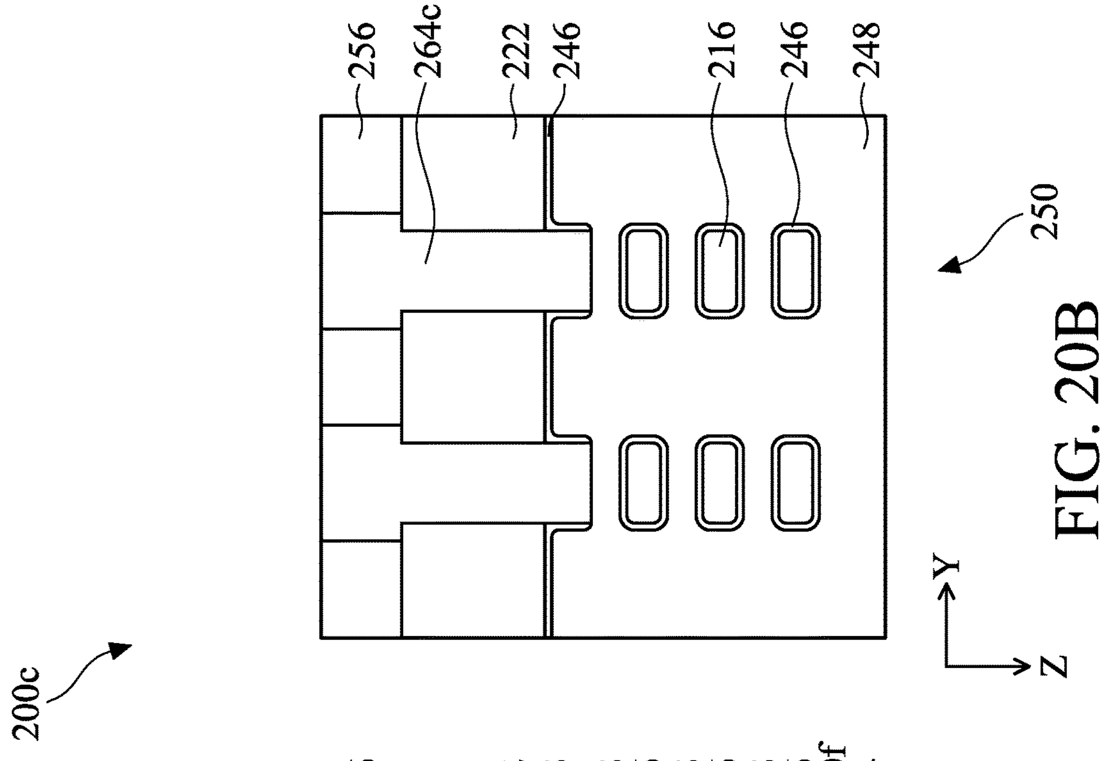
Figure 20A:
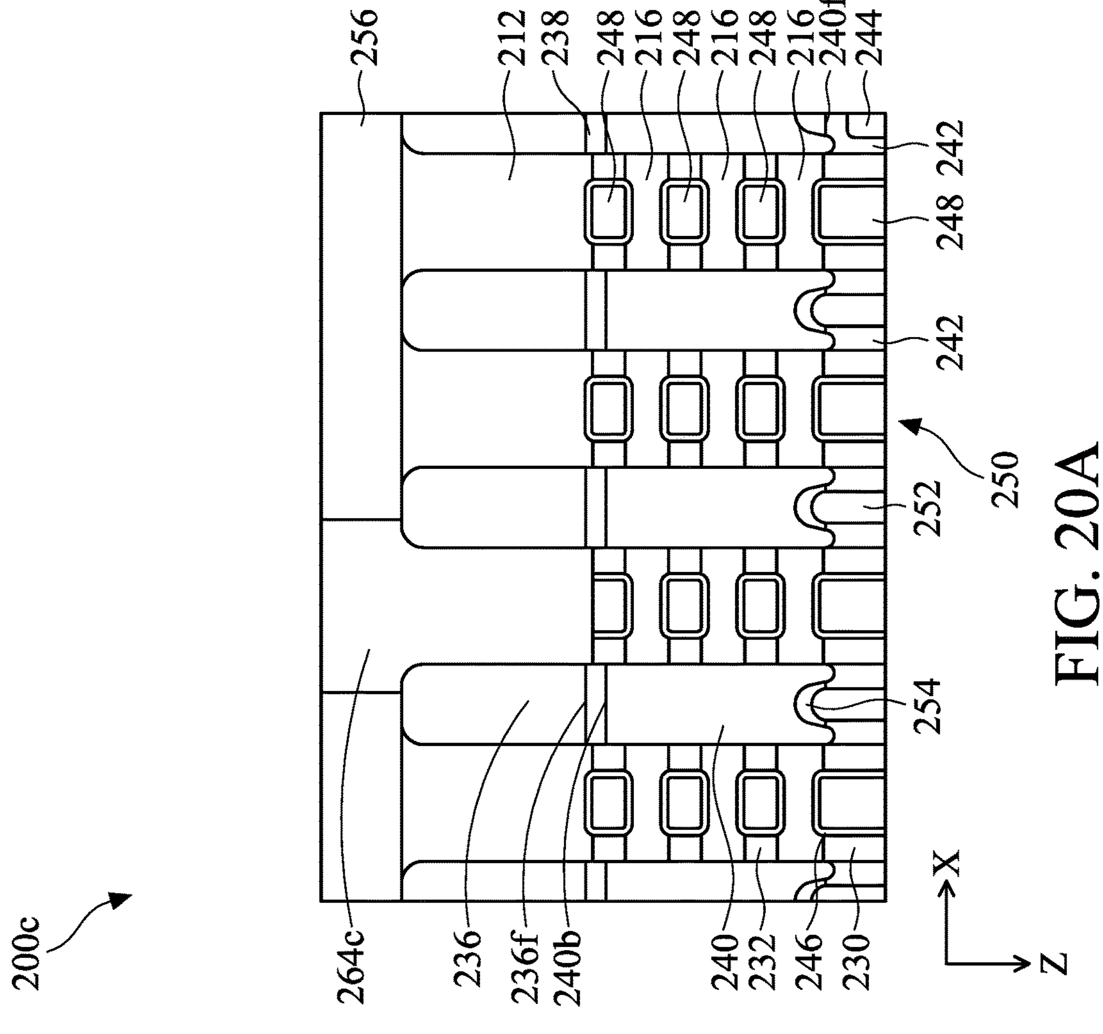

FIGS. 20A-20B are schematic cross sectional views of the semiconductor device 200C after operation 124. Backside gate contacts 264*c* are formed in operation 124. As shown in FIGS. 20A-20B, sidewalls of the backside gate contacts 264*c* are in direct contact with the buried features 236 and with the isolation layer 222 and the gate dielectric layer 246. A bottom surface of the backside gate contact is in direct contact with the gate electrode layer 248, the gate dielectric layer 246, and the inner spacers 232. By omitting the gate contact spacer 262, a cross section area of the backside gate contact 264 is maximized, thus, minimizing resistance of the backside gate contact 264.

Figure 20C:
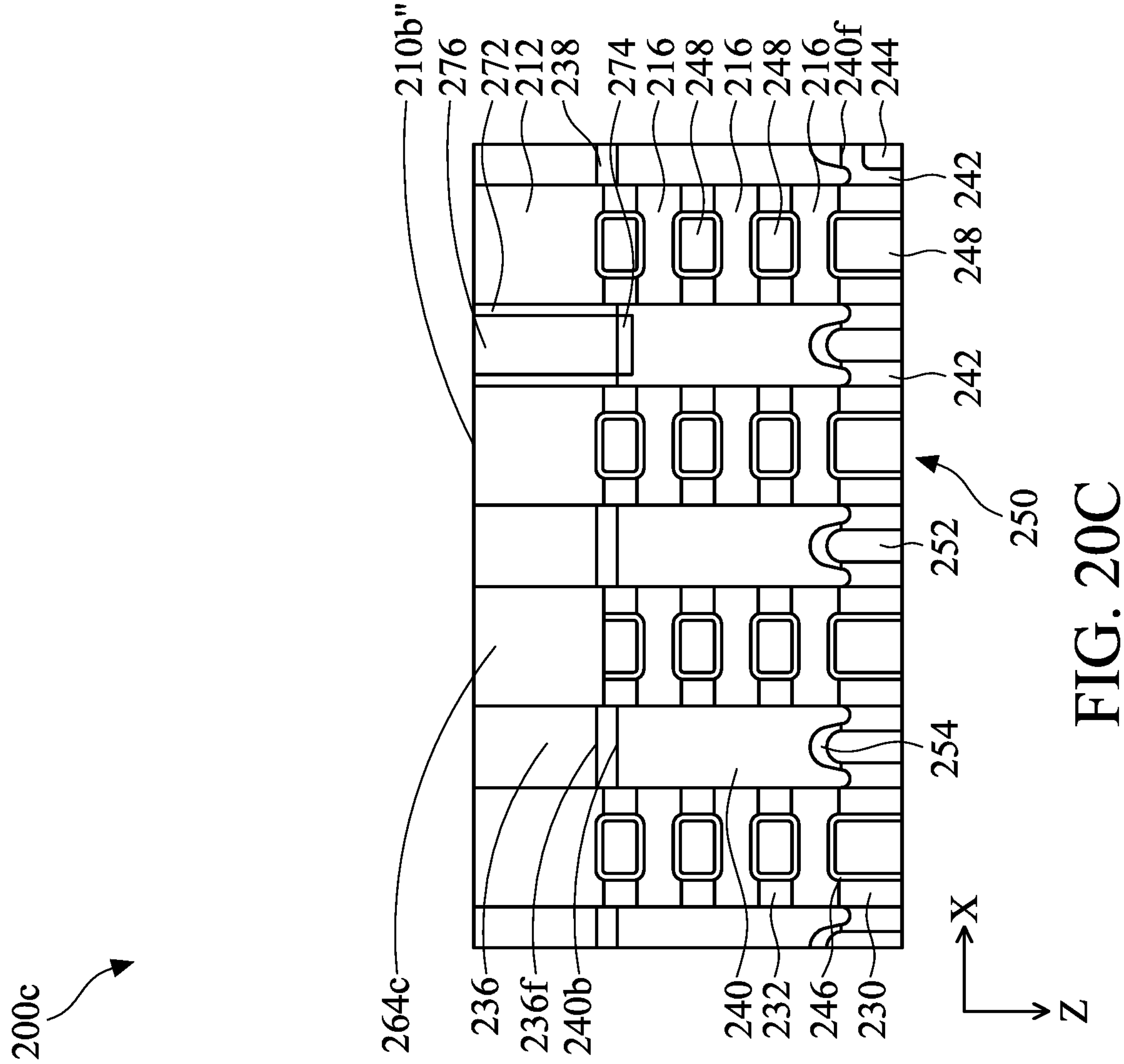
Figure 20D:
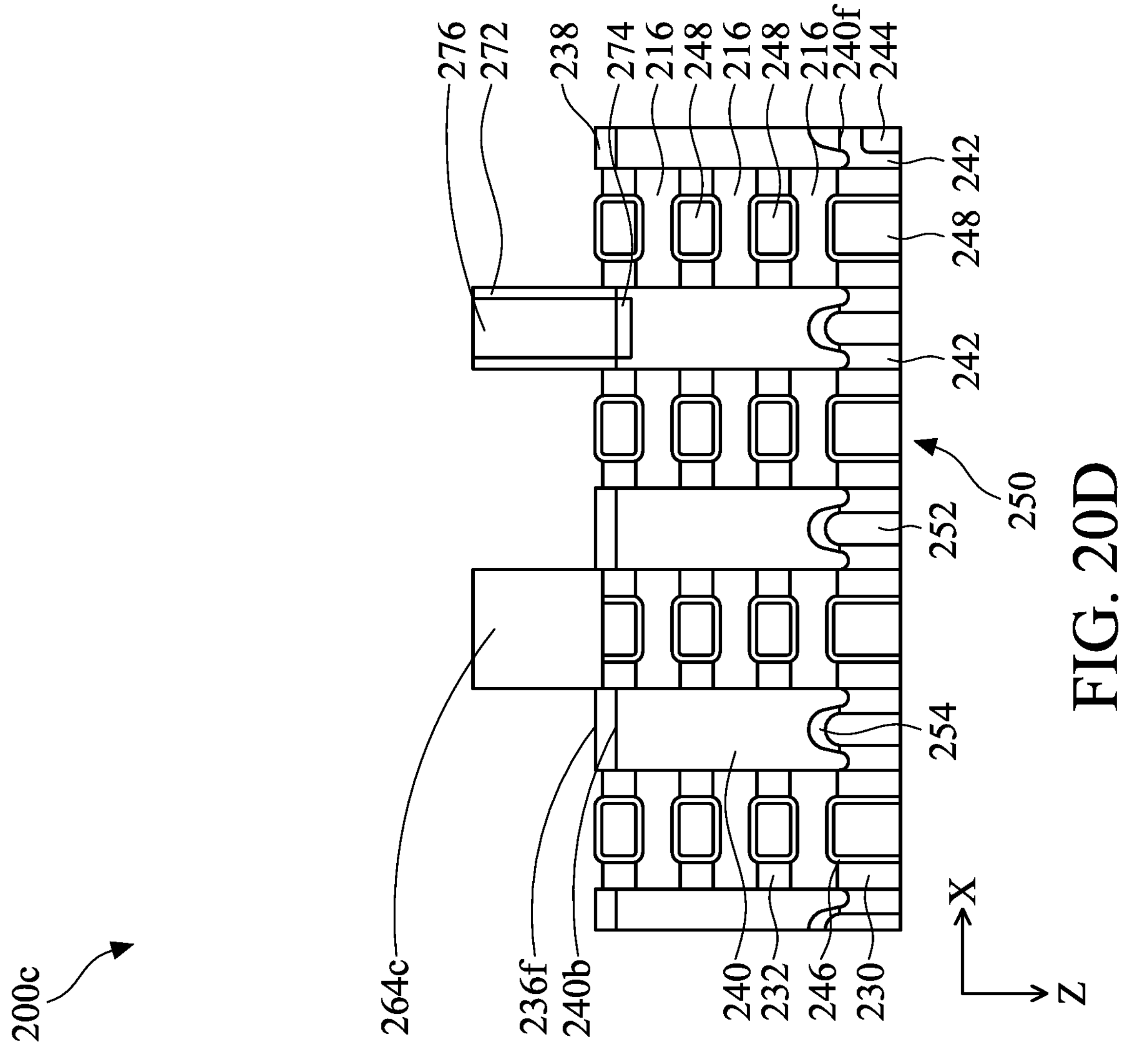
Figure 20E:
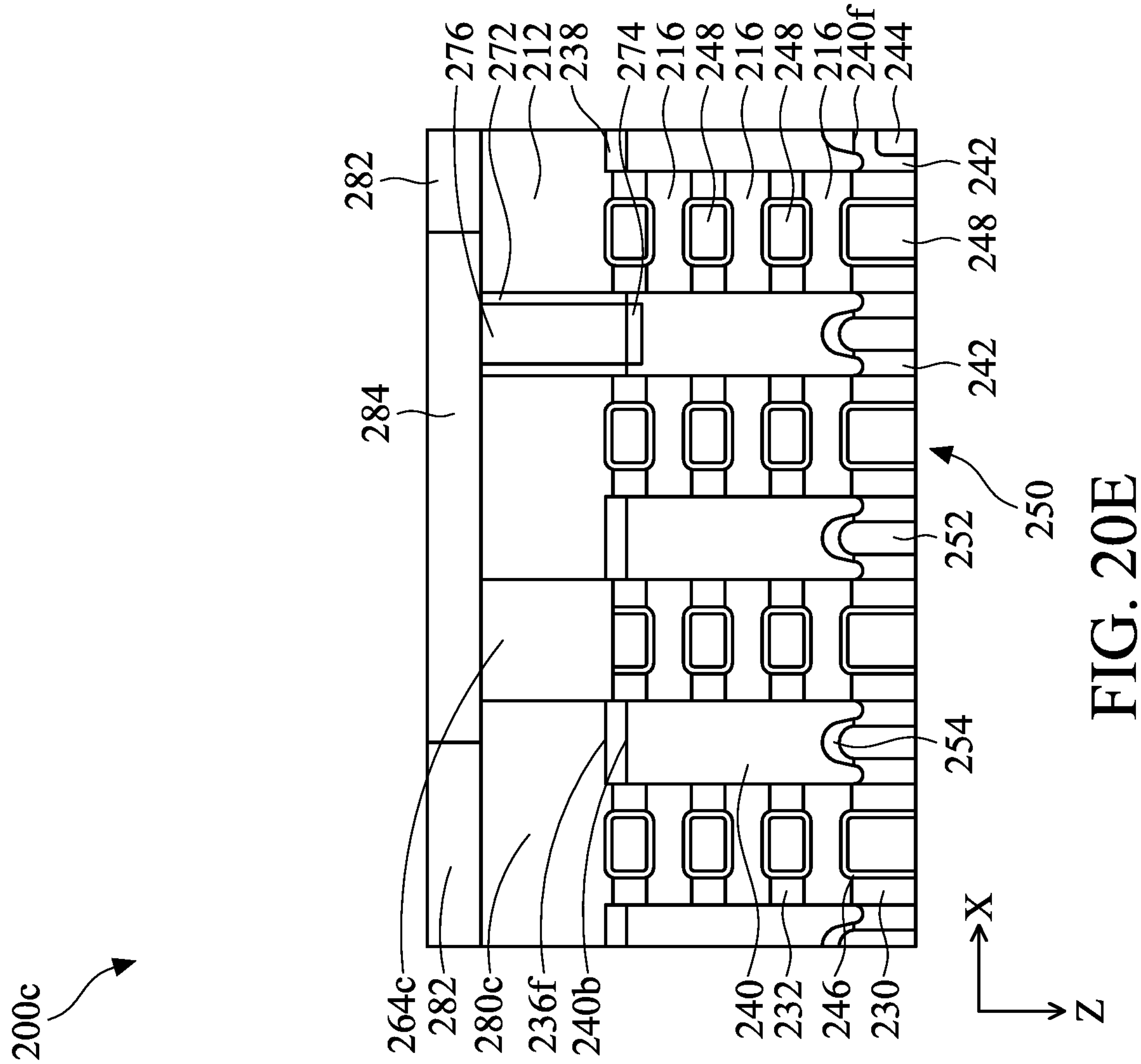
Figure 20G:
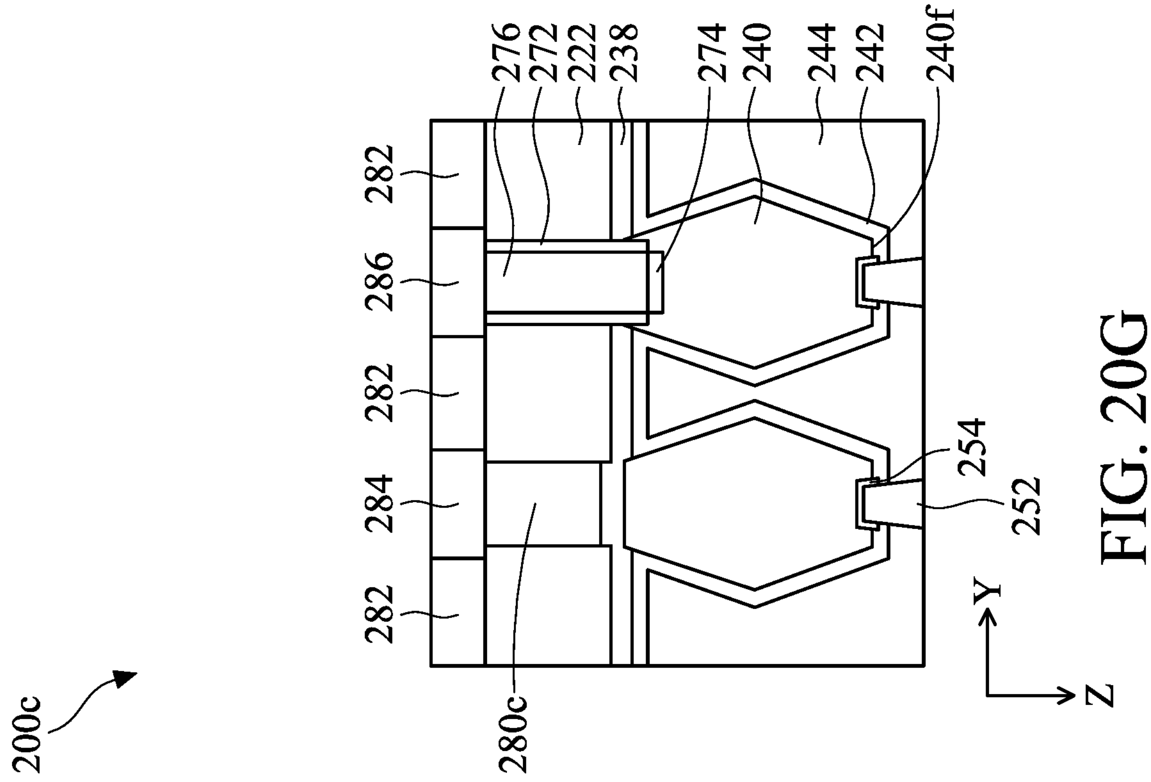
Figure 20F:
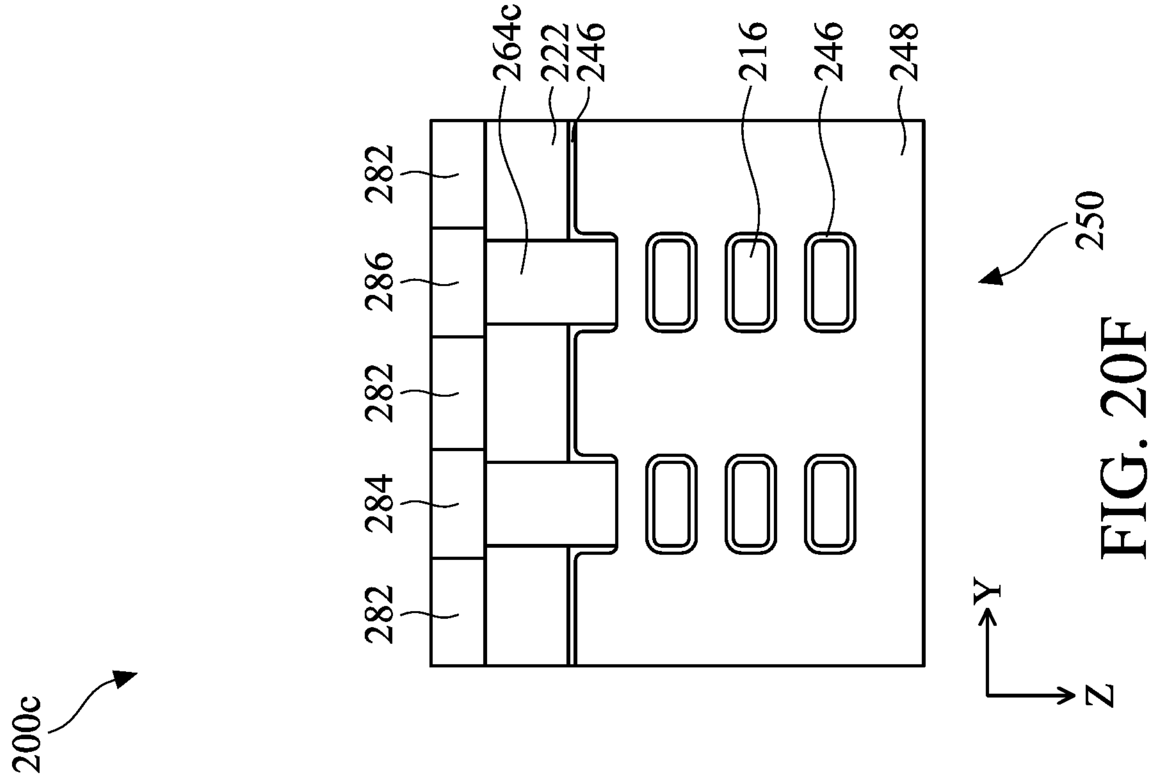

FIG. 20C is a schematic cross sectional view of the semiconductor device 200C after operation 134. The backside source/drain contacts 276 are surrounded by the backside source/drain contact spacers 272. The backside source/drain contact spacers 272 provide isolation around the backside source/drain contact 276, therefore allowing the backside gate contact 264 to be disposed adjacent the backside source/drain contact 276. FIG. 20D is a schematic cross sectional view of the semiconductor device 200C after operation 136. In operation 136, the buried features 236 and the well portions 212 are completely removed. FIGS. 20E, 20F, and 20G are schematic cross sectional views of the semiconductor device 200C after operation 140. In operation 138, a dielectric fill 280*c* may be formed by filling the cavities 278. The dielectric fill 280*c* is in direct contact with the backside gate contact 264*c*. The dielectric fill 280*c* may be formed from any suitable dielectric material, such as a low-k dielectric material.

Figure 21A:
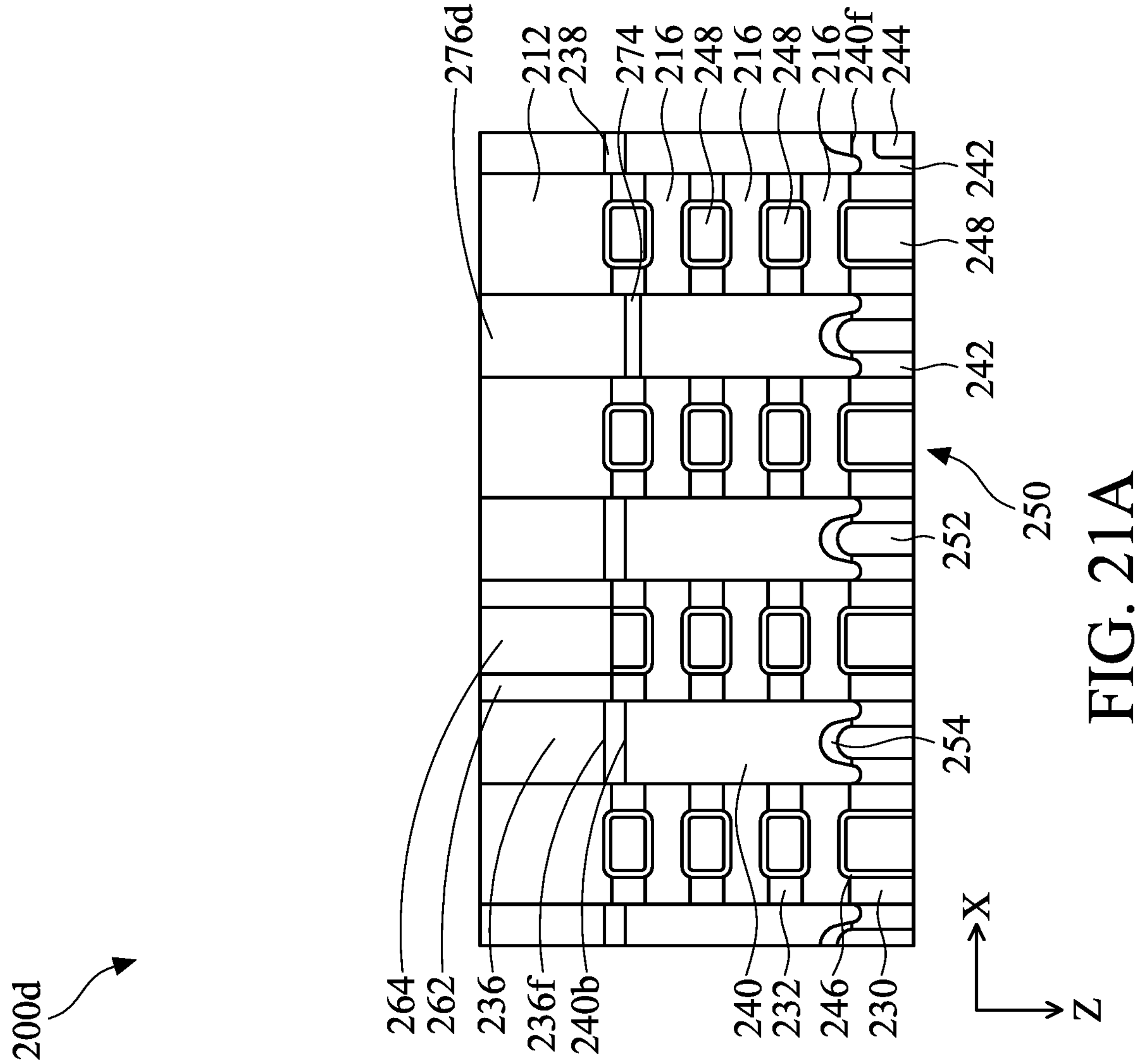
Figure 21B:
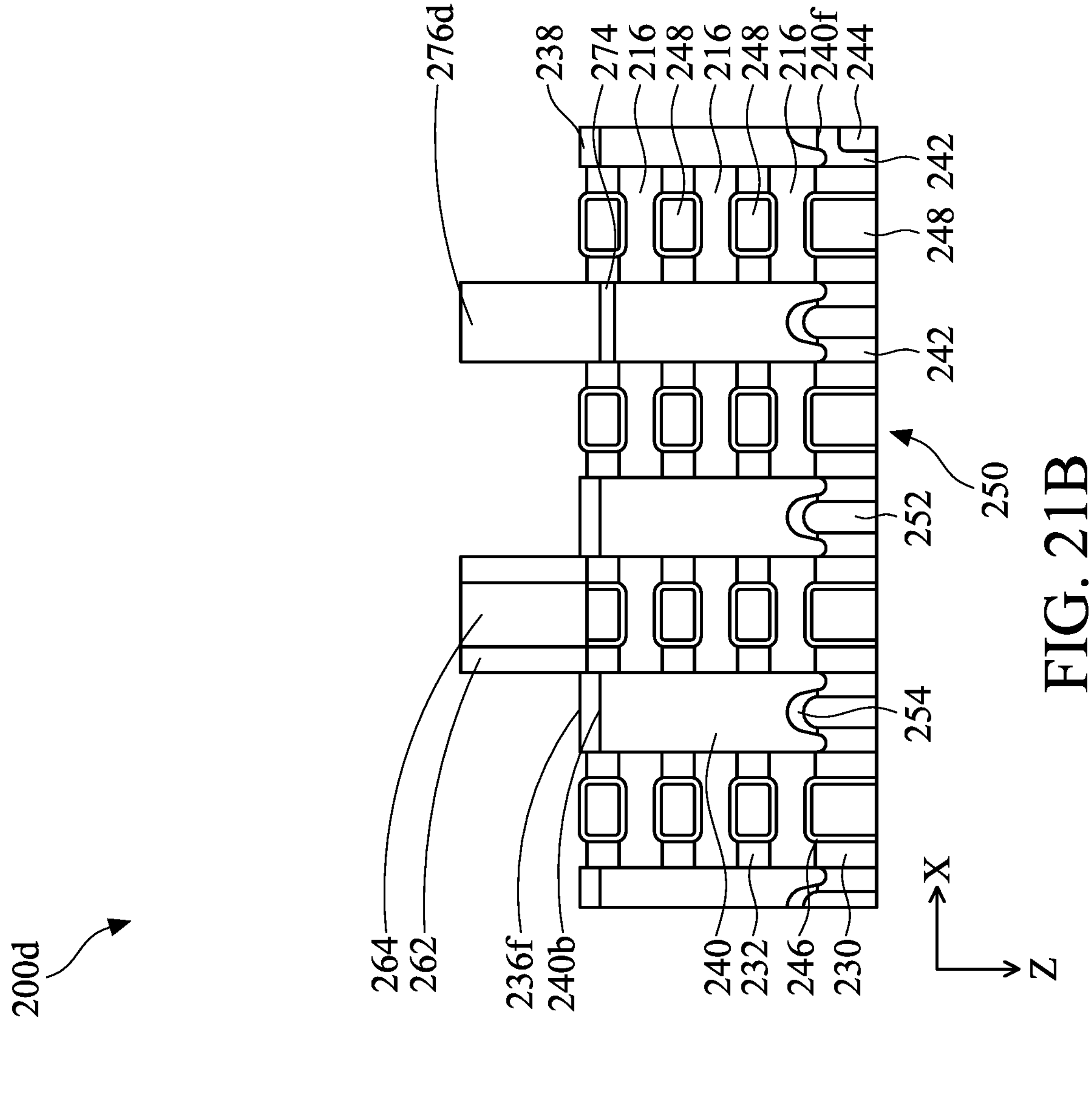
Figure 21C:
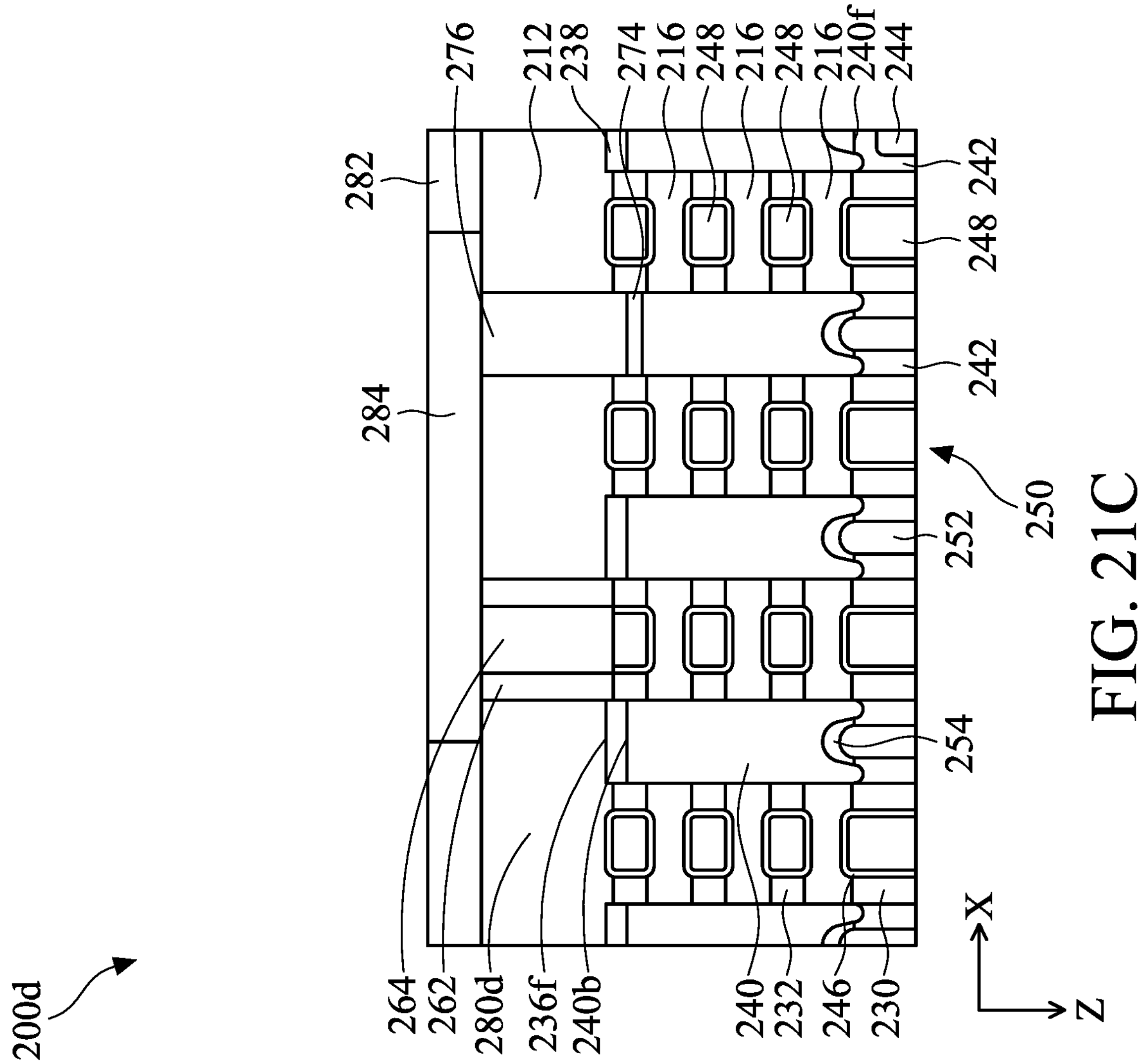

FIGS. 21A-21C schematically demonstrates a semiconductor device 200*d* according to embodiments of the present disclosure. The semiconductor device 200*d* is substantially similar to the semiconductor device 200*c* except that the semiconductor device 200*d* includes the gate contact spacers 262 but omits the source/drain contact spacers 272. The semiconductor device 200*d* may be fabricated according to the method 100. Operation 130 is omitted when fabricating the semiconductor device 200*d* according to the method 100.

FIG. 21A is a schematic cross sectional view of the semiconductor device 200*d* after operation 134. Backside source/drain contacts 276*d* are formed in operation 134. As shown in FIG. 21A, sidewalls of the backside source/drain contacts 276*d* are in direct contact with the well portion 212 and with the isolation layer 222 and the inner spacers 232. By omitting the source/drain contact spacers 272, cross section area of the backside source/drain contact 276*d* increases, thus, minimizing resistance of the backside gate contact 264.

FIG. 21B is a schematic cross sectional view of the semiconductor device 200*d* after operation 136. In operation 136, the buried features 236 and the well portions 212 are completely removed. FIG. 21C is a schematic cross sectional views of the semiconductor device 200*d* after operation 140. In operation 138, a dielectric fill 280*d* may be formed by filling the cavities 278. The dielectric fill 280*d* is in direct contact with the backside source/drain contacts 276*d*.

Figure 22:
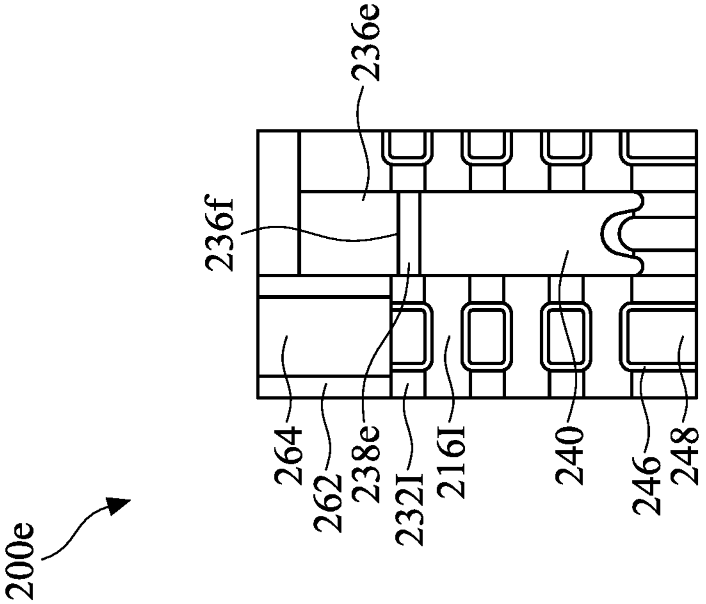

FIG. 22 schematically demonstrates a semiconductor device 200*e* according to embodiments of the present disclosure. The semiconductor device 200*e* is substantially similar to the semiconductor device 200 except that the semiconductor device 200*e* includes buried features 236*e* having a front surface 236*f* intersects with the bottom most inner spacer 232*l*. In some embodiments, the flexible bottom isolation layer 238 has a thickness less than a height of the inner spacer 232 so that the flexible bottom isolation layer 238 does not contact the bottom most channel, i.e., semiconductor layer 2161. As shown in FIG. 22, the source/drain region 240 is also in contact with the bottom most inner spacer 232*l*.

Figure 23:
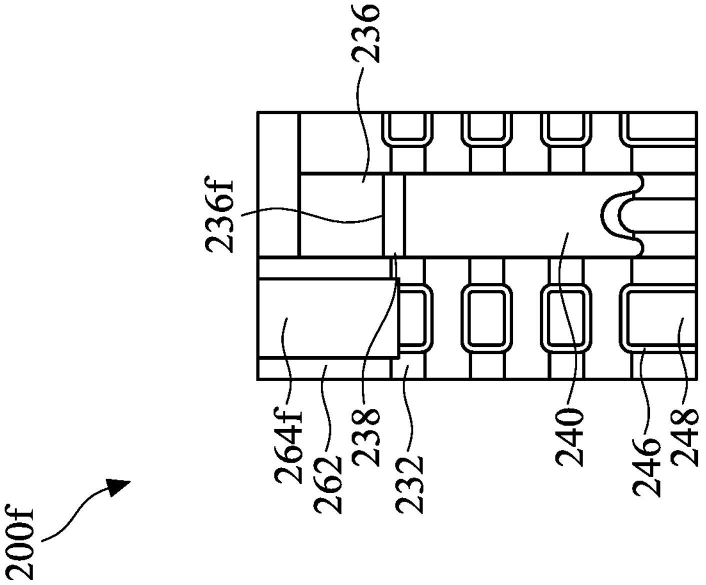

FIG. 23 schematically demonstrates a semiconductor device 200*f* according to embodiments of the present disclosure. The semiconductor device 200*f* is substantially similar to the semiconductor device 200 except that in the semiconductor device 200*f*, the gate electrode layer 248 slightly etched during formation of gate contact opening in operation 120. As a result, the semiconductor device 200*f* includes a backside gate contact 264*f* in direct contact with the bottom most inner spacer 232*l*.

Various embodiments or examples described herein offer multiple advantages over the state-of-art technology. Embodiments of the present disclosure enable backside signal routing for local interconnection, therefore, relaxing front side signal routing, thus, improving performance.

It will be understood that not all advantages have been necessarily discussed herein, no particular advantage is required for all embodiments or examples, and other embodiments or examples may offer different advantages.

Some embodiments of the present provide a semiconductor device, comprising a first source/drain region; a second source/drain region; a semiconductor channel disposed between the first and second source/drain regions, wherein the semiconductor channel includes two or more semiconductor layers; a gate dielectric layer formed around the two or more semiconductor layers; a gate electrode layer disposed on the gate dielectric layer; two gate sidewall spacers disposed on a first side of the semiconductor channel, wherein the gate electrode layer and the gate dielectric layer are disposed between the two gate sidewall spacers; and two or more inner spacers alternately stacked with the two or more semiconductor layers of the semiconductor channel; and a gate contact disposed on the gate electrode layer on a second side of the semiconductor channel, wherein the second side is opposing the first side.

Some embodiments of the present provide a semiconductor device, comprising a first source/drain region; a semiconductor channel connected to the first source/drain region; a gate structure formed on the semiconductor channel; a first front side source/drain contact disposed on a front surface of the first source/drain region; a buried feature disposed on a back surface of the first source/drain region; and a backside gate contact disposed on the gate structure and adjacent the alignment feature.

Some embodiments provide a method comprising: forming a semiconductor fin on a front side of a substrate; forming a sacrificial gate structure over the semiconductor fin; etching the semiconductor fin and the substrate to form source/drain recesses on two sides of the sacrificial gate structure; depositing buried features in the source/drain recesses; forming source/drain regions over the buried features; forming a replacement gate structure; thinning a backside of the substrate to expose the buried features; selectively removing the substrate between the buried features to expose the replacement gate structure; and forming a backside gate contact between the buried features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:

forming a semiconductor fin on a front side of a substrate;

forming a sacrificial gate structure over the semiconductor fin;

etching the semiconductor fin and the substrate to form source/drain recesses on two sides of the sacrificial gate structure;

depositing buried features in the source/drain recesses;

forming source/drain regions over the buried features;

forming a replacement gate structure;

thinning a backside of the substrate to expose the buried features;

selectively removing the substrate between the buried features to expose the replacement gate structure; and forming a backside gate contact between the buried features.

2. The method of claim 1, further comprising:

prior to forming the source/drain regions, depositing an isolation layer on the buried features.

3. The method of claim 1, further comprising:

forming a gate spacer on the buried features prior to forming the backside gate contact.

4. The method of claim 1, further comprising:

selectively removing one of the buried features to expose the corresponding source/drain region; and forming a backside source/drain contact.

5. The method of claim 4, further comprising forming a backside source/drain contact spacer prior to forming the backside source/drain contact.

6. A method, comprising:

forming a device structure on a front side of a substrate, wherein the device structure comprises:

a first source/drain region;

a second source/drain region;

a semiconductor channel disposed between the first and second source/drain regions;

a gate dielectric layer formed around the semiconductor channel;

a gate electrode layer disposed on the gate dielectric layer; and two gate sidewall spacers disposed on a first side of the semiconductor channel, wherein the gate electrode layer and the gate dielectric layer are disposed between the two gate sidewall spacers;

flipping over the substrate; and forming a gate contact opening from a back side of the substrate to expose the gate electrode layer; and forming a gate contact in the gate contact opening.

7. The method of claim 6, wherein the device structure further comprises a first source/drain contact disposed on the first source/drain region.

8. The method of claim 7, further comprising forming a second source/drain contact disposed on the first source/drain region from the backside of the substrate.

9. The method of claim 8, further comprising forming a conductive line, wherein the conductive line is in contact with the second source/drain contact and the gate contact.

10. The method of claim 6, further comprising forming a conductive line disposed over the second side of the semiconductor channel, wherein the conductive line is in contact with the gate contact.

11. The method of claim 6, further comprising:

forming a gate contact spacer in the gate contact opening, wherein the gate contact spacer surrounds the gate contact.

12. The method of claim 11, wherein the semiconductor channel includes two or more semiconductor layers, and the device structure further comprises two or more inner spacers alternately stacked with the two or more semiconductor layers of the semiconductor channel, and the gate contact spacer is in contact with the one of the two or more inner spacers.

13. The method of claim 8, further comprising forming a source/drain contact spacer surrounding the second source/drain contact.

14. The method of claim 6, wherein the device structure comprises first and second buried features disposed over the first and second source/drain regions respectively, wherein the first and second buried features are disposed on the second side of the semiconductor channel.

15. The method of claim 14, wherein the device structure comprises an isolation layer disposed between the first buried feature and the first source/drain region.

16. The method of claim 14, wherein the gate contact is disposed between the first and second buried features.

17. A method, comprising:

forming a semiconductor fin on a front side of a substrate, wherein the semiconductor fin comprises two or more semiconductor channel layers stacked together;

forming a sacrificial gate structure over the semiconductor fin;

etching the semiconductor fin and the substrate to form source/drain recesses on two sides of the sacrificial gate structure;

forming source/drain regions in the source/drain recesses, wherein the source/drain regions are in contact with the two or more semiconductor channel layers;

removing the sacrificial gate structure;

forming a replacement gate structure, wherein the replacement gate structure comprises a gate dielectric layer formed around the two or more semiconductor channel layers, and a gate electrode layer on the gate dielectric layer;

thinning a backside of the substrate;

forming a backside contact opening to expose the gate electrode layer; and forming a backside gate contact in the backside contact opening.

18. The method of claim 17, further comprising forming buried contact features in the source/drain recesses prior to forming the source/drain regions.

19. The method of claim 18, further comprising forming an isolation layer between the buried features and source/drain regions.

20. The method of claim 17, further comprising forming a gate spacer prior to forming the backside gate contact.

* * * * *